(12) United States Patent
Onaka et al.

(10) Patent No.: US 8,814,385 B2
(45) Date of Patent: Aug. 26, 2014

(54) LIGHT-EMITTING APPARATUS, LIGHTING APPARATUS AND LENS

(71) Applicant: Mitsubishi Chemical Corporation, Chiyoda-ku (JP)

(72) Inventors: Shuuji Onaka, Chiyoda-ku (JP); Akeo Kasakura, Chiyoda-ku (JP); Toru Takeda, Chiyoda-ku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 0 days.

(21) Appl. No.: 13/787,931

(22) Filed: Mar. 7, 2013

(65) Prior Publication Data

US 2013/0194795 A1    Aug. 1, 2013

Related U.S. Application Data

(63) Continuation of application No. PCT/JP2011/070531, filed on Sep. 8, 2011.

(30) Foreign Application Priority Data

| Sep. 8, 2010 | (JP) | 2010-201099 |
| Oct. 21, 2010 | (JP) | 2010-236836 |
| Sep. 6, 2011 | (JP) | 2011-193996 |

(51) Int. Cl.
*F21V 5/00* (2006.01)

(52) U.S. Cl.
USPC ............ 362/244; 362/231; 362/249.02

(58) Field of Classification Search
USPC .......... 362/249.02, 545, 555, 800, 612, 23.07
See application file for complete search history.

(56) References Cited

U.S. PATENT DOCUMENTS 5,714,218 A * 2/1998 Nishio et al. ............... 428/64.1
6,454,437 B1 * 9/2002 Kelly ........................ 362/246

(Continued)

FOREIGN PATENT DOCUMENTS

| JP | 2003-281909 | 10/2003 |
| JP | 2004-342780 | 12/2004 |

(Continued)

OTHER PUBLICATIONS

Notification of Transmittal of Translation of the International Preliminary Report on Patentability and Written Opinion issued Apr. 18, 2013, in International application No. PCT/JP2011/070531.
International Search Report issued on Oct. 18, 2011 for PCT/JP2011/070531 filed on Sep. 8, 2011 with English Language Translation.

*Primary Examiner* — Donald Raleigh
(74) *Attorney, Agent, or Firm* — Oblon, Spivak, McClelland, Maier & Neustadt, L.L.P.

(57) ABSTRACT

The light-emitting apparatus includes: a first light-emitting source which emits light of a first chromaticity from a first light-emitting surface; a second light-emitting source which has a second light-emitting surface provided adjacently to the first light-emitting surface and which emits light of a second chromaticity different from the first chromaticity, from the second light-emitting surface; and a lens member having a light-entering surface which is arranged facing the first light-emitting surface and the second light-emitting surface and on which depressions and projections that mix light entering from the first light-emitting source and the second light-emitting source are formed, and a light-exiting surface which radiates light from the first light-emitting source and the second light-emitting source that has entered from the light-entering surface.

44 Claims, 59 Drawing Sheets

(56) References Cited

U.S. PATENT DOCUMENTS

| | | | |
|---|---|---|---|
| 7,479,622 B2 * | 1/2009 | May et al. | 250/205 |
| 7,959,320 B2 * | 6/2011 | Mueller et al. | 362/231 |
| 2004/0201987 A1 * | 10/2004 | Omata | 362/230 |
| 2004/0207999 A1 * | 10/2004 | Suehiro et al. | 362/84 |
| 2005/0185419 A1 * | 8/2005 | Holman et al. | 362/561 |
| 2006/0290253 A1 * | 12/2006 | Yeo et al. | 313/116 |
| 2007/0176187 A1 * | 8/2007 | Iwanaga | 257/79 |
| 2008/0303407 A1 * | 12/2008 | Brunner et al. | 313/496 |
| 2009/0195894 A1 * | 8/2009 | Takagi et al. | 359/793 |
| 2009/0303694 A1 | 12/2009 | Roth et al. | |

FOREIGN PATENT DOCUMENTS

| | | |
|---|---|---|
| JP | 2006-004839 | 1/2006 |
| JP | 2007-122950 | 5/2007 |
| JP | 2009-193902 | 8/2009 |
| JP | 2009-532856 | 9/2009 |
| JP | 2009-231525 | 10/2009 |
| JP | 2009-302202 | 12/2009 |
| JP | 2010-129202 | 6/2010 |
| WO | 2008/096714 | 8/2008 |
| WO | 2009/063915 | 5/2009 |

* cited by examiner

LIGHT-EMITTING APPARATUS, LIGHTING APPARATUS AND LENS

CROSS-REFERENCE TO RELATED APPLICATION

This is a continuation of International Application PCT/JP2011/070531, filed on Sep. 8, 2011, and designated the U.S., (and claims priority from Japanese Patent Application 2010-201099 which was filed on Sep. 8, 2010, Japanese Patent Application 2010-236836 which was filed on Oct. 21, 2010 and Japanese Patent Application 2011-193996 which was filed on Sep. 6, 2011,) the entire contents of which are incorporated herein by reference.

TECHNICAL FIELD

The present invention relates to a light-emitting apparatus which is capable of combining light of two types having different chromaticities, a lighting apparatus provided with this light-emitting apparatus, and a lens used in this light-emitting apparatus.

BACKGROUND ART

An LED light-emitting element using an LED chip is used widely in the prior art as a light source for various lighting apparatuses and display apparatuses. In recent years, a light-emitting apparatus has been developed and come into use which combines a plurality of LED light-emitting elements having different light emission colors, rather than just using LED light-emitting elements of one light emission color. For example, Patent Document 1 discloses a light-emitting apparatus which uses a red LED light-emitting element, a green LED light-emitting element and a blue LED light-emitting element. In this light-emitting apparatus, the drive current supplied to the LED light-emitting elements is adjusted, and desired white light is obtained by combining the light emitted from the respective LED light-emitting elements.

Furthermore, an LED light-emitting element which emits light by converting a wavelength of light emitted by an LED chip, by means of fluorescent body, has been developed, and a light-emitting apparatus which incorporates an LED light-emitting element of this kind is disclosed in Patent Document 2, for example. The light-emitting apparatus according to Patent Document 2 uses a blue LED light-emitting element which emits blue light using a blue LED chip, a green LED light-emitting element which combines a blue LED chip with a green fluorescent body which is excited by blue light emitted by the blue LED chip and which emits green light, and a red LED light-emitting element which combines a blue LED chip with a red fluorescent body which is excited by blue light emitted by the blue LED chip and which emits red light. By combining light emitted respectively from the blue LED light-emitting element, the green LED light-emitting element and the red LED light-emitting element, excellent color rendition is guaranteed, and it is also possible to change the color of the light emitted by the light-emitting apparatus variously, by adjusting the light outputs of the respective light-emitting units.

Furthermore, Patent Document 3 discloses a light-emitting apparatus which obtains desired white light by converting a wavelength of light emitted by an LED light-emitting element by a wavelength conversion member which is formed by combining a red fluorescent body, a green fluorescent body and a blue fluorescent body. This light-emitting apparatus uses a near-ultraviolet LED chip which emits near-ultraviolet light, and a wavelength conversion member which combines a red fluorescent body, a green fluorescent body and a blue fluorescent body, in such a manner that a wavelength of near-ultraviolet light emitted by the near-ultraviolet LED chip is converted to desired white light.

In the light-emitting apparatus according to Patent Document 3, the wavelength conversion member is constituted by a first wavelength conversion member in which the respective fluorescent bodies are combined so as to obtain white light having a desired color temperature, and a second wavelength conversion member in which the respective fluorescent bodies are combined so as to obtain white light of a different color temperature from this first wavelength conversion member. A ring-shaped reflector is provided on a substrate, and the interior of the reflector is divided into two regions by a partitioning member. LED chips are arranged in each respective region, the first wavelength conversion member is accommodated in one region and the second wavelength conversion member is accommodated in the other region.

In the light-emitting apparatus which is composed in this way, combined light obtained by combining white light radiated from the first wavelength conversion member and white light radiated from the second wavelength conversion member is radiated from the light-emitting apparatus. In this case, by adjusting the power supplied to the near-ultraviolet LED chip in one region and the power supplied to the near-ultraviolet LED chip in the other region, white light adjusted to a desired color temperature between the color temperature of the white light emitted from the fluorescent body of the first wavelength conversion member and the color temperature of the white light emitted from the fluorescent body of the second wavelength conversion member is obtained.

Patent Document 1: Japanese Patent Application Publication No. 2006-4839
Patent Document 2: Japanese Patent Application Publication No. 2007-122950
Patent Document 3: WO 2009/063915

In the light-emitting apparatus according to Patent Document 3, light radiated from the first wavelength conversion member and light radiated from the second wavelength conversion member is radiated from respectively different regions. When the light radiated from the respective wavelength conversion members is used as illuminating light, or the like, separation of the light of two types radiated from the respective wavelength conversion members becomes less liable to occur, compared to a case where light emitted from LED chips are directly combined and used as illuminating light, due to the characteristics of the fluorescent bodies included in the wavelength conversion members. However, since the light radiated from the first wavelength conversion member and the light radiated from the second wavelength conversion member is radiated respectively from different regions, then it cannot be considered that separation of the light of two types is sufficiently prevented, and there remains room for improvement.

SUMMARY OF THE INVENTION

The present invention was devised in view of these problems, an object thereof being to provide a light-emitting apparatus which is capable of combining light of two types having different chromaticities and radiating the obtained light and which is capable of preventing separation of the light of these two types, a lighting apparatus using this light-emitting apparatus, and a lens used in this light-emitting apparatus.

In order to achieve the aforementioned object, the light-emitting apparatus according the present invention includes:

a first light-emitting source which emits light of a first chromaticity from a first light-emitting surface; a second light-emitting source which has a second light-emitting surface provided adjacently to the first light-emitting surface and which emits light of a second chromaticity different from the first chromaticity, from the second light-emitting surface; and a lens member having a light-entering surface which is arranged facing the first light-emitting surface and the second light-emitting surface and on which depressions and projections that mix light entering from the first light-emitting source and the second light-emitting source are formed, and a light-exiting surface which radiates light from the first light-emitting source and the second light-emitting source that has entered from the light-entering surface.

According to the light-emitting apparatus composed in this way, light of mutually different chromaticities emitted respectively from the first light-emitting surface and the second light-emitting surface, which are formed by dividing the light-emitting surface, enters into the lens member which has a light-entering surface disposed so as to face the light-emitting surfaces, via the light-entering surface of the lens member. In this case, since depressions and projections which mix the entering light are formed on the light-entering surface of the lens member, then light of two types having mutually different chromaticities emitted from the light-emitting sources proceeds inside the lens member while respectively being mixed due to passing through the depressions and projections on the light-entering surface and is radiated from the light-exiting surface of the lens member.

More specifically, the depressions and projections on the light-entering surface may be a plurality of V-shaped grooves which are provided extending in a direction parallel to the dividing line of the light-emitting surface.

In this case, more specifically, an apex angle of a ridge formed by two of the V-shaped grooves that are mutually adjacent and having a V-shaped cross-section is desirably an obtuse angle.

Alternatively, instead of the V-shaped grooves of this kind, the depressions and projections on the light-entering surface may be formed either as a plurality of hemispherical projections, a plurality of pyramid-shaped projections, or a plurality of conical projections.

Furthermore, instead of the V-shaped grooves of this kind, it is also possible to adopt a plurality of sawtooth-shaped grooves provided extending in a direction parallel to the dividing line of the first light-emitting surface and the second light-emitting surface and formed in left/right symmetry about the dividing line, or a plurality of tooth-shaped grooves provided extending in a direction parallel to the dividing line of the first light-emitting surface and the second light-emitting surface or formed in left/right symmetry about the dividing line.

Moreover, instead of the V-shaped grooves of this kind, the depressions and projections on the light-entering surface may be formed by semicircular column projections which extend in a direction parallel to the dividing line between the first light-emitting surface and the second light-emitting surface and which have a semicircular cross-sectional shape in a plane perpendicular to the direction of extension of the dividing line.

In any of the light-emitting apparatuses described above, the shape of the lens member may be a truncated conical shape having a light-exiting surface of larger diameter than the light-entering surface. Furthermore, instead of this, the lens member may also be a paraboloid of revolution of which outer circumferential surface is a surface of a paraboloid of revolution.

In any of the light-emitting apparatuses described above, desirably, a shape of the light-entering surface side of the lens member is a convex lens shape.

If the shape of the light-entering surface side of the lens member is a convex lens shape, then a distance from the light-entering surface of the lens member to the first light-emitting source and a distance from the light-entering surface of the lens member to the second light-emitting source are each desirably no less than 0.5 times and no more than 2 times the focal distance of the lens member.

If the shape of the light-entering surface side of the lens member is a convex lens shape, then a distance from the light-entering surface of the lens member to the first light-emitting source and a distance from the light-entering surface of the lens member to the second light-emitting source are each desirably no less than 0.5 times and no more than 2 times the distance between the first light-emitting source and the second light-emitting source.

In any of the light-emitting apparatuses described above, a light mixing member, which is formed by dispersing a light diffusing material in a translucent base material and which mixes and radiates, using the light diffusing material, light emitted respectively from the first light-emitting source and the second light-emitting source, may be applied to the first light-emitting source and the second light-emitting source so as to cover the first light-emitting surface and the second light-emitting surface.

Furthermore, in order to achieve the aforementioned object, the light-emitting apparatus according the present invention includes: a first light-emitting source which emits light of a first chromaticity from a first light-emitting surface; a second light-emitting source which has a second light-emitting surface provided adjacently to the first light-emitting surface and which emits light of a second chromaticity different from the first chromaticity, from the second light-emitting surface; and a lens member having a light-entering surface at which a light mixing member, which is formed by dispersing a light diffusing material in a translucent base material and which mixes and radiates, using the light diffusing material, light emitted respectively from the first light-emitting source and the second light-emitting source, is disposed at a position facing the first light-emitting surface and the second light-emitting surface, and a light-exiting surface which radiates light from the first light-emitting source and the second light-emitting source that has entered from the light-entering surface.

According to a light-emitting apparatus which is composed in this way, light of a first chromaticity emitted from the first light-emitting surface of the first light-emitting source and light of a second chromaticity emitted from the second light-emitting surface of the second light-emitting source is mixed by the light diffusing material of the light mixing member which is provided at a position facing the first light-emitting surface and the second light-emitting surface, and is radiated from this lens member.

To cite a specific composition of this light-emitting apparatus, the light diffusing material may be made of granules formed by a material selected from the group consisting of glass, silica, resin, alumina, titania and zirconia. On the other hand, it is also possible to use resin for the translucent base material.

In any of the light-emitting apparatuses described above, the shape of the lens member may be a truncated conical shape having a light-exiting surface of larger diameter than the light-entering surface. Furthermore, instead of this, the lens member may also be a paraboloid of revolution of which outer circumferential surface is a surface of a paraboloid of revolution.

In any of the light-emitting apparatuses described above, desirably, a shape of the light-entering surface side of the lens member is a convex lens shape.

In any of the light-emitting apparatuses described above, the light mixing member may be a flat plate-like body which is parallel to the first light-emitting surface and the second light-emitting surface. Furthermore, instead of this, the light mixing member may also be a plate-like body having a same curvature as a curvature of the light-entering surface side of the lens member. Moreover, instead of these, the light mixing member may be a cup-shaped plate-like body, a bottom surface of the cap being close to the lens member.

If the shape of the light-entering surface side of the lens member is a convex lens shape, then a distance from the light mixing member to the first light-emitting source and a distance from the light mixing member to the second light-emitting source are each desirably no less than 0.5 times and no more than 2 times the focal distance of the lens member.

If the shape of the light-entering surface side of the lens member is a convex lens shape, then a distance from the light mixing member to the first light-emitting source and a distance from the light mixing member to the second light-emitting source are each desirably no less than 0.5 times and no more than 2 times a distance between the first light-emitting source and the second light-emitting source.

In any of the light-emitting apparatuses described above, depressions and projections may be formed on the light-exiting surface of the lens member. In a case of this kind, the depressions and projections on the light-exiting surface may be formed either as a plurality of hemispherical projections, a plurality of pyramid-shaped projections, or a plurality of conical projections. Furthermore, the lens member of this kind may constitute a Fresnel lens by means of the depressions and projections on the light-exiting surface. Moreover, if the depressions and projections on the light-exiting surface are a plurality of hemispherical projections, then the lens member may constitute a fly-eye lens by means of the plurality of hemispherical projections.

In any of the light-emitting apparatuses described above, a shape of the light-exiting surface side of the lens member may be a convex lens shape.

In the light-emitting apparatuses described above, the light of a first chromaticity may be a first LED which emits white light of a first color temperature and the light of a second chromaticity may be a second LED which emits white light of a second color temperature that is higher than the first color temperature.

More specifically, the first LED may include a first LED chip which emits light by supply of drive current, and a first wavelength conversion member which converts a wavelength of at least one portion of light emitted by the first LED chip and radiates the light of a first chromaticity; and the second LED may include a second LED chip which emits light by supply of drive current, and a second wavelength conversion member which converts a wavelength of at least one portion of light emitted by the second LED chip and radiates the light of a second chromaticity.

If the light-emitting apparatus includes a first LED and a second LED, then the first LED may be accommodated in a first depression formed in a substrate and the second LED may be accommodated in a second depression formed adjacently to the first depression and separated from same by a partition. In this case, desirably, an opening shape of the first depression on the substrate and an opening shape of the second depression on the substrate are substantially the same.

In any of the light-emitting apparatuses described above, the light of a first chromaticity may be white light of a first color temperature and the light of a second chromaticity may be white light of a second color temperature that is higher than the first color temperature. In this case, the light obtained by mixing in the light mixing member is white light of a color temperature between the first color temperature and the second color temperature.

Furthermore, any of the light-emitting apparatuses described above can be used as a light source in a lighting apparatus. In this case, the lighting apparatus includes any of the light-emitting apparatuses described above, and control means for controlling light emission by the light-emitting sources.

Furthermore, in order to achieve the aforementioned object, the light-emitting apparatus according the present invention includes: a first light-emitting source which emits light of a first chromaticity from a first light-emitting surface; a second light-emitting source which has a second light-emitting surface provided adjacently to the first light-emitting surface and which emits light of a second chromaticity different from the first chromaticity, from the second light-emitting surface; and a light distributing member having a light-entering surface which is arranged facing the first light-emitting surface and the second light-emitting surface and which mixes light entering from the first light-emitting source and the second light-emitting source, and a light-exiting surface which radiates light from the first light-emitting source and the second light-emitting source that has entered from the light-entering surface.

Furthermore, in order to achieve the aforementioned object, the light-emitting apparatus according the present invention includes: a first light-emitting source which emits light of a first chromaticity from a first light-emitting surface; a second light-emitting source which has a second light-emitting surface provided adjacently to the first light-emitting surface and which emits light of a second chromaticity different from the first chromaticity, from the second light-emitting surface; and a light distributing member having a light-entering surface at which a light mixing member, which is formed by dispersing a light diffusing material in a translucent base material and which mixes and radiates, using the light diffusing material, light emitted respectively from the first light-emitting source and the second light-emitting source, is disposed at a position facing the first light-emitting surface and the second light-emitting surface, and a light-exiting surface which radiates light from the first light-emitting source and the second light-emitting source that has entered from the light-entering surface, wherein a prescribed gap is provided between the first light-emitting surface, the second light-emitting surface and the light mixing member.

In order to achieve the aforementioned object, a lens used in the light-emitting apparatus according to the present invention has: a light-entering surface on which depressions and projections which mix light entering from two different light-emitting sources are formed; and a light-exiting surface which radiates light that has entered from the light-entering surface.

In a lens of this kind, the depressions and projections on the light-entering surface may be a plurality of V-shaped grooves which are provided extending in a direction parallel to the dividing line of the respective light-emitting surfaces of the two different light-emitting sources. In this case, an apex angle of a ridge formed by two of the V-shaped grooves that are mutually adjacent and having a V-shaped cross-section is desirably an obtuse angle.

In any of the lenses described above, desirably, a shape of the light-entering surface side of the lens is a convex lens shape.

Furthermore, in order to achieve the aforementioned object, a lens used in the light-emitting apparatus according to the present invention has: a light-entering surface at which a light mixing member, which is formed by dispersing a light diffusing material in a translucent base material and which mixes and radiates, using the light diffusing material, light entering from two different light-emitting sources, is disposed; and a light-exiting surface which radiates light from the first light-emitting source and the second light-emitting source that has entered from the light-entering surface.

According to the light-emitting apparatus of the present invention, since depressions and projections which mix the light entering from the light-emitting sources are formed on the light-entering surface of the lens member, then light of two types having mutually different chromaticities emitted from the light-emitting sources proceeds inside the lens member while being mixed due to respectively passing through the depressions and projections on the light-entering surface. Therefore, the light of two types having mutually different chromaticities emitted from the light-emitting sources is mixed well and is radiated from the light-exiting surface of the lens member. Consequently, separation of the light of two types having mutually different chromaticities in the light radiated from the lens member can be prevented satisfactorily.

In particular, if the depressions and projections on the light-entering surface are formed as a plurality of V-shaped grooves which extend in a direction parallel to the dividing line between the light-emitting surfaces, then the light of two types of mutually different chromaticities emitted from the light sources is dispersed in mutually intersecting directions, and hence separation of the light when the light is radiated from the light distributing member such as that described above can be prevented more effectively.

Moreover, in this case, if the apex angle of the ridges having a V-shaped cross-section which are formed by two mutually adjacent V-shaped grooves is an obtuse angle, then the light of two types having mutually different chromaticities emitted from the light sources is mixed well by mutual intersection, and separation of the light of this kind can be prevented even more effectively.

Furthermore, if depressions and projections are formed on the light-exiting surface of the lens member, then light of two types having mutually different chromaticities which proceeds inside the lens member while being mixed due to passing through the depressions and projections on the light-entering surface is further mixed by the depressions and projections on the light-exiting surface upon being radiated from the light-exiting surface. Consequently, it is possible more effectively to prevent separation of light as described above.

Furthermore, if the shape of the light-entering surface side of the lens member is a convex lens shape, then the light of two types having mutually different chromaticities emitted from the light-emitting sources can be condensed well. Especially in cases where the cross-sectional shape of the depressions and projections described above is a sawtooth shape, the condensing and color mixing in the light-emitting apparatus is particularly improved.

Moreover, if the shape of the light-entering surface side of the lens member is a convex lens shape and the distance from the light-entering surface of the lens member to the light-emitting source is no less than 0.5 times and no more than 2 times the focal distance of the lens member, then it is possible to better mix the light of two types having mutually different chromaticities which is emitted from the light-emitting sources.

If the shape of the light-entering surface side of the lens member is a convex lens shape and the distance from the light-entering surface of the light distributing member to the light-emitting source is no less than 0.5 times and no more than 2 times the distance between the two light-emitting sources, then it is possible to better mix the light of two types having mutually different chromaticities which is emitted from the light-emitting sources.

According to the light-emitting apparatus of the present invention, the light emitted respectively from the first light-emitting surface of the first light-emitting source and the second light-emitting surface of the second light-emitting source is radiated after being mixed by the light diffusing material of the light mixing member, and therefore separation of the light of two types having mutually different chromaticities in the light radiated from the light-emitting apparatus can be prevented satisfactorily.

Furthermore, if the shape of the light-entering surface side of the lens member is a convex lens shape and if the light mixing member is a plate-shape body having a curvature which is the same as the curvature of the light-entering surface side of the lens member, then it is possible to better mix the light of two types having mutually different chromaticities which is emitted from the light-emitting sources. Moreover, if the light mixing member is a cap-shaped plate-like body and the bottom surface of the cup is close to the lens member, then the light of two types having mutually different chromaticities emitted from the light-emitting sources can be mixed better.

Moreover, if the shape of the light-entering surface side of the lens member is a convex lens shape and the distance from the light mixing member to the light-emitting source is no less than 0.5 times and no more than 2 times the focal distance of the lens member, then it is possible to better mix the light of two types having mutually different chromaticities which is emitted from the light-emitting sources.

Furthermore, if the shape of the light-entering surface side of the lens member is a convex lens shape and the distance from the light mixing member to the light-emitting source is no less than 0.5 times and no more than 2 times the distance between the two light-emitting sources, then it is possible to better mix the light of two types having mutually different chromaticities which is emitted from the light-emitting sources.

If the light-emitting sources are constituted by a first light-emitting source and a second light-emitting source, and the first light-emitting source is taken to be a first LED which emits light of a first chromaticity and the second light-emitting source is taken to be a second LED which emits light of a second chromaticity, then it is possible to keep the power consumption of the light-emitting apparatus low.

In this case, since the first LED is composed by first LED chips and a first wavelength conversion member which converts the wavelength of at least a portion of the light emitted by the first LED chips and radiates light of a first chromaticity, and the second LED is composed by second LED chips and a second wavelength conversion member which converts the wavelength of at least a portion of the light emitted by the second LED chips and radiates light of a second chromaticity, then it is possible to obtain combined light having excellent color rendition compared to a case where light emitted by an LED chip is used directly.

If a first LED and a second LED are provided and the first LED is accommodated in a first depression formed in the substrate while the second LED is accommodated in a second depression, then the first LED and the second LED provided in the substrate are not liable to interfere with the lens member and the freedom of arrangement of the lens member is increased. Moreover, if the opening shape of the first depression in the substrate and the opening shape of the second depression in the substrate are made substantially the same, then shape deviation upon mixing of the light emitted respectively from the first LED and the second LED is prevented, and the light can be mixed better.

If a light-emitting apparatus as described above is applied to a lighting apparatus, then due to the beneficial effects of the light-emitting apparatus described above, it is possible to obtain illuminating light of high quality from the lighting apparatus.

According to the lens of the present invention, since depressions and projections which mix the light entering from the light-emitting sources are formed on the light-entering surface of the lens, then light of two types having mutually different chromaticities emitted from the light-emitting sources proceeds inside the lens while respectively being mixed due to passing through the depressions and projections on the light-entering surface. Therefore, the light of two types having mutually different chromaticities emitted from the light-emitting sources is mixed well and is radiated from the light-exiting surface of the lens. Consequently, it is possible to satisfactorily prevent separation of the light of two types having mutually different chromaticities in the light radiated from the lens.

According to the lens of the present invention, light entering from two different light-emitting sources is radiated after being mixed by the light diffusing material in the light mixing member, and therefore separation of the light of two types having mutually different chromaticities in the light radiated from the lens can be prevented satisfactorily.

Moreover, since the shape of at least one of the light-entering surface and the light-exiting surface of the lens according to the present invention is a convex lens shape, then the light entering from the first light-emitting source and the second light-emitting source can be condensed well.

BEST MODE FOR CARRYING OUT THE INVENTION

Below, embodiments of the present invention are described in detail with reference to the drawings. The present invention is not limited to the contents described below and can be implemented by making modifications within a range that does not change the essence of the invention. Furthermore, the drawings used in the following description all show schematic views of the light-emitting apparatus according the present invention and may include partial exaggerations, enlargements, reductions or omissions, and the like, in order to aid understanding. The drawings therefore may not provide an accurate representation of the scale and shape of the respective constituent members, and the like. Moreover, the various numerical values used in the following description are all exemplary values and can be modified variously in accordance with requirements.

First Practical Example

Figure 1:
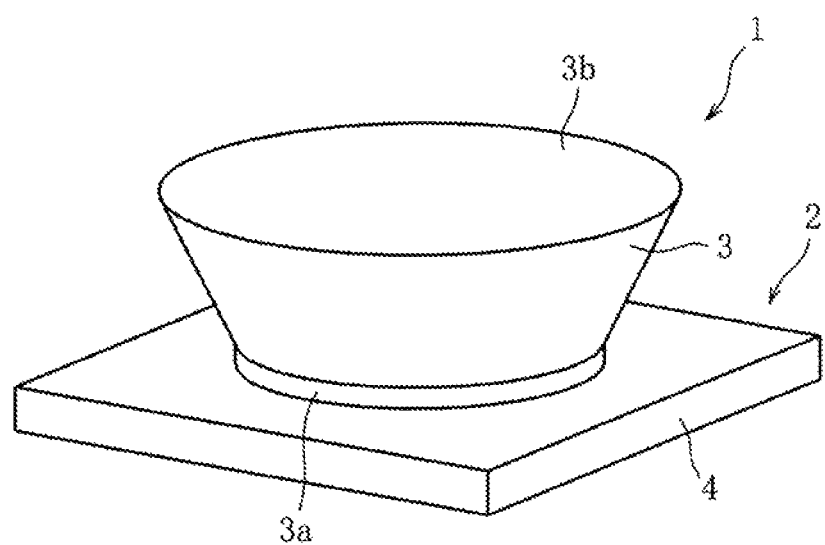
FIG. 1 is a perspective diagram showing a schematic composition of a light-emitting apparatus relating to a first practical example of the present invention.

FIG. 1 is a schematic drawing showing a schematic composition of a light-emitting apparatus 1 relating to a first practical example of the present invention. As shown in FIG. 1, the light-emitting apparatus 1 includes: a light-emitting unit 2 which corresponds to a light-emitting source of the present invention; and a light distributing lens (light distributing member, lens member) 3 made of glass or resin having translucent properties, or the like, which is used in combination with this light-emitting unit 2. The light distributing lens 3 is formed in a round truncated conical shape as shown in FIG. 1, and is abutted against the light-emitting unit 2 via an abutting section 3a formed at the end section on the small diameter-side, and fixed by using an adhesive, or the like. In this light distributing lens 3, light emitted from the light-emitting unit 2 enters from a light-entering surface (not illustrated in FIG. 1) and is then radiated from a light-exiting surface 3b on the large diameter-side, in a predetermined direction and range with respect to this light-exiting surface 3b. In other words, the light distributing lens 3 has a convex lens function for condensing light emitted by the light-emitting unit 2.

Figure 2:
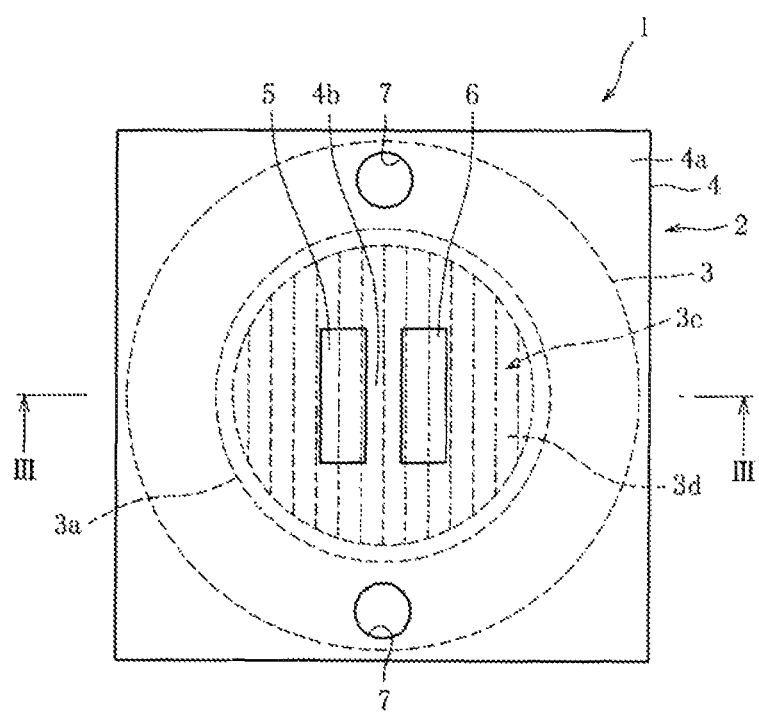
FIG. 2 is a plan diagram showing a schematic view of the light-emitting apparatus in FIG. 1.
Figure 3:
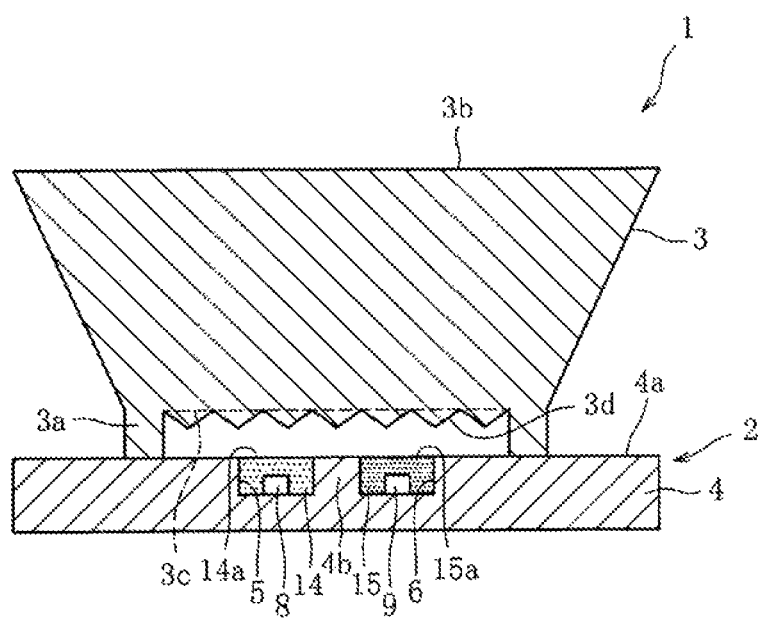
FIG. 3 is a schematic cross-sectional diagram of the light-emitting apparatus along line III-III in FIG. 2.

FIG. 2 is a plan diagram showing a schematic view of the light-emitting apparatus 1, and FIG. 3 is a schematic cross-sectional diagram of the light-emitting apparatus 1 along line III-III in FIG. 2. In FIG. 2, for the sake of convenience, the light distributing lens 3 is depicted by dotted lines. As shown in FIG. 2 and FIG. 3, the light-emitting unit 2 includes a substrate 4 made of an alumina type ceramic having excellent electrical insulating properties and good heat radiating properties. A first depression 5 and a second depression 6 are formed in a first surface 4a of the substrate 4.

The abutting section 3a of the light distributing lens 3 is formed as a ring-shaped wall about a whole circumference of a perimeter edge section of the small diameter-side end section of the light distributing lens 3, and as shown in FIG. 2 and FIG. 3, when the light distributing lens 3 is installed in the light-emitting unit 2, the abutting section 3a surrounds the first depression 5 and the second depression 6. A pair of installation holes 7 which are used to fix the light-emitting unit 2 to an apparatus that uses the light-emitting apparatus 1 as a light source, such as a lighting apparatus, are formed in the substrate 4. The size, number and shape of the installation holes 7 can be modified according to requirements. Furthermore, it is also possible to omit the installation holes 7.

(Overall Composition of Light-Emitting Unit)

Figure 4:
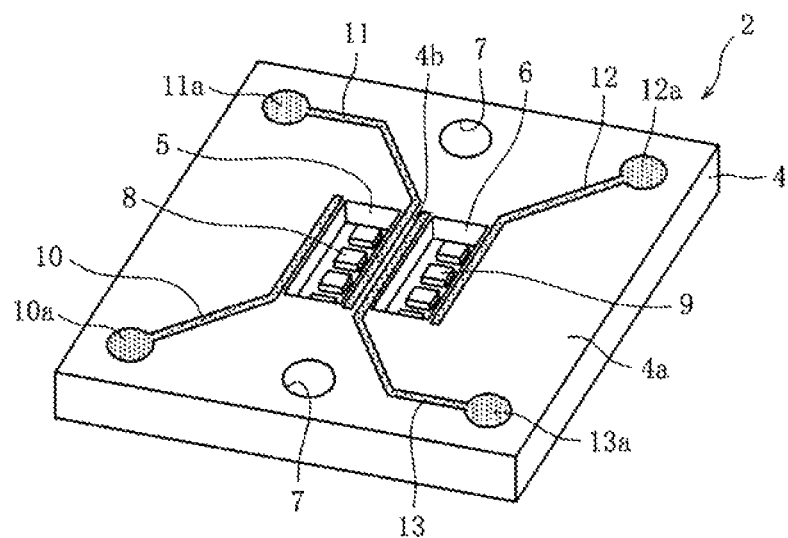
FIG. 4 is a perspective diagram of a light-emitting unit which is used in the light-emitting apparatus in FIG. 1.

FIG. 4 is a perspective diagram of a light-emitting unit 2 which is used in the light-emitting apparatus 1. As described above, the first depression 5 and the second depression 6 which are open on the first surface 4a of the substrate 4 are formed on the substrate 4 which is made from an alumina type ceramic having excellent electrical insulating properties and good heat radiating properties. The first depression 5 and second depression 6 are formed in such a manner that the opening surface area and the opening shape on the first surface 4a of the substrate 4 are substantially the same, and are arranged alongside each other on either side of a partitioning wall 4b which is one portion of the substrate 4. In the present practical example, the first depression 5 and the second depression 6 have a rectangular opening shape, but the opening shape is not limited to this and may be modified to various shapes. As described hereinafter, desirably, the depressions both have substantially the same opening surface area and the same opening shape.

As shown in FIG. 3 and FIG. 4, four first LED chips 8 are arranged in one row along the partitioning wall 4b in a bottom surface of the first depression 5, and four second LED chips 9 are arranged in one row along the partitioning wall 4b in a bottom surface of the second depression 6. Furthermore, as shown in FIG. 4, in order to supply a drive current to the first LED chip 8 and the second LED chip 9, a first wiring pattern 10, a second wiring pattern 11, a third wiring pattern 12 and a fourth wiring pattern 13 made of metal having good electrical conductivity, such as copper foil, are respectively formed on the first surface 4a of the substrate 4.

The number of the first LED chips 8 and the second LED chips 9 in the present practical example is just one example and can be increased or decreased according to requirements. Consequently, it is also possible to provide one first LED chip 8 and one second LED chip 9, and for the numbers of the respective chips to be different. Moreover, the material of the substrate 4 is not limited to an alumina type ceramic, and it is possible to use various materials, for example, a material selected from ceramic, resin, glass epoxy, or a composite resin which contains filler, or the like. Alternatively, in improving the light emission efficiency of the light-emitting apparatus 1 by raising the reflectivity of light at the first surface 4a of the substrate 4, it is desirable to use a silicone resin which includes white pigment, such as alumina powder, silica powder, magnesium oxide, titanium oxide, and the like. Moreover, it is also possible to improve heat radiating properties by using a metal substrate of any kind, such as a copper substrate or aluminum substrate. In this case, it is necessary to form a wiring pattern on the substrate via an electrical insulation.

External connection lands 10a and 11a for connecting external wires are provided respectively on one end of the first wiring pattern 10 and one end of the second wiring pattern 11. On the other hand, the other ends of the first wiring pattern 10 and the second wiring pattern 11 are respectively extended along the first depression 5 so as to be situated on either side of the first depression 5, as shown in FIG. 4. Furthermore, external connection lands 12a and 13a for connecting external wires are provided respectively on one end of the third wiring pattern 12 and one end of the fourth wiring pattern 13. On the other hand, the other end of the third wiring pattern 12 and the fourth wiring pattern 13 are respectively extended along the second depression 6 so as to be situated on either side of the second depression 6, as shown in FIG. 4.

As shown in FIG. 3, the interior of the first depression 5 is filled so as to cover the first LED chips 8 with a first fluorescent member (first wavelength conversion member) 14 which converts a wavelength of a portion or all of the light emitted by the first LED chips 8. Similarly, the interior of the second depression 6 is filled so as to cover the second LED chips 9 with a second fluorescent member (second wavelength conversion member) 15 which converts a wavelength of a portion or all of the light emitted by the second LED chips 9. In FIG. 4, for the sake of convenience, the first fluorescent member 14 and the second fluorescent member 15 are not depicted.

According to the composition of a light-emitting unit 2 of this kind, when the first LED chips 8 emit light, the wavelength of a portion or all of the light emitted by the first LED chips 8 is converted by the first fluorescent member 14, and the light obtained by this wavelength conversion is radiated from the first fluorescent member 14. Furthermore, when the second LED chips 9 emit light, the wavelength of a portion or all of the light emitted by the second LED chips 9 is converted by the second fluorescent member 15, and the light obtained by this wavelength conversion is radiated from the second fluorescent member 15.

Consequently, the combination of the first LED chips 8 and the first fluorescent member 14 constitutes a first LED 26, as well as corresponding to a first light-emitting source which is one light-emitting source of the present invention. Furthermore, the combination of the second LED chips 9 and the first fluorescent member 15 constitutes a second LED 27, as well as corresponding to a second light-emitting source which is another light-emitting source of the present invention. On the first surface 4a of the substrate 4, an upper surface 14a of the first fluorescent member 14 which is exposed via the opening of the first depression 5 corresponds to a first light-emitting surface of the present invention, and an upper surface 15a of the second fluorescent member 15 which is exposed via the opening of the second depression 6 corresponds to a second light-emitting surface of the present invention. Therefore, below, the upper surface 14a of the first fluorescent member 14 is called the first light-emitting surface and the upper surface 15a of the second fluorescent member 15 is called the second light-emitting surface. Furthermore, the first depression 5 and the second depression 6 are separated by a partitioning wall 4b as described above, and therefore the partitioning wall 4b forms a dividing line between the first light-emitting surface and the second light-emitting surface of the present invention.

Figure 5:
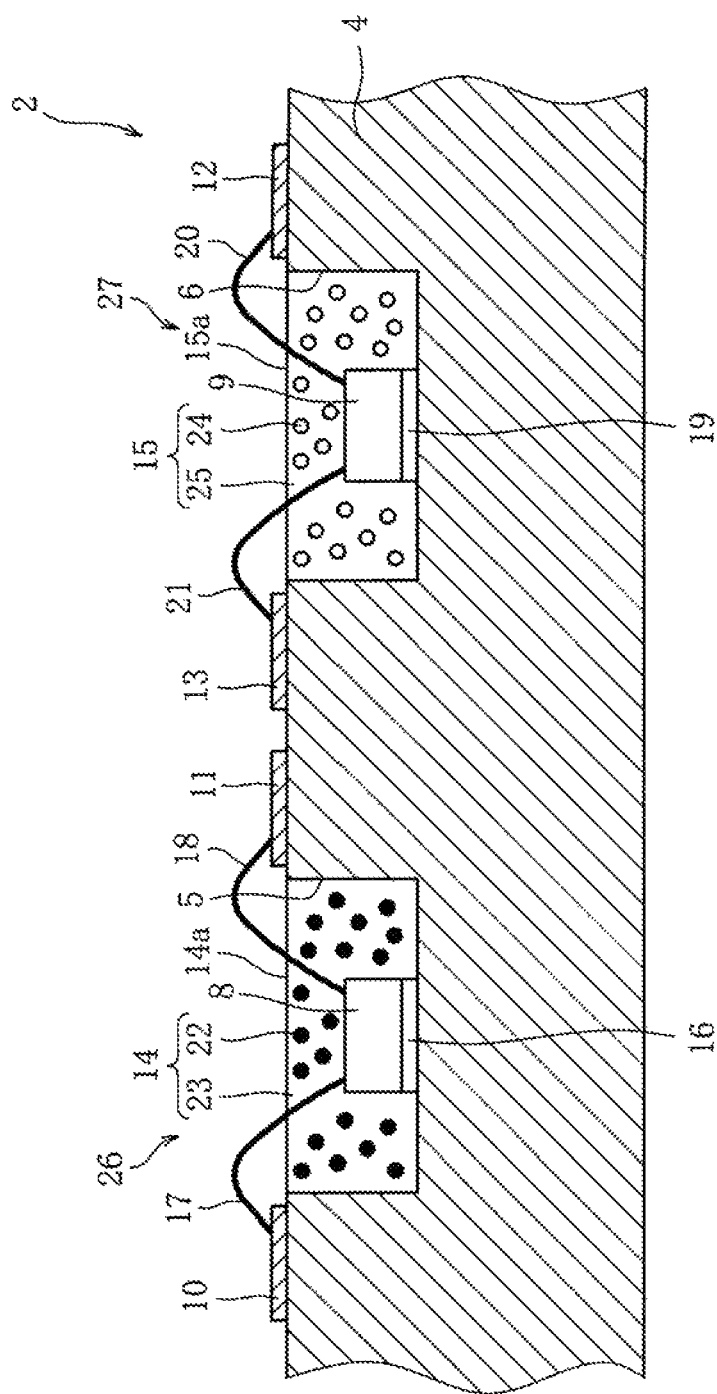
FIG. 5 is a principal enlarged diagram of the periphery of a first depression and a second depression in a cross-section of FIG. 3.

Here, the composition of a light-emitting unit 2 centered on the first LED chips 8, the second LED chips 9, the first fluorescent member 14 and the second fluorescent member 15 is described in further detail with reference to FIG. 5. FIG. 5 is a principal enlarged diagram of the periphery of the first depression 5 and the second depression 6 in a cross-sectional view of the light-emitting unit 2 shown in FIG. 3. As shown in FIG. 5, each first LED chip 8 is bonded to the bottom surface of the first depression 5 via an adhesive 16, and two electrodes provided on the upper surface of the first LED chip 8 are respectively connected by wire bonding to corresponding wiring patterns. More specifically, a p electrode of the first LED chip 8 is connected to a first wiring pattern 10 by a metal wire 17, and an n electrode is connected to a second wiring pattern 11 by a metal wire 18. FIG. 5 shows a connected state of one first LED chip 8, but four first LED chips 8 are each connected in a similar fashion to the first wiring pattern 10 and the second wiring pattern 11. Consequently, the four first LED chips 8 are connected mutually in parallel between the first wiring pattern 10 and the second wiring pattern 11, with their respective anodes on the side of the first wiring pattern 10.

As shown in FIG. 5, four second LED chips 9 which are arranged on the bottom surface of the second depression 6 are also bonded to the bottom surface of the second depression 6 by adhesive 19, similarly to the first LED chips 8, and are connected to corresponding wiring patterns by wire bonding. More specifically, an n electrode of the second LED chip 9 is connected to a third wiring pattern 12 by a metal wire 20, and a p electrode is connected to a fourth wiring pattern 13 by a metal wire 21. FIG. 5 shows a connected state of one second LED chip 9, but four second LED chips 9 are each connected in a similar fashion to the third wiring pattern 12 and the fourth wiring pattern 13. Consequently, the four second LED chips 9 are connected mutually in parallel between the third wiring pattern 12 and the fourth wiring pattern 13, with their respective anodes on the side of the fourth wiring pattern 13.

The mounting of the first LED chips 8 and the second LED chips 9 on the substrate 4 and the connection thereof to the wiring patterns is not limited to this, and a suitable method can be selected in accordance with the type and structure, and the like, of the LED chips. For example, it is also possible to using flip-chip mounting, in such a manner that two electrodes on the lower surface of each LED chip are bonded to wiring patterns formed on the bottom surfaces of the first depression 5 and the second depression 6. Alternatively, one electrode on the lower surface of each LED chip may be bonded to a wiring pattern formed on the bottom surface of the first depression 5 or the second depression 6, and one electrode on the upper surface of each LED chip may be connected by wire bonding to a wiring pattern formed on the first surface 4a of the substrate 4.

As described above, the interior of the first depression 5 is filled so as to cover the first LED chips 8, with a first fluorescent member 14 which converts the wavelength of a portion or all of the light emitted by the first LED chips 8. This first fluorescent member 14 is constituted by a first fluorescent body 22 which is excited by the light emitted by the first LED chip 8 and radiates light of a different wavelength from the light emitted by the first LED chip 8, and a filling material 23 which holds the first fluorescent body 22 in a distributed fashion. On the other hand, the interior of the second depression 6 is filled so as to cover the second LED chips 9 with a second fluorescent member 15 which converts a wavelength of a portion or all of the light emitted by the second LED chips 9. This second fluorescent member 15 is constituted by a second fluorescent body 24 which is excited by the light emitted by the second LED chips 9 and radiates light of a different wavelength from the light emitted by the second LED chips 9, and a filling material 25 which holds the second fluorescent body 24 in a distributed fashion. Next, the specific composition of the first LED chips 8 and the second LED chips 9 and the first fluorescent member 14 and the second fluorescent member 15 will be described in detail.

(LED Chip)

The first LED chip 8 and the second LED chip 9 used in the present practical example are both LED chips which emit near-ultraviolet light having a peak wavelength of 405 nm. More specifically, it is desirable for an LED chip of this kind to be a GaN type LED chip, or the like, which emits light in a near-ultraviolet region, using an InGaN semiconductor as a light-emitting layer. The type and light emission wavelength characteristics of the first LED chips 8 and the second LED chips 9 are not limited in particular to this, and it is possible to use various LED chips provided that the essence of the present invention is not changed. It is also possible to use an LED chip which emits blue light, for example, as an LED chip other than an LED chip which emits near-ultraviolet light. Consequently, the peak wavelength of the light emitted by the first LED chips 8 and the second LED chips 9 in the present practical example is desirably in a range of 360 nm to 460 nm, and preferably in a range of 400 nm to 450 nm.

(Fluorescent Member)

In the present practical example, the first fluorescent body 22 in the first fluorescent member 14 and the second fluorescent body 24 in the second fluorescent member 15 have mutually different wavelength conversion characteristics. It is possible to adopt various combinations of different wavelength conversion characteristics of this kind. In the present practical example, three types of fluorescent body, namely, a red fluorescent body, a green fluorescent body and a blue fluorescent body, are used in combination in both the first fluorescent body 22 and the second fluorescent body 24.

The wavelength of the near-ultraviolet light emitted by the four first LED chips 8 is converted respectively into red light, green light and blue light by the red fluorescent body, green fluorescent body and blue fluorescent body which are held in distributed fashion as the first fluorescent body 22 inside the first fluorescent member 14, and white light obtained by combining the red light, green light and blue light is radiated from the upper surface of the first fluorescent member 14, in other words, the first light-emitting surface 14a. Furthermore, the wavelength of the near-ultraviolet light emitted by the four second LED chips 9 is converted respectively into red light, green light and blue light by the red fluorescent body, green fluorescent body and blue fluorescent body which are held in distributed fashion as the second fluorescent body 24 inside the second fluorescent member 15, and white light obtained by combining the red light, green light and blue light is radiated from the upper surface of the second fluorescent member 15, in other words, the second light-emitting surface 15a.

Here, the mixing ratios of the red fluorescent body, the green fluorescent body and the blue fluorescent body are different in the first fluorescent body 22 and the second fluorescent body 24, and the first color temperature T1 of the white light radiated from the first light-emitting surface 14a and the second color temperature T2 of the white light radiated from the second light-emitting surface 15a are mutually different. In other words, the white light radiated from the first light-emitting surface 14a corresponds to light of a first chromaticity according to the present invention, and the white light radiated from the second light-emitting surface 15a corresponds to light of a second chromaticity according to the present invention. In the present practical example, the first color temperature T1 is taken to be 2500 K, for example, and the second color temperature T2 is set to 6500 K, which is higher than the first color temperature T1. The values of the first color temperature T1 and the second color temperature T2 are not limited to these values, and can be set variously in accordance with the characteristics required in the light-emitting apparatus 1.

The first fluorescent body 22 and the second fluorescent body 24 are not limited to mixtures of a red fluorescent body, a green fluorescent body and a red fluorescent body as described above. For instance, it is also possible to form a first fluorescent body 22 and a second fluorescent body 24 by mixing a blue fluorescent body and a yellow fluorescent body. In this case, the wavelength of the near-ultraviolet light emitted by the first LED chip 8 is converted into blue light and yellow light by the blue fluorescent body and the yellow fluorescent body held in a distributed fashion as a first fluorescent body 22 inside the first fluorescent member 14, and the white light obtained by combining the blue light and yellow light is radiated from the first light-emitting surface 14a. In the second fluorescent member 15, similarly, white light is radiated from the second light-emitting surface 15a by the second fluorescent body 24 converting the wavelength of near-ultraviolet light emitted by the second LED chips 9. In this case also, by altering the mixing ratios of the blue fluorescent body and the yellow fluorescent body in the first fluorescent body 22 and the second fluorescent body 24, the first color temperature T1 of the white light radiated from the first light-emitting surface 14a and the second color temperature T2 of the white light radiated from the second light-emitting surface 15a can be made mutually different.

Moreover, rather than mixing a blue fluorescent body and a yellow fluorescent body as described above, it is also possible to use a blue fluorescent body for the first fluorescent body 22 and to use a yellow fluorescent body for the second fluorescent body 24. In this case, the wavelength of the near-ultraviolet light emitted by the first LED chips 8 is converted into blue light by the first fluorescent body 22, and the wavelength of the near-ultraviolet light emitted by the second LED chips 9 is converted into yellow light by the second fluorescent body 24. Consequently, it is possible to obtain white light of various color temperatures by combining the blue light and yellow light.

Instead of this combination of a blue fluorescent body and a yellow fluorescent body, it is also possible to use a combination of a red fluorescent body and a blue/green (cyan) fluorescent body in a similar method. In other words, it is possible to mix a red fluorescent body and a blue/green fluorescent body and to use these as a first fluorescent body 22 and a second fluorescent body 24 by altering the mixing ratio thereof, and it is also possible to use a red fluorescent body as the first fluorescent body 22 and to use a blue/green fluorescent body as the second fluorescent body 24.

Moreover, as described previously, it is also possible to use an LED chip which emits light other than near-ultraviolet light, for the first LED chips 8 and the second LED chips 9. For example, if an LED chip which emits blue light is used for the first LED chips 8 and the second LED chips 9, then it is possible to use a mixture of a red fluorescent body which converts the wavelength of the blue light and radiates red light, and a green fluorescent body which converts the wavelength of the blue light and radiates green light, for the first fluorescent body 22 and the second fluorescent body 24.

By adopting a combination of this kind, in the first fluorescent member 14, it is possible to obtain white light by combining the blue light emitted by the first LED chips 8 with the red light radiated by the red fluorescent body and the green light radiated by the green fluorescent body. Furthermore, in the second fluorescent member 15 also, it is possible to obtain white light by combining the blue light emitted by the second LED chips 8 with the red light radiated by the red fluorescent body and the green light radiated by the green fluorescent body. Consequently, by altering the mixing ratio of the red fluorescent body and the green fluorescent body, between the first fluorescent member 14 and the second fluorescent member 15, it is possible to radiate white light of respectively different color temperatures from the first light-emitting surface 14a and the second light-emitting surface 15a, similarly to the present practical example.

In this way, it is possible to adopt fluorescent bodies of various types for the first fluorescent body 22 and the second fluorescent body 24. The light obtained respectively from the first fluorescent member 14 and the second fluorescent member 15, and the light obtained by combining these is not limited to white light, and the types of the first fluorescent body 22 and the second fluorescent body 24 should be selected appropriately in such a manner that the first chromaticity of the light radiated from the first light-emitting surface 14a and the second chromaticity of the light radiated from the second light-emitting surface 15a are mutually different, in accordance with the chromaticity, brightness, and the like, of the radiated light required in the light-emitting apparatus 1. Specific examples of the fluorescent bodies of various types and filling material described above are given below.

(Red Fluorescent Body)

A suitable range for the light emission peak wavelength of the red fluorescent body is normally no less than 570 nm, desirably no less than 580 nm, more desirably no less than 585 nm, and normally, no more than 780 nm, desirably no more than 700 nm, and more desirably no more than 680 nm. Desirable examples of a red fluorescent body are: $(Ca, Sr, Ba)_2Si_8(N,O)_8$: Eu; $(Ca, Sr, Ba)Si(N,O)_2$: Eu; $(Ca, Sr, Ba)AlSi(N,O)_8$: Eu; $(Sr, Ba)_3SiO_5$: Eu; $(Ca, Sr)$ S: Eu; $SrAlSi_4N_7$: Eu; $(La, Y)_2O_2S$: Eu; or a β-diketone type Eu complex such as Eu (dibenzoyl methane) 3.1, 10-phenantroline complex, or a carboxylic acid type Eu complex or $K_2SiF_6$, and more desirable examples are: $(Ca, Sr, Ba)_2Si_8(N,O)_8$: Eu; $(Sr, Ca)AlSi(N,O)_8$: Eu; $SrAlSi_4N_7$: Eu; $(La, Y)_2O_2S$: Eu; and $K_2SiF_6$: Mn.

(Orange Fluorescent Body)

For a red fluorescent body having a light emission peak wavelength in a range of no less than 580 nm and desirably no less than 590 nm, and no more than 620 nm and desirably no more than 610 nm, it is suitable to use an orange fluorescent body. Possible examples of an orange fluorescent body of this kind are: $(Sr, Ba)_3SiO_5$: Eu; $(Sr, Ba)_2SiO_4$: Eu; $(Ca, Sr, Ba)_2Si_s(N, O)_8$: Eu; $(Ca, Sr, Ba) AlSi(N,O)_8$: Ce; and the like.

(Green Fluorescent Body)

A suitable range for the light emission peak wavelength of the green fluorescent body is normally no less than 500 nm, desirably no less than 510 nm, more desirably no less than 515 nm, and normally less than 550 nm, desirably no more than 542 nm, and more desirably no more than 535 nm. Desirable examples of a green fluorescent body are: $Y_3(Al, Ga)_5O_{12}$: Ce; $CaSc_2O_4$: Ce; Ce, $Ca_3(Sc, Mg)_2Si_3O_{12}$: Ce; $(Sr, Ba)_2SiO_4$: Eu; $(Si, Al)_6(O, N)_8$: Eu (β-sairon); $(Ba, Sr)_3Si_6O_{12}$: $N_2$: Eu; $SrGa_2S_4$: Eu; $BaMgAl_{10}O_{17}$: Eu, Mn; and the like.

(Blue Fluorescent Body)

A suitable range for the light emission peak wavelength of the blue fluorescent body is normally no less than 420 nm, desirably no less than 430 nm, more desirably no less than 440 nm, and normally less than 500 nm, desirably no more than 490 nm, more desirably no more than 480 nm, even more desirably no more than 470 nm and particularly desirably no more than 460 nm. Desirable examples of the blue fluorescent body are: $(Ca, Sr, Ba)MgAl_{10}O_{17}$: Eu; $(Sr, Ca, Ba, Mg)_{10}(PO_4)_6(Cl, F)_2$: Eu; $(Ba, Ca, Mg, Sr)_2SiO_4$: Eu; and $(Ba, Ca, Sr)_3MgSi_2O_8$: Eu, of which $(Ba, Sr)MgAl_{10}O_{17}$: Eu; $(Ca, Sr, Ba)_{10}(PO_4)_6(Cl, F)_2$: Eu and $Ba_3MgSi_2O_8$: Eu are more desirable, and $Sr_{10}(PO_4)_6O_{12}$: Eu and $BaMgAl_{10}O_{17}$: Eu are especially desirable.

(Yellow Fluorescent Body)

A suitable range for the light emission peak wavelength of the yellow fluorescent body is normally no less than 530 nm, desirably no less than 540 nm, more desirably no less than 550 nm, and normally no more than 620 nm, desirably no more than 600 nm, and more desirably no more than 580 nm. Desirable examples of the yellow fluorescent body are: $Y_3Al_5O_{12}$: Ce; $(Y, Gd)_3Al_5O_{12}$: Ce; $(Sr, Ca, Ba, Mg)_2SiO_4$: Eu; $(Ca, Sr)Si_2N_2O_2$: Eu; α-sairon; and $La_3Si_6N_{11}$: Ce (a portion of which may be substituted with Ca or O).

(Blue/Green Fluorescent Body)

Possible examples of a blue/green fluorescent body are: a halophosphate type fluorescent body $(Ba, Ca, Mg)_{10}(PO_4)_6 Cl_{12}: Eu_{2+}$ (peak wavelength 483 nm); a phosphate type fluorescent body such as $2SrO \cdot _{0.84}P_2O_5 \cdot _{0.16}B_2O_3: Eu_{2+}$ (peak wavelength 480 nm); a silicate salt type fluorescent body such as $Sr Si_3O_8 \cdot 2SrCl_2: Eu_{2+}$ (peak wavelength 490 nm); an aluminate type fluorescent body such as $BaAl_8O_{13}: Eu_{2+}$ (peak wavelength 480 nm), $BaMg_2Al_{16}O_{27}: Eu_{2+}, Mn_{2+}$ (peak wavelength 450 nm, 515 nm), $SrMgAl_{10}O_{17}: Eu_{2+}$ (peak wavelength about 480 nm), or $Sr_{14}Al_4O_{25}: Eu_{2+}$ (peak wavelength about 480 nm); or a nitrate type fluorescent body such as $BaSi_2N_2O_2: Eu_{2+}$ (peak wavelength about 480 nm), or the like. It is also possible to use a mixture of blue/green fluorescent bodies of a plurality of types, instead of a blue/green fluorescent body of one type, and it is also possible to achieve radiated light having a blue/green color by suitably mixing a blue fluorescent body and a green fluorescent body.

(Filling Material)

A thermoplastic resin, a thermally curable resin and a light-curable resin, and the like, are used as the filling material 23 which holds the first fluorescent body 22 in dispersed fashion and the filling material 25 which holds the second fluorescent body 24 in dispersed fashion, but it is desirable to use a material having suitable transparency and durability with respect to the near-ultraviolet light which is emitted from the first LED chips 8 and the second LED chips 9. More specific examples of such a resin are: a (meth)acrylic resin, such as polymethyl (meth)acrylate; a styrene resin, such as polystyrene or a styrene-acrylonitrile copolymer, a polycarbonate resin; a polyester resin; a phenoxy resin; a butylal resin; a polyvinyl alcohol; a cellulose resin, such as ethyl cellulose, cellulose acetate, cellulose acetate butyrate, or the like, or an epoxy resin; a phenol resin; a silicone resin, or the like. Furthermore, it is also possible to use a solution obtained by hydrolytic polymerization by sol gelation of an inorganic material, for example, a metal alkoxide, a ceramic precursor polymer or a solution containing a metal alkoxide, or an inorganic material obtained by solidification of a combination of these, for example, an inorganic material having siloxane bonds, or glass.

(Light Distributing Lens)

Figure 6:
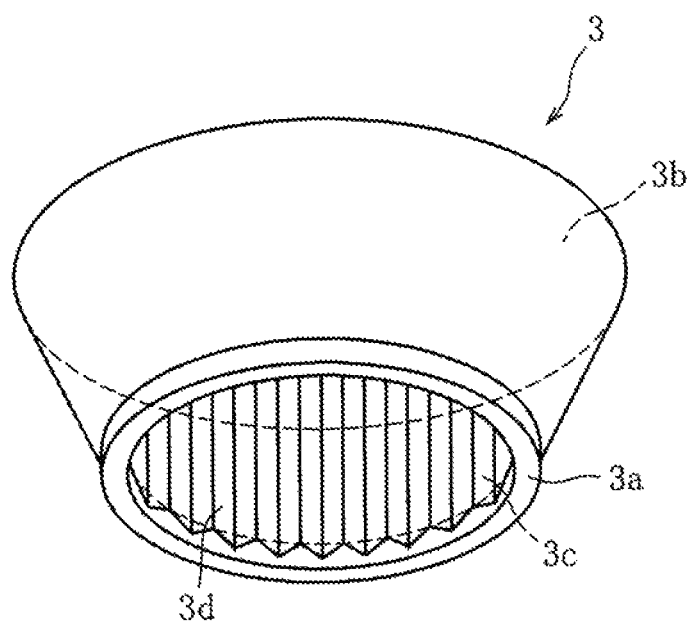
FIG. 6 is a perspective diagram of a light distributing lens which is used in the light-emitting apparatus in FIG. 1.
Figure 7:
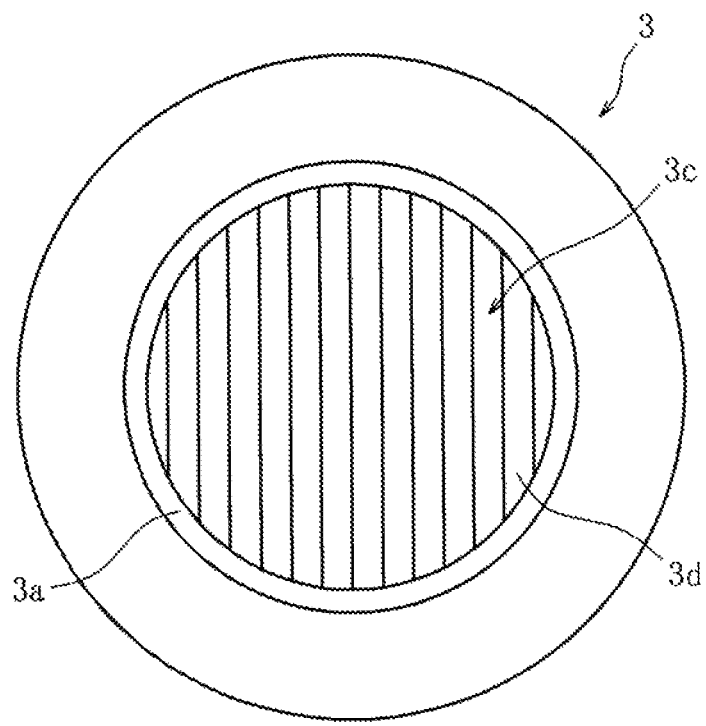
FIG. 7 is a plan diagram where the light distributing lens in FIG. 3 is observed from the side of the light-entering surface.

As described above, the light distributing lens 3 is formed in a truncated conical shape, from glass or a resin having translucent properties, or the like. FIG. 6 is a perspective diagram of a light distributing lens 3 observed from a small diameter side of a light distributing lens 3 of this kind, and FIG. 7 is a plan diagram of a light distributing lens 3 observed from the same small diameter side. As shown in FIG. 6 and FIG. 7, an abutting section 3a which forms a ring-shaped wall is formed about the whole circumference of the perimeter edge portion, in the small diameter-side end section of the lens 3.

As described previously on the basis of FIG. 2 and FIG. 3, this abutting section 3a abuts against the first surface 4a of the substrate 4 and also surrounds the first depression 5 and the second depression 6, when the light distributing lens 3 is installed in the light-emitting unit 2. Consequently, a light-entering surface 3c which is on the inner side of the abutting section 3a respectively faces the first light-emitting surface 14a and the second light-emitting surface 15a. Furthermore, the light-entering surface 3c which is on the inner side of the abutting section 3a is parallel respectively to the first light-emitting surface 14a and the second light-emitting surface 15a. Since the light-entering surface 3c faces the first light-emitting surface 14a and the second light-emitting surface 15a, then when light is radiated respectively from the first light-emitting surface 14a and the second light-emitting surface 15a, this light enters respectively into the light distributing lens 3 from the light-entering surface 3c. This combined light is radiated towards the exterior of the light distributing lens 3 from the light-exiting surface 3b on the large diameter-side of the light distributing lens 3. Below, the light radiated from the light-exiting surface 3b is called combined light as described above, and the light radiated respectively from the first light-emitting surface 14a and the second light-emitting surface 15a is called primary light.

As shown in FIG. 3, FIG. 6 and FIG. 7, a plurality of V-shaped grooves 3d having a V-shaped cross-section are provided extending in the same direction in the light-entering surface 3c of the light distributing lens 3. By providing these V-shaped grooves 3d, the light-entering surface 3c of the light distributing lens 3 has depressions and projections formed thereon due to an alternating arrangement of valleys and ridges each having a V-shaped cross-section.

As shown in FIG. 2, when the light-emitting apparatus 1 is viewed in plan view, the V-shaped grooves 3d are provided extending in the direction of extension of the partitioning wall 4b which separates the first depression 5 and the second depression 6. Furthermore, the first light-emitting surface 14a which is the upper surface of the first fluorescent member 14 is formed by the opening of the first depression 5 on the first surface 4a of the substrate 4, and the second light-emitting surface 15a which is the upper surface of the second fluorescent member 15 is formed by the opening of the second depression 6 on the first surface 4a of the substrate 4. As described previously, the partitioning wall 4b which separates the first depression 5 and the second depression 6 forms a dividing line between the first light-emitting surface and the second light-emitting surface of the present invention, and therefore the respective V-shaped grooves 3d are provided to extend in parallel with the dividing line between the first light-emitting surface 14a and the second light-emitting surface 15a.

By forming a plurality of V-shaped grooves 3d of this kind in the light-entering surface 3c of the light distributing lens 3, the primary light radiated respectively from the first light-emitting surface 14a and the second light-emitting surface 15a becomes more readily diffused in a direction perpendicular to the direction of extension of the V-shaped grooves 3d. In other words, the primary light radiated respectively from the first light-emitting surface 14a and the second light-emitting surface 15a is readily diffused in mutually intersecting directions, and therefore the primary light of two types is mixed well after passing through the V-shaped grooves 3d. As a result of this, the combined light radiated outwards from the light-exiting surface 3b of the light distributing lens 3 is excellent combined light in which the light of two types radiated respectively from the first light-emitting surface 14a and the second light-emitting surface 15a is not liable to become separated.

Furthermore, in this case, since the openings on the first surface 4a of the substrate 4 have substantially the same shape and surface area in the first depression 5 and the second depression 6, then shape deviation when mixing the primary light emitted respectively from the first light-emitting surface 14a and the second light-emitting surface 15a is prevented, and the primary light can be mixed more satisfactorily.

Moreover, in the present practical example, a first LED 26 is composed by first LED chips 8 and a first fluorescent member 14 which converts the wavelength of at least a portion of the light emitted by the first LED chips 8, and a second LED 27 is composed by second LED chips 9 and a second fluorescent member 15 which converts the wavelength of at least a portion of the light emitted by the second LED chips 9. Therefore, it is possible to obtain combined light having excellent color rendition compared to a case where light emitted by an LED chip is used directly as primary light.

Figure 8:
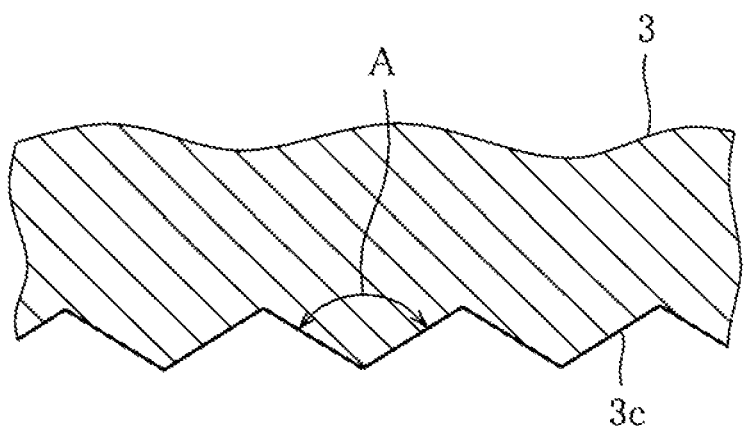
FIG. 8 is a principal enlarged diagram of a light distributing lens in a cross-section of FIG. 3.

FIG. 8 is a principal enlarged diagram showing an enlarged view of a portion of V-shaped grooves 3d in a cross-sectional diagram of FIG. 3. As shown in FIG. 8, in the present practical example, the apex angle A of a ridge formed by two mutually adjacent V-shaped grooves 3d and having a V-shaped cross-section is 120 degrees. The apex angle A is not limited to an angle of 120 degrees, but desirably is an obtuse angle in order that the primary light is mixed well as described above. More specifically, the apex angle A is desirably 95 to 170 degrees and more desirably 110 to 140 degrees.

Figure 9:
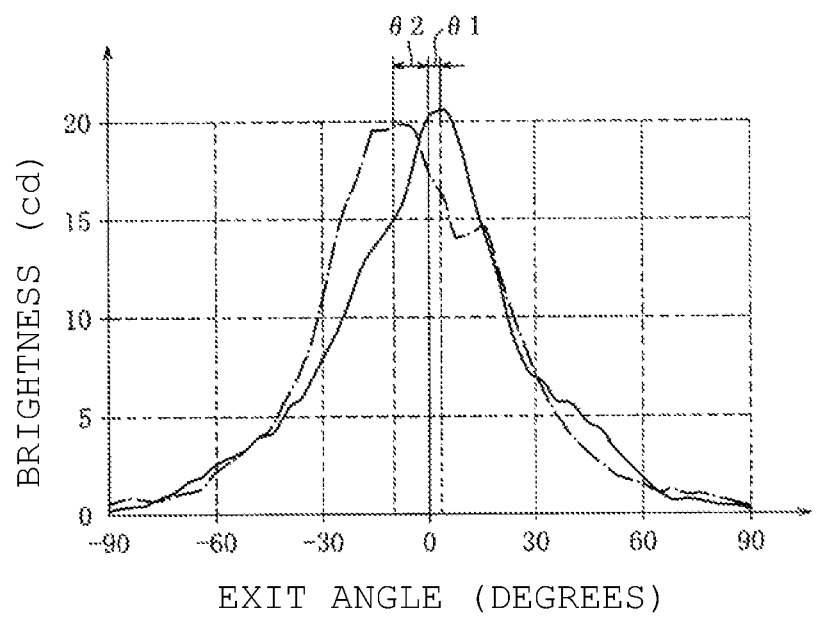
FIG. 9 is a graph showing comparative data for a light distributing lens which is used in the light-emitting apparatus in FIG. 1 and a light distributing lens which does not have V-shaped grooves provided in the light-entering surface.

FIG. 9 is a graph showing comparative data for a light distributing lens 3 which is used in the light-emitting apparatus 1 according to the present practical example and a light distributing lens for comparison, which does not have V-shaped grooves provided in the light-entering surface as in the present practical example. More specifically, in the light-emitting apparatus 1, the brightness of the light at the light-exiting surface 3b of the light distributing lens 3 when only the first LED chips 8 emit light and white light is radiated from the first LED 26 only, is indicated by a solid line in accordance with the exit angle. The exit angle used here is an angle in an imaginary plane which includes the central axis of the light distributing lens 3 and is perpendicular to the direction of extension of the partitioning wall 4b, in other words, the dividing line between the first light-emitting surface 14a and the second light-emitting surface 15a. The center of the light-exiting surface 3b is an angle of 0 degrees. Furthermore, the brightness of the light at the light-exiting surface of the light distributing lens for comparison, when the light distributing lens for comparison is substituted for the light distributing lens 3 in the light-emitting apparatus 1 and white light is radiated from the first LED 26 only, in a similar fashion, is indicated by the dotted line in accordance with the exit angle. The composition of the light distributing lens for comparison apart from the light-entering surface is the same as the light distributing lens 3.

As shown in FIG. 9, in the light distributing lens 3 according to the present practical example, the deviation θ1 from an exit angle of 0° at which the brightness is a peak at the light-exiting surface 3b is approximately 2°, whereas in the light distributing lens for comparison, the deviation θ2 from the exit angle of 0° is a large value of approximately 10°. FIG. 9 shows data for a case where white light is radiated only from the first LED 26 as described above, and when white light is radiated from the second LED 27 only, the resulting data is substantially symmetrical to the data FIG. 9 with respect to the exit angle of 0°. In other words, if white light is radiated respectively from the first LED 26 and the second LED 27, then the greater the deviation from an exit angle of 0°, the greater the deviation between the white light of two types in the combined light. Consequently, as FIG. 9 reveals, compared to the light distributing lens for comparison which has no V-shaped grooves in the light-entering surface, the light distributing lens 3 according to the present practical example produces excellent combined light in which the light of two types radiated respectively from the first LED 26 and the second LED 27 is not liable to become separated.

(Application to Lighting Apparatus)

As described above, in the present practical example, the primary light from the first light-emitting surface 14a is white light of a first color temperature T1 and the primary light from the second light-emitting surface 15a is white light of a second color temperature T2. Consequently, by combining the respective primary light using the light distributing lens 3 in this way, the combined light radiated from the light-exiting surface 3b of the light distributing lens 3 becomes white light of a color temperature between the first color temperature T1 and the second color temperature T2. Therefore, an example of a lighting apparatus is described below, in which the color temperature of the illuminating light can be adjusted between the first color temperature T1 and the second color temperature T2, by using the light-emitting apparatus 1 according to the present practical example as a light source.

Figure 10:
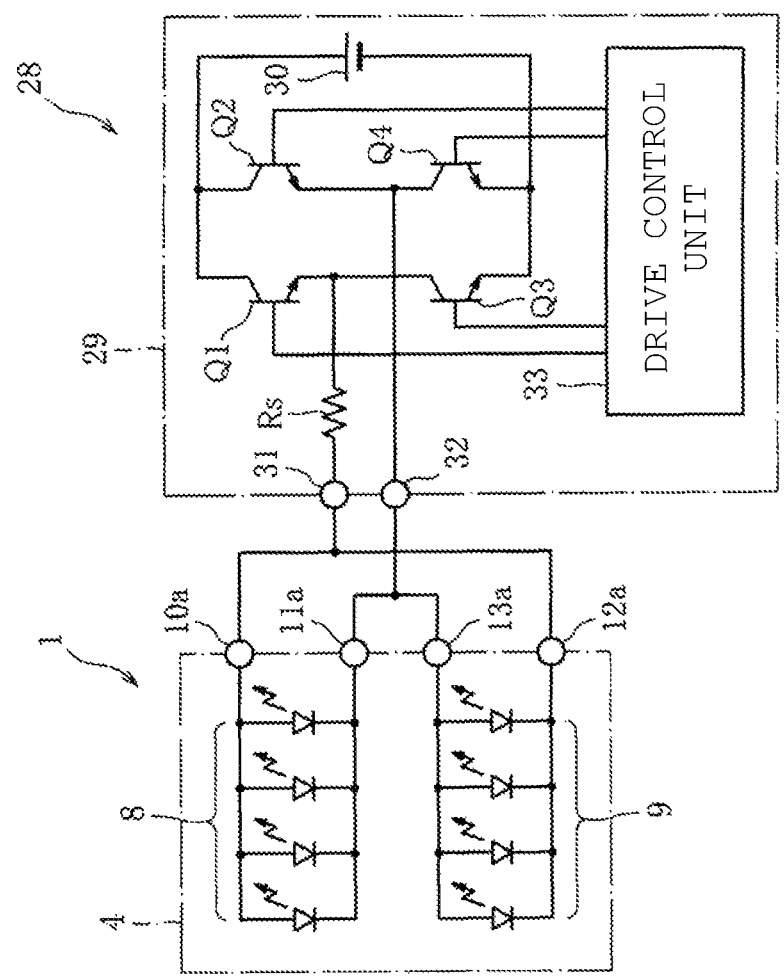
FIG. 10 is a circuit diagram showing an electrical circuit composition of a lighting apparatus in a case where the light-emitting apparatus in FIG. 1 is used in the lighting apparatus.

FIG. 10 is a circuit diagram showing a schematic view of an electrical circuit composition of a lighting apparatus 28 in a case where the light-emitting apparatus 1 according to the present practical example is used in the lighting apparatus 28. As stated previously, by mounting the first LED chips 8 and the second LED chips 9 on the substrate 4, the light-emitting apparatus 1 has an electrical circuit composition as shown in FIG. 10. In other words, the four first LED chips 8 are connected mutually in parallel between the two external connection lands 10a and 11a, with the anodes on the side of the external connection land 10a. On the other hand, the four second first LED chips 9 are connected mutually in parallel between the two external connection lands 12a and 13a, with the anodes on the side of the external connection land 13a. Consequently, in the light-emitting apparatus 1 according to the present practical example, the first LED chips 8 and the second LED chips 9 are electrically separated, in such a manner that drive current can be supplied independently thereto.

As shown in FIG. 10, the external connection land 10a and the external connection land 12a are electrically connected outside the substrate 4. Furthermore, the external connection land 11a and the external connection land 13a are also electrically connected outside the substrate 4. Therefore, the four first LED chips 8 and the four second LED chips 9 are connected mutually in parallel, with their polarities mutually reversed. A connection of this kind can be achieved by a wiring pattern formed on the substrate 4, rather than outside the substrate 4, as in the present practical example.

In order to supply drive current respectively to the first LED chips 8 and the second LED chips 9 of the light-emitting apparatus 1 and to control this supply of drive current, a drive unit 29 is provided in the lighting apparatus 28. The drive unit 29 has a full-bridge type of drive circuit which is constituted by four transistors Q1, Q2, Q3 and Q4. The collectors of the transistors Q1 and Q2 are connected to a positive electrode of the drive power source 30 which is provided in the drive unit 29 in order to supply electric power respectively to the first LED chips 8 and the second LED chips 9. Furthermore, the emitters of the transistors Q3 and Q4 are connected to a negative electrode of the drive source 30.

On the other hand, a connecting portion between the emitter of the transistor Q1 and the collector of the transistor Q3, which is one output side of the drive circuit, is connected to a connection terminal 31 of the drive unit 29 via a current limiting resistance Rs. Furthermore, a connecting portion between the emitter of the transistor Q2 and the collector of the transistor Q4, which is another output side of the drive circuit, is connected to the connection terminal 32 of the drive unit 29. The connection terminal 31 of the drive unit 29 is connected electrically to the external wiring lands 10a and 12a on the side of the light-emitting unit 1, and the connection terminal 32 of the drive unit 29 is connected electrically to the external wiring lands 11a and 13a on the side of the light-emitting unit 1.

The resistance Rs is provided in order to adjust the current flowing respectively in the first LED chips 8 and the second LED chips 9 in the light-emitting apparatus 1 to an appropriate size (for example, 60 mA per LED chip). The insertion position of the resistance Rs is not limited to this, and for example, one resistance Rs may be provided respectively between the transistor Q1 and the positive electrode of the drive source 30, and between the transistor Q2 and the positive electrode of the drive source 30. Furthermore, the resistance Rs may be installed on the substrate 4, for instance, on the side of the light-emitting apparatus 1, rather than being provided on the side of the drive unit 29.

The four transistors Q1 to Q4 can each be switched between an on state and an off state in accordance with respective base signals, and the respective bases are connected to a drive control unit (control means) 33 for controlling this switching. The drive control unit 33 outputs respective base signals in such a manner that the transistors Q1 and Q4 are switched on when both the transistors Q2 and Q3 are off, and in such a manner that the transistors Q2 and Q3 are switched on when both the transistors Q1 and Q4 are off.

By means of the electric circuit composition described above, if the transistors Q1 and Q4 are both switched on by a base signal from the drive control unit 33, then the positive electrode of the drive source 30 is connected to the external connection lands 10a and 12a of the light-emitting apparatus 1 via the transistor Q1 and the resistance Rs, and the negative electrode of the drive source 30 is connected to the external connection lands 11a and 13a of the light-emitting apparatus 1 via the transistor Q4. Consequently, in this case, only the first LED chips 8 emit light, since a forward-direction current flows only in the first LED chips 8 in the light-emitting apparatus 1.

The wavelength of a portion or all of the near-ultraviolet light emitted from the first LED chips 8 due to this supply of current is converted as described above by the first fluorescent body 22 which is held in a distributed fashion in the first fluorescent member 14 accommodated inside the first depression 5 of the substrate 4, similarly to the first LED chips 8, and white light of a first color temperature T1 is radiated from the first light-emitting surface 14a.

On the other hand, if the transistors Q2 and Q3 are both switched on by a base signal from the drive control unit 33, then the positive electrode of the drive source 30 is connected to the external connection lands 11a and 13a of the light-emitting apparatus 1 via the transistor Q2, and the negative electrode of the drive source 30 is connected to the external connection lands 10a and 12a of the light-emitting apparatus 1 via the resistance Rs and the transistor Q3. Consequently, in this case, only the second LED chips 9 emit light, since a forward-direction current flows only in the second LED chips 9 in the light-emitting apparatus 1.

The wavelength of a portion or all of the near-ultraviolet light emitted from the second LED chips 9 due to this supply of current is converted as described above by the second fluorescent body 24 which is held in a distributed fashion in the second fluorescent member 15 accommodated inside the second depression 6 of the substrate 4, similarly to the second LED chips 9, and white light of a second color temperature T2 is radiated from the second light-emitting surface 15a.

In this way, the drive unit 29 is composed so as to be able to independently control the first drive current supplied to the first LED chips 8 of the light-emitting apparatus 1 which is connected to the drive unit 29, and the second drive current which is supplied to the second LED chips 9. When alternately switching between an on state of the transistors Q1 and Q4 and an on state of the transistors Q2 and Q3, if one on period is made long and the other on period is made short, then the LED chips having the shorter on period receive insufficient drive current and cease to emit light.

Consequently, for example, if the on period of the transistors Q2 and Q3 is made short and a second drive current of a size capable of causing the second LED chips 9 to emit light ceases to be supplied to the second LED chips 9, then only white light from the first fluorescent member 14 is radiated from the light-emitting apparatus 1. On the other hand, if the on period of the transistors Q1 and Q4 is made short and a first drive current of a size capable of causing the first LED chips 8 to emit light ceases to be supplied to the first LED chips 8, then only white light from the second fluorescent member 15 is radiated from the light-emitting apparatus 1. Furthermore, if the on time of the transistors Q1 and Q4 and the on time of the transistors Q2 and Q3 is adjusted, and first and second drive currents of a size capable of respectively causing the first LED chips 8 and the second LED chips 9 to emit light are supplied respectively to the first LED chips 8 and the second LED chips 9, then combined light consisting of white light radiated from the first fluorescent member 14 and white light radiated from the second fluorescent member 15 is radiated from the light-emitting apparatus 1.

Figure 11:
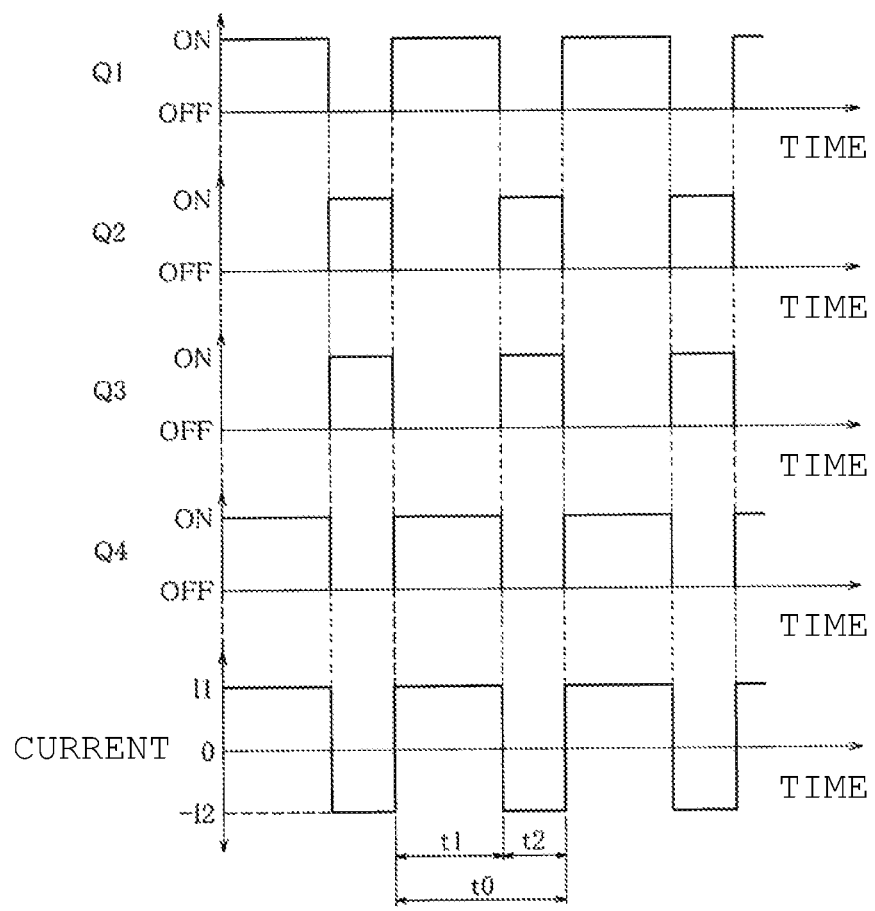
FIG. 11 is a time chart showing one example of operating states of respective transistors and drive currents of respective LED chips in the circuit composition in FIG. 10.

FIG. 11 is a time chart showing one example of the operating states of the transistors Q1 to Q4 and the drive currents of the LED chips, as described above. In FIG. 11, the current flowing in the four first LED chips 8 and the current flowing in the four second LED chips 9 of the light-emitting apparatus 1 are respectively indicated by using the current passing through the resistance Rs, and therefore the total current I1 flowing in the first LED chips 8 is indicated as a positive value and the total current I2 flowing in the second LED chip 9 is indicated as a negative value, I2.

As shown in FIG. 11, when the transistors Q1 and Q4 are both on, the total current I1 flows in the four first LED chips 8 in the light-emitting apparatus 1, and the first LED chips 8 each emit near-ultraviolet light. On the other hand, when the transistors Q2 and Q3 are both on, the total current I2 flows in the four second LED chips 9 in the light-emitting apparatus 1, and the second LED chips 9 each emit near-ultraviolet light. This switching of the on state of the transistors is carried out at a period t0 (for example, 20 ms) whereby flickering of the combined light from the light-emitting apparatus 1 is not perceptible as a result of the switching of light emission by the respective LED chips, and in the example shown in FIG. 11, the on period t1 of the transistors Q1 and Q4 is set to be longer than the on period t2 of the transistors Q2 and Q3 (for example, t1=14 ms and t2=6 ms).

When switching alternately between an on state of the transistors Q1 and Q4 and an on state of the transistors Q2 and Q3 in this way, the first drive current Id1 for each first LED chip 8 and the second drive current Id2 for each second LED chip 9 are expressed by Equations (1) and (2) below.

$$Id1 = (t1/t0) \cdot (I1/4) \quad (1)$$

$$Id2 = (t2/t0) \cdot (I2/4) \quad (2)$$

Therefore, the ratio Id1/Id2 between the first drive current Id1 and the second drive current Id2 changes in accordance with change in the ratio t1/t2 between the on time t1 of the transistors Q1 and Q4 and the on time t2 of the transistors Q2 and Q3, while the sum of the first drive current Id1 and the second drive current Id2 in the first time period t0 is uniform. Therefore, by changing the on time t1 and t2 while keeping the period t0 uniform, the ratio between the intensity of the white light radiated from the first light-emitting surface 14a and the intensity of the white light radiated from the second light-emitting surface 15a changes.

For example, by reducing the on time t2 while increasing the on time t1, then if only the first LED chips 8 emit light and the second LED chips 9 do not emit light, the illuminating light of the lighting apparatus 28 will be white light at the first color temperature T1 radiated from the first light-emitting surface 14a. On the other hand, by reducing the on time t1 while increasing the on time t2, then if only the second LED chips 9 emit light and the first LED chips 8 do not emit light, the illuminating light of the lighting apparatus 28 will be white light at the second color temperature T2 radiated from the second light-emitting surface 15a. Furthermore, if the on time t1 and the on time t2 are adjusted and the first LED chips 8 and the second LED chips 9 each emit light respectively, then the white light of the first color temperature T1 radiated from the first light-emitting surface 14a and the white light of the second color temperature T2 radiated from the second light-emitting surface 15a are combined, and the illuminating light of the lighting apparatus 28 will be white light of a color temperature between the first color temperature T1 and the second color temperature T2.

Consequently, by adjusting the on time t1 and the on time t2, it is possible to obtain, as the illuminating light of the lighting apparatus 28, white light of which color temperature can be changed between the first color temperature T1 and the second color temperature T2. In this case, since the light distributing lens 3 is provided in the light-emitting apparatus 1 as stated previously, then the white light of the first color temperature T1 which is radiated from the first light-emitting surface 14a and the white light of a second color temperature T2 which is radiated from the second light-emitting surface 15a are mixed well, and excellent white light in which the two types of white light are not liable to become separated can be obtained as the illuminating light of the lighting apparatus 28. The on time t1 and the on time t2 can be adjusted by using an operating member, or the like, which is provided in the drive unit 29, for example, or can be adjusted automatically in accordance with the ambient environment or a predetermined pattern, or the like.

Furthermore, as described previously, in the present practical example, since the first LED 26 is constituted by the first LED chips 8 and the first fluorescent member 14, and the second LED 27 is constituted by the second LED chips 9 and the second fluorescent member 15, then it is possible to obtain combined light having excellent color rendition as the illuminating light, compared to a case where light emitted from a LED chip is used directly as primary light. Moreover, by using the first LED chips 8 and the second LED chips 9, it is possible to keep the power consumption low, compared to a case where an incandescent lamp, or the like, is used.

First Modification

In the first practical example, the light distributing lens 3 is fixed to and supported by the substrate 4 by using an abutting section 3a which is provided in a small diameter-side end section of the light distributing lens 3. However, the method of installing the light distributing lens 3 on the light-emitting unit 2 is not limited to this, and various methods can be used. Therefore, one example thereof is described below as a first modification.

Figure 12:
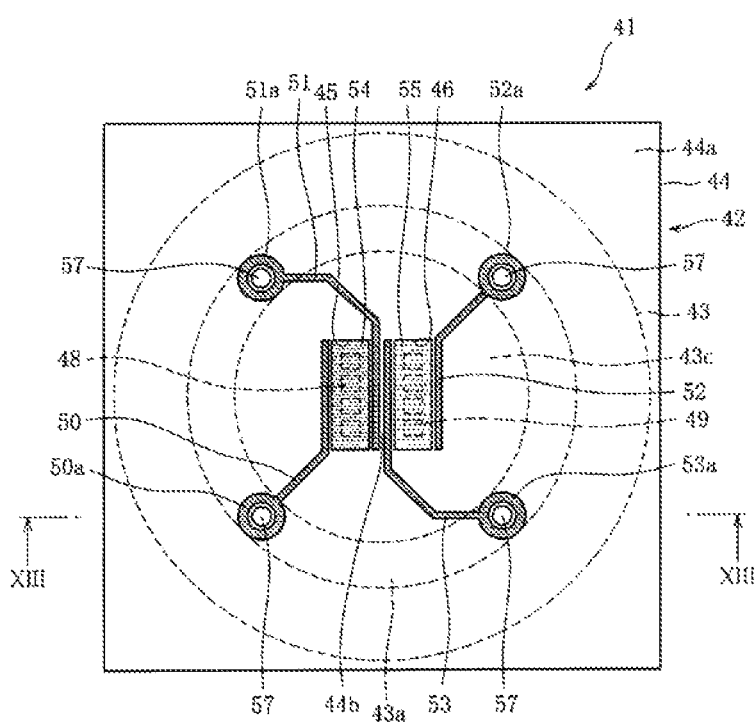
FIG. 12 is a schematic plan diagram of a light-emitting apparatus relating to a first modification of the first practical example.

FIG. 12 is a schematic plan diagram of a light-emitting apparatus 41 relating to the present modification. As shown in FIG. 12, similarly to the first practical example, the light-emitting apparatus 41 includes: a light-emitting unit 42 which corresponds to a light-emitting source of the present invention; and a light distributing lens 43 formed in a truncated conical shape using glass or resin having translucent properties, or the like, which is used in combination with this light-emitting unit 42. In FIG. 12, for the sake of convenience, the light distributing lens 43 is depicted by dotted lines.

The light distributing lens 43 is different from the light distributing lens 3 of the first practical example in terms of the composition for installation of the light-emitting unit 42, but the composition and function apart from this is substantially the same as the light distributing lens 3. Furthermore, in the light-emitting apparatus 42 also, the composition for installation of the light distributing lens 43 is different from the light-emitting unit 2 according to the first practical example, but the composition and function apart from this is substantially the same as the light-emitting unit 2. Consequently, the following description centers on the composition of the light-emitting unit 42 and the light distributing lens 43 for installing the light distributing lens 43 in the light-emitting unit 42, and functions which are the same as the functions of the light-emitting unit 2 and the light distributing lens 3 according to the first practical example are not described here.

As shown in FIG. 12, the light-emitting unit 42 includes a substrate 44 made of an alumina type ceramic having excellent electrical insulating properties and good heat radiating properties. Similarly to the substrate 4 of the first practical example, a first depression 45 and a second depression 46 are formed in a first surface 44a of the substrate 44. The light distributing lens 43 does not have the abutting section 3a that the light distributing lens 3 according to practical example 1 includes, and instead of this abutting section 3a, a flat section 43a is formed in a ring shape in the small diameter-side end section. As shown in FIG. 12, this flat section 43a surrounds the first depression 45 and the second depression 46 when observed in plan view with the lens 43 installed in the light-emitting unit 42.

(Overall Composition of Light-Emitting Unit)

As described above, apart from the structure for installing the light distributing lens 43, the light-emitting unit 42 is composed in substantially similar fashion to the light-emitting unit 2 in the first practical example. In other words, the first depression 45 and second depression 46 formed in the substrate 44 are formed in such a manner that the opening surface area and the opening shape on the first surface 44a of the substrate 44 are substantially the same, and are arranged alongside each other on either side of a partitioning wall 44b which is one portion of the substrate 44. In the present modification also, the opening shape of the first depression 45 and the second depression 46 is rectangular, but the opening shape is not limited to this and can be changed to various shapes. However, it is desirable that the first depression 45 and the second depression 46 should have substantially the same opening surface area and opening shape.

As shown in FIG. 12, four first LED chips 48 are arranged in one row along the partitioning wall 44b on a bottom surface of the first depression 45, and four second LED chips 49 are arranged in one row along the partitioning wall 44b on a bottom surface of the second depression 46. The first LED chips 48 and the second LED chips 49 are mounted on the substrate 44 similarly to the case of the first practical example, and are similar LED chips to the first LED chips 8 and the second LED chips 9 of the first practical example, and therefore detailed description thereof is not given here.

In the present modification also, similarly to the case of the first practical example, the number of the first LED chips 48 and the second LED chips 49 is just one example and can be increased or decreased according to requirements. Consequently, it is also possible to provide one first LED chip 48 and one second LED chip 49, and for the numbers of the respective chips to be different. Moreover, the material of the substrate 44 is not limited to an alumina type ceramic, and it is possible to use various materials, for example, a material selected from ceramic, resin, glass epoxy, or a composite resin which contains filler, or the like. Alternatively, in improving the light emission efficiency of the light-emitting apparatus 41 by raising the reflectivity of light at the first surface 44a of the substrate 44, it is desirable to use a silicone resin which includes white pigment, such as alumina powder, silica powder, magnesium oxide, titanium oxide, and the like. Moreover, it is also possible to improve heat radiating properties by using a metal substrate of any kind, such as a copper substrate or aluminum substrate. In this case, it is necessary to form a wiring pattern on the substrate via an electrical insulation.

In order to supply a drive current to the first LED chips 48 and the second LED chips 49, a first wiring pattern 50, a second wiring pattern 51, a third wiring pattern 52 and a fourth wiring pattern 53 made of metal having good electrical conductivity, such as copper foil, are respectively formed on the first surface 44a of the substrate 44. These wiring patterns are all provided in substantially similar fashion to the first practical example. However, as shown in FIG. 12, the external connection lands 50a, 51a, 52a and 53a provided in order to connect external wiring at the respective ends of the wiring patterns are arranged so as to be positioned directly below the flat section 43a of the light distributing lens 43 which is installed on the light-emitting unit 42.

As shown in FIG. 12, similarly to the case of the first practical example, a first fluorescent member (first wavelength conversion member) 54 composed similarly to the first fluorescent member 14 of the first practical example is filled into the first depression 45 so as to cover the first LED chips 48. Similarly, a second fluorescent member (second wavelength conversion member) 55 composed similarly to the second fluorescent member 15 of the first practical example is filled into the second depression 46 so as to cover the second LED chips 49. Therefore, light emission by the light-emitting unit 42 is carried out similarly to the light-emitting unit 2 according to the first practical example.

By means of a composition of this kind, the combination of the first LED chips 48 and the first fluorescent member 54 constitutes a first LED, as well as corresponding to a first light-emitting source which is one light-emitting source of the present invention. Furthermore, the combination of the second LED chips 49 and the second fluorescent member 55 constitutes a second LED, as well as corresponding to a second light-emitting source which is another light-emitting source of the present invention. In the present modification also, on the first surface 44a of the substrate 44, an upper surface of the first fluorescent member 54 which is exposed via the opening of the first depression 45 corresponds to a first light-emitting surface of the present invention, and an upper surface of the second fluorescent member 55 which is exposed via the opening of the second depression 46 corresponds to a second light-emitting surface of the present invention. Furthermore, the first depression 45 and the second depression 46 are separated by a partitioning wall 44b as described above, and therefore the partitioning wall 44b forms a dividing line between the first light-emitting surface and the second light-emitting surface of the present invention also in the present modification.

Figure 13:
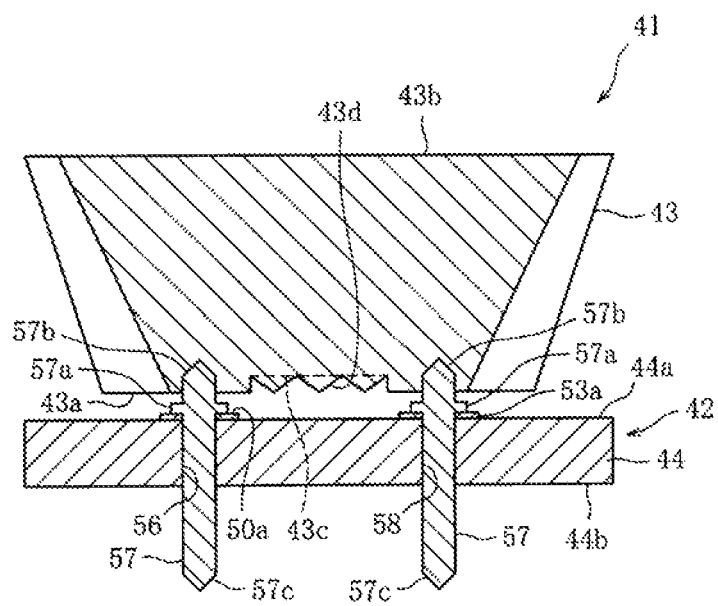
FIG. 13 is a cross-sectional diagram of the light-emitting apparatus along line XIII-XIII in FIG. 12.

Here, the structure for installing the light distributing lens 43 in the light-emitting unit 42 will be described on the basis of FIG. 13. FIG. 13 is a cross-sectional diagram of the light-emitting apparatus 41 along line XIII-XIII in FIG. 12. As shown in FIG. 13, a through hole 56 passing through the substrate 44 is formed in the portion of the external connection land 50a of the first wiring pattern 50. A metal pin member (metal terminal member) 57 is inserted into this through hole 56 from the first surface 44a side of the substrate 44.

A round disk-shaped flange section 57a is formed in this pin member 57, on the side of the portion which protrudes from the first surface 44a of the substrate 44. The pin member 57 is inserted into the through hole 56 from the side of the first surface 44a, and is then pressure fitted into the through hole 56 until the flange section 57a abuts against the external connection land 50a. Consequently, the amount of protrusion of the pin member 57 from the first surface 44a and the amount of protrusion from a second surface 44b, which is the rear side of the first surface 44a, are delimited.

Furthermore, a taper section 57b is formed in the end section of the pin member 57 on the first surface 44a side, and a taper section 57c is also formed on the end section on the side of the second surface 44b. In the pin member 57, the shape of the flange section 57a is not limited to being a round shape, and may also be a polygonal shape, such as a quadrilateral shape or hexagonal shape, or an elliptical shape. Furthermore, the shape of either end section is not limited to the shape shown in FIG. 13, and may adopt various shapes, and furthermore, does not have to be formed with a tapered shape.

When the pin member 57 has been inserted into the through hole 56, the flange section 57a abuts against the external connection land 50a, as described above, and the pin member 57 is fixed to the substrate 44 in an electrically connected state with the external connection land 50a. In order to make the electrical connection of this kind secure, desirably, the flange section 57a is fixed to the external connection land 50a by soldering, calking, fusing, welding, pressure fitting, or the like.

As shown in FIG. 13, a similar through hole 58 is also formed in the external connection land 53a, and a pin member 57 is similarly inserted through this hole and fixed to the substrate 44. Furthermore, although not shown in FIG. 13, pin members 57 are also inserted through the external connection lands 51a and 52a and fixed to the substrate 44, similarly to the external connection lands 50a and 53a, as shown in FIG. 12. As described above, the amount of protrusion of each pin member 57 from the first surface 44a of the substrate 44 is delimited by the respective flange section 57a, and is substantially the same.

On the other hand, the amount of protrusion of each pin member 57 from the second surface 44b of the substrate 44 is also substantially the same, in a similar fashion, and therefore when applying the light-emitting apparatus 41 as a light source of a lighting apparatus, for example, it is possible to readily achieve connections with the wiring on the lighting apparatus side by providing receiving members, such as connectors, on the lighting apparatus side, to receive the four pin members 57. If the interval between two pin members 57 which are mutually adjacent, of the four pin members 57, is set to a multiple of 2.54 mm, which is a standard dimension used in the design of general wiring substrates, then it is possible to ensure good compatibility with receiving members of this kind.

Furthermore, it is also possible to connect external wires directly to the respective pin members 57 which protrude from the second surface 44b of the substrate 44, and in this case, it is not necessary to raise the intensity of the wiring pattern provided in the substrate 44, and problems such as deterioration or detachment of the wiring patterns due to temporal change can be prevented, compared to a case where external wires are connected directly to wiring patterns, such as the external connection lands. Any one of the four pin members 57 may have a different length protruding from the second surface 44b of the substrate 44, compared to the other three pin members. In so doing, it is possible to easily recognize the installation direction of the light-emitting unit 41 in the lighting apparatus, or the like.

(Light Distributing Lens)

The light distributing lens 43 differs from the light distributing lens 3 of the first practical example only in terms of the composition for installation on the light-emitting unit 42, as described above, and instead of the abutting section 3a which is included in the light distributing lens 3 of the first practical example, a flat section 43a is formed in a ring shape in the small diameter-side end section of the lens. Furthermore, the composition and function of the light distributing lens 43 apart from this are substantially the same as the light distributing lens 3.

As stated previously, the external connection lands 50a, 51a, 52a and 53a formed on the substrate 44 are positioned directly below the flat section 43a of the light distributing lens 43 installed in the light-emitting unit 42, as shown in FIG. 12. In other words, the four pin members 57 installed on the substrate 44 are arranged along the flat section 43a. Fitting holes are formed in the flat section 43a at positions corresponding to the four pin members 57 and by fitting the respective pin members 57 protruding from the first surface 44a of the substrate 44 into these fitting holes, the light distributing lens 43b is installed on the light-emitting unit 42. In this case, the light distributing lens 43 may be fixed by pressure fitting of the pin members 57 into the fitting holes, or may be fixed by bonding using an adhesive, or melt fusion, etc.

As described above, the amount of protrusion of the pin members 57 from the first surface 44a of the substrate 44 is delimited by the respective flange sections 57a and hence is substantially the same, and therefore by fixing the light distributing lens 43 via the projecting sections 57 in this way, it is possible to install the light distributing lens 43 in the light-emitting unit 42 readily and with high accuracy.

By installing the light distributing lens 43 in the light-emitting unit 42 in this way, the light-entering surface 43c of the light distributing lens 43 faces the first light-emitting surface and the second light-emitting surface of the light-emitting unit 42 in a similar fashion to the first practical example. A plurality of V-shaped grooves 43d having a V-shaped cross-section are provided on the light-entering surface 43c of the light distributing lens 43 so as to extend in the direction of extension of the partitioning wall 44b which separates the first depression 45 and the second depression 46, similarly to the light distributing lens 3 of the first practical example.

By forming V-shaped grooves 43d of this kind in the light-entering surface 43c of the light distributing lens 43, similarly to the first practical example, the primary light radiated respectively from the first and second light-emitting surfaces becomes more readily diffused in a direction perpendicular to the direction of extension of the V-shaped grooves 43d. As a result of this, similarly to the first practical example, the combined light radiated outwards from the light-exiting surface 43b of the light distributing lens 43 is excellent combined light in which the light of two types radiated respectively from the first and second light-emitting surfaces is not liable to become separated.

Furthermore, in this case, since the openings on the first surface 44a of the substrate 44 have substantially the same shape and surface area in the first depression 45 and the second depression 46, then shape deviation when mixing the primary light emitted respectively from the first light-emitting surface and the second light-emitting surface is prevented, and the primary light can be mixed more satisfactorily.

Moreover, in the present modification also, since a combination of first LED chips 48 and a first fluorescent member 54 is used, and a combination of second LED chips 49 and a second fluorescent member 55 is also used, then it is possible to obtain combined light having excellent color rendition, compared to a case where light emitted by an LED chip is used directly as primary light.

(Application to Lighting Apparatus)

As described above, the present modification differs from the first practical example only in terms of the structure for installing the light distributing lens 43 on the light-emitting unit 42. Therefore, when the light-emitting apparatus 41 according to the present modification is applied to a lighting apparatus, similarly to the first practical example, it is possible to achieve a lighting apparatus in which the color temperature of the illuminating light can be adjusted between the first color temperature T1 and the second color temperature T2, by using an electric circuit having the composition shown in FIG. 10.

Second Modification

In the first modification described above, the light distributing lens 43 is supported by four pin members 57 which are installed on the substrate 44, and external electrical connections are possible via the pin members 57 which protrude on the second surface 44b side of the substrate 44. However, there are also cases where the pin members 57 do not have to protrude on the second surface 44b side of the substrate 44, such as cases where external wiring is possible via the pin members 57 which project on the first surface 44a side of the substrate 44, or cases where external wiring is possible via separately provided external connection lands, and so on. Therefore, below, a second modification is described as a case where the pin members 57 do not protrude from the second surface 44b of the substrate 44 in the first modification which was described above.

Figure 14:
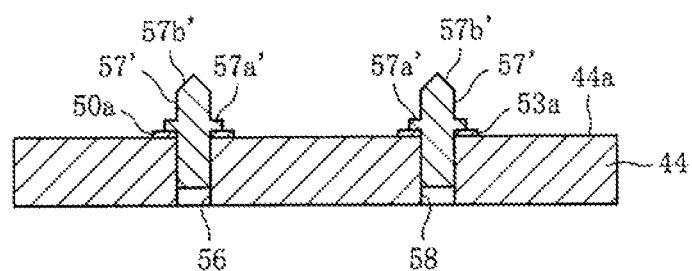
FIG. 14 is a cross-sectional diagram showing a light-emitting unit of a light-emitting apparatus relating to a second modification of the first practical example, in a cross-section similar to FIG. 13.

FIG. 14 is a cross-sectional diagram showing only the substrate 44 side of the light-emitting unit of the light-emitting apparatus relating to the present modification, in a cross-sectional view similar to FIG. 13. In the present modification, only the composition of the pin members 57' used in the light-emitting unit differs from the first modification and the composition apart from this is the same as the first modification. Therefore, in FIG. 14, members which are the same as the first modification are labeled with the same reference numerals, and only the composition relating to the pin members 57' is described here, other parts of the composition being omitted from the description.

As shown in FIG. 14, one pin member 57' is inserted into a through hole 56 from the first surface 44a side of the substrate 44, similarly to the pin member 57 according to the first modification. Instead of the through hole 56, it is also possible to provide a depression having a bottom, into which the pin member 57' can be fitted. A round disk-shaped flange section 57a' is formed in this pin member 57', on the side of the portion which protrudes from the first surface 44a of the substrate 44. The pin member 57' is inserted into the through hole 56 from the side of the first surface 44a, and is then pressure fitted into the through hole 56 until the flange section 57a' abuts against the external connection land 50a. Therefore, the amount of protrusion of the pin member 57' from the first surface 44a is delimited.

Furthermore, a taper section 57b' is formed on one end section of the pin member 57' which is on the first surface 44a side, and a taper section 57c' is also formed on the other end section on the opposite side. Similarly to the pin member 57 according to the first modification, in the pin member 57', the shape of the flange section 57a' is not limited to being a round shape, and may also be a polygonal shape, such as a quadrilateral shape or hexagonal shape, or an elliptical shape. Furthermore, the shape of either end section is not limited to the shape shown in FIG. 13, and may adopt various shapes, and furthermore, does not have to be formed with a tapered shape.

When the pin member 57' has been inserted into the through hole 56, the flange section 57a' abuts against the external connection land 50a, as described above, and the pin member 57' is fixed to the substrate 44 in an electrically connected state with the external connection land 50a. In order to make the electrical connection of this kind secure, desirably, the flange section 57a' is fixed to the external connection land 50a by soldering, calking, fusing, welding, pressure fitting, or the like, similarly to the pin member 57 of the first modification.

In this way, the pin member 57' has a structure which is similar to the pin member 57 of the first modification, but the length of the portion extending towards the second surface 44b of the substrate 44 from the flange section 57a' is different from the pin member 57. In other words, as shown in FIG. 14, the pin member 57' does not have a length to protrude from the second surface 44b of the substrate 44 and hence terminates inside the through hole 56.

As shown in FIG. 14, a pin member 57' of this kind is also inserted similarly into a through hole 58 formed in the external connection land 53a, and is fixed to the substrate 44. Furthermore, although not shown in FIG. 14, pin members 57' are also inserted through the external connection lands 51a and 52a and fixed to the substrate 44, similarly to the external connection lands 50a and 53a. As described above, the amount of protrusion of each pin member 57' from the first surface 44a of the substrate 44 is delimited by the respective flange section 57a', and is substantially the same.

Consequently, in the present modification also, similarly to the first modification, it is possible to readily position and fix the light distributing lens 43 to the substrate 44 via the four pin members 57'. In the present modification, since the pin members 57' do not protrude on the side of the second surface 44b of the substrate 44, then external wiring can be carried out via the pin members 57' which protrude on the first surface 44a side of the substrate 44, before installing the light distributing lens 43, for example.

Third Modification

The light distributing lens used in the light-emitting apparatus is not limited to the light distributing lens 3 of the first practical example or the light distributing lens 43 of the first modification, which have been described thus far. Therefore, one modification of the light distributing lens is described below with reference to FIG. 15 and FIG. 16, as a third modification. The members other than the light distributing lens are composed similarly to the first practical example, and are labeled with the same reference numerals as the first practical example, detailed description thereof being omitted here.

Figure 15:
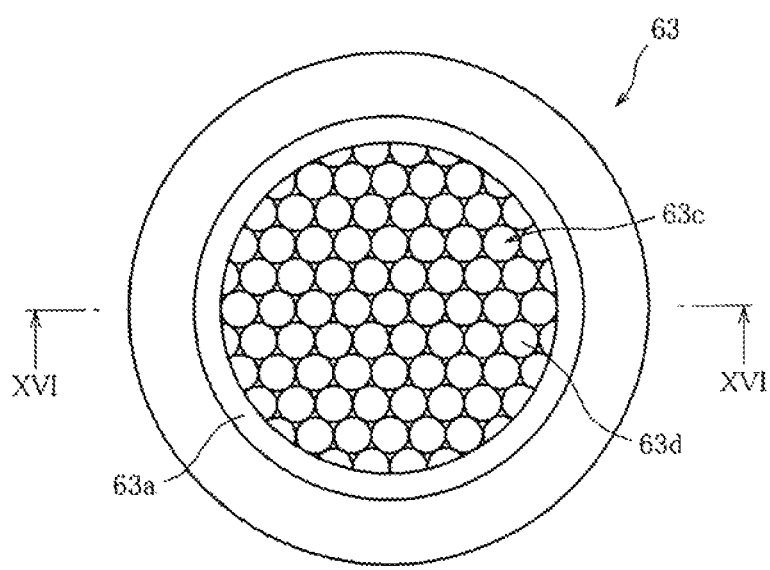
FIG. 15 is a plan diagram of a light distributing lens relating to a third modification of the first practical example, as observed from the side of the light-entering surface.
Figure 16:
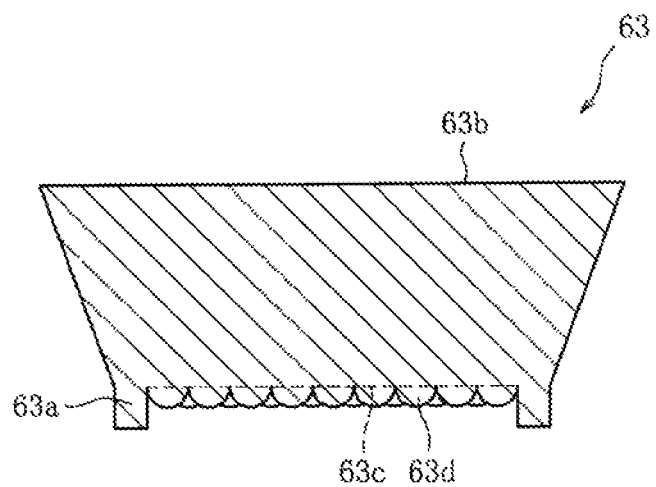
FIG. 16 is a cross-sectional diagram of the light distributing lens along line XVI-XVI in FIG. 15.

FIG. 15 is a plan diagram of the light distributing lens 63 relating to the present modification as observed from the side of the light-entering surface 63c, and FIG. 16 is a cross-sectional diagram of the light distributing lens 63 along line XVI-XVI in FIG. 15. The light distributing lens 63 according to the present modification differs from the light distributing lens 3 of the first practical example in terms of the composition of the light-entering surface 63c, but the composition apart from this is the same. In other words, as shown in FIG. 15 and FIG. 16, in the light distributing lens 63 according to the present modification, a plurality of hemispherical projections 63d are formed on the light-entering surface 63c, instead of the plurality of V-shaped grooves 3d provided on the light-entering surface 3c of the light distributing lens 3 according to the first practical example.

In the present modification, the number of the projections 63d provided on the light-entering surface 63c is not limited to the number shown in FIG. 15, and can be increased or decreased according to requirements. Furthermore, the size of each projection 63d can be increased or reduced according to requirements, and it is also possible to adopt projections 63d of a plurality of different sizes rather than having a uniform size. Moreover, in the present modification, a plurality of projections 63d are arranged densely on the light-entering surface 63c, but at least a portion of these projections 63d may be spaced apart.

In the present modification also, the light-entering surface 63c of the light distributing lens 63 is surrounded by an abutting section 63a which forms a ring-shaped wall provided in the perimeter edge section, and similarly to the first practical example, the light distributing lens 63 is fixed to the light-emitting unit 2 in a state where the abutting section 63a is abutted against the substrate 4 of the light-emitting unit 1. In this case, the light-entering surface 63c is in a state facing the first light-emitting surface 14a and the second light-emitting surface 15a of the light-emitting unit 1.

Therefore, when the light-emitting unit 2 respectively emits primary light from the first light-emitting surface 14a and the second light-emitting surface 15a, this primary light enters into the light distributing lens 63 while being dispersed by the plurality of projections 63d provided on the light-entering surface 63c. Due to this dispersion, the white light of two types having mutually different color temperatures which is respectively emitted from the first light-emitting surface 14a and the second light-emitting surface 15a is mixed well and radiated as combined light from the light-exiting surface 63b of the light distributing lens 63. As a result of this, in the present modification also, it is possible to satisfactorily prevent separation of light of two types having mutually different color temperatures, in the combined light which is radiated from the light distributing lens 63.

Fourth Modification

In the third modification described above, the projections 63d were formed in a hemispherical shape, but the shape of the projections is not limited to a hemispherical shape and it is possible to adopt various shapes. Therefore, one example of a light distributing lens provided with projections of a shape other than a hemispherical shape is described here as a fourth modification with reference to FIG. 17 and FIG. 18. The members other than the light distributing lens are composed similarly to the first practical example, and are labeled with the same reference numerals as the first practical example, detailed description thereof being omitted here.

Figure 17:
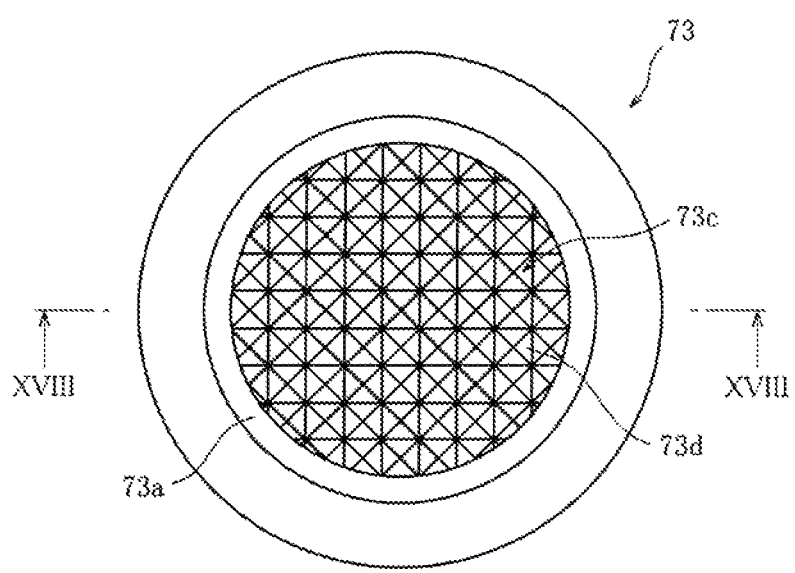
FIG. 17 is a plan diagram of a light distributing lens relating to a fourth modification of the first practical example, as observed from the side of the light-entering surface.
Figure 18:
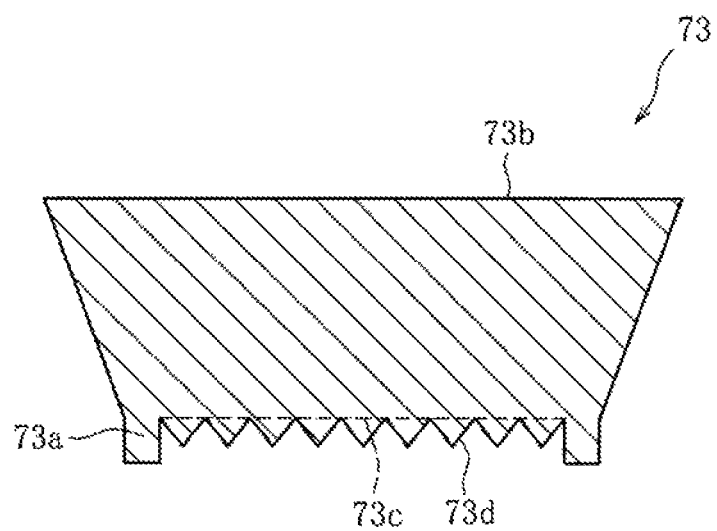
FIG. 18 is a cross-sectional diagram of the light distributing lens along line XVIII-XVIII in FIG. 17.

FIG. 17 is a plan diagram of the light distributing lens 73 relating to the present modification as observed from the side of the light-entering surface 73c, and FIG. 18 is a cross-sectional diagram of the light distributing lens 73 along line XVIII-XVIII in FIG. 17. The light distributing lens 73 according to the present modification differs from the light distributing lens 3 of the first practical example in terms of the composition of the light-entering surface 73c, but the composition apart from this is the same. In other words, as shown in FIG. 17 and FIG. 18, in the light distributing lens 73 according to the present modification, a plurality of square pyramid-shaped projections (pyramid-shaped projections) 73d are formed on the light-entering surface 73c, instead of the plurality of V-shaped grooves 3d provided on the light-entering surface 3c of the light distributing lens 3 according to the first practical example.

In the present modification, the number of the projections 73d provided on the light-entering surface 73c is not limited to the number shown in FIG. 17, and can be increased or decreased according to requirements. Furthermore, the size of each projection 73d can be increased or reduced according to requirements, and it is also possible to adopt projections 73d of a plurality of different sizes rather than having a uniform size. Moreover, in the present modification, a plurality of projections 73d are arranged densely on the light-entering surface 73c, but at least a portion of these projections 73d may be spaced apart.

In the present modification also, the light-entering surface 73c of the light distributing lens 73 is surrounded by an abutting section 73a which forms a ring-shaped wall provided in the perimeter edge section, and similarly to the first practical example, the light distributing lens 73 is fixed to the light-emitting unit 2 in a state where the abutting section 73a is abutted against the substrate 4 of the light-emitting unit 1. In this case, the light-entering surface 73c is in a state facing the first light-emitting surface 14a and the second light-emitting surface 15a of the light-emitting unit 1.

Therefore, when the light-emitting unit 2 respectively emits primary light from the first light-emitting surface 14a and the second light-emitting surface 15a, this primary light enters into the light distributing lens 73 while being dispersed by the plurality of projections 73d provided on the light-entering surface 73c. Due to this dispersion, the white light of two types having mutually different color temperatures which is respectively emitted from the first light-emitting surface 14a and the second light-emitting surface 15a is mixed well and radiated as combined light from the light-exiting surface 73b of the light distributing lens 73. As a result of this, in the present modification also, it is possible to satisfactorily prevent separation of light of two types having mutually different color temperatures, in the combined light which is radiated from the light distributing lens 73.

In the present modification, the projections 73d are formed in a square pyramid shape, but it is also possible to use various shapes other than a square pyramid shape, such as a conical shape, a triangular pyramid shape, a truncated pyramid shape, a truncated conical shape, and the like. Furthermore, it is also possible to mix projections of various shapes described thus far, rather than using the same shape for all of the projections. Moreover, as well as providing the V-shaped grooves such as those of the first practical example in a portion of the region of the light-entering surface 73c of the light distributing lens 73, it is also possible to form a plurality of projections in the remaining region.

Fifth Modification

In each of the first practical example and the first to fourth modifications, the depressions and projections are formed on the light-entering surface of the light distributing lens, but it is also possible to form depressions and projections on the light-exiting surface of the light distributing lens in addition. Therefore, one example of a light distributing lens provided with depressions and projections on the light-exiting surface also is described here as a fifth modification with reference to FIG. 19 and FIG. 20. The members other than the light distributing lens are composed similarly to the first practical example, and are labeled with the same reference numerals as the first practical example, detailed description thereof being omitted here.

Figure 19:
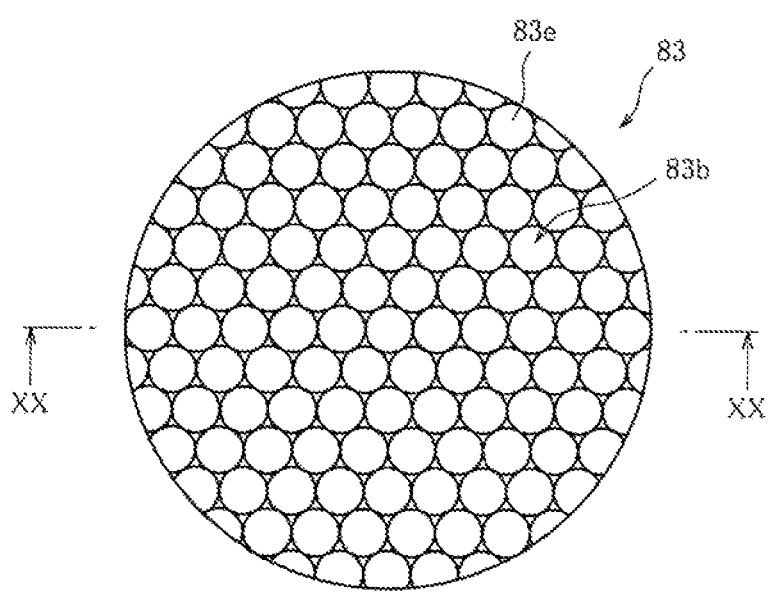
FIG. 19 is a plan diagram of a light distributing lens relating to a fifth modification of the first practical example, as observed from the side of the light-exiting surface.
Figure 20:
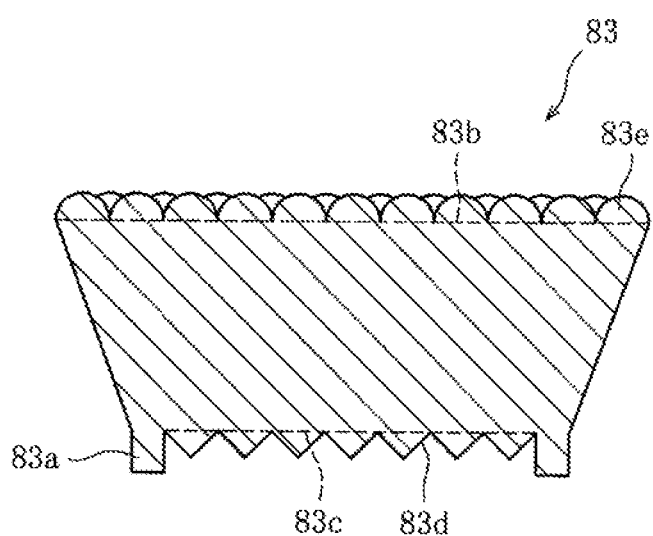
FIG. 20 is a cross-sectional diagram of the light distributing lens along line XX-XX in FIG. 19.

FIG. 19 is a plan diagram of the light distributing lens 83 relating to the present modification as observed from the side of the light-exiting surface 83b, and FIG. 20 is a cross-sectional diagram of the light distributing lens 83 along line XX-XX in FIG. 19. The light distributing lens 83 according to the present modification differs from the light distributing lens 3 of the first practical example in terms of the composition of the light-exiting surface 83b, but the composition apart from this is the same. In other words, as shown in FIG. 19 and FIG. 20, in the light distributing lens 83 according to the present modification, in contrast to the light distributing lens 3 of the first practical example, a plurality of hemispherical projections 83e are provided on the light-exiting surface 83b. Furthermore, similarly to the light distributing lens 3 of the first practical example, a plurality of V-shaped grooves 83d are also provided in the light-entering surface 83c.

In the present modification, the number of the projections 83e provided on the light-exiting surface 83b is not limited to the number shown in FIG. 19, and can be increased or decreased according to requirements. Furthermore, the size of each projection 83e can be increased or reduced according to requirements, and it is also possible to adopt projections 83e of a plurality of different sizes rather than having a uniform size. Moreover, in the present modification, a plurality of projections 83e are arranged densely on the light-exiting surface 83b, but at least a portion of these projections 83e may be spaced apart.

In the present modification also, the light-entering surface 83c of the light distributing lens 83 is surrounded by an abutting section 83a which forms a ring-shaped wall provided in the perimeter edge section, and similarly to the first practical example, the light distributing lens 83 is fixed to the light-emitting unit 2 in a state where the abutting section 83a is abutted against the substrate 4 of the light-emitting unit 1. In this case, the light-entering surface 83c is in a state facing the first light-emitting surface 14a and the second light-emitting surface 15a of the light-emitting unit 1.

Therefore, when the light-emitting unit 2 respectively emits primary light from the first light-emitting surface 14a and the second light-emitting surface 15a, this primary light enters into the light distributing lens 83 while being dispersed by the plurality of V-shaped grooves 83d provided on the light-entering surface 83c. Due to this dispersion, the white light of two types having mutually different color temperatures which is respectively emitted from the first light-emitting surface 14a and the second light-emitting surface 15a is mixed well and radiated from the light-exiting surface 83b of the light distributing lens 83. In this case, the white light is further mixed by the projections 83e formed on the light-exiting surface 83b. As a result of this, in the present modification, in combination with the mixing performed by the light-entering surface 83c, it is possible to even more satisfactorily prevent separation of light of two types having mutually different color temperatures, in the combined light which is radiated from the light distributing lens 83.

The light distributing lens 83 having hemispherical projections 83e on the light-exiting surface 83b is called a fly-eye lens which has a convex lens function, and is capable of condensing the white light of two types having mutually different color temperatures which is emitted respectively from the first light-emitting surface 14a and the second light-emitting surface 15a.

Sixth Modification

In the fifth modification described above, the projections 83e provided on the light-exiting surface 83b were formed in a hemispherical shape, but the shape of the projections provided on the light-exiting surface is not limited to a hemispherical shape and may adopt various shapes. Therefore, one example of a light distributing lens in which projections of a shape other than a hemispherical shape are provided on the light-exiting surface is described here as a sixth modification with reference to FIG. 21 and FIG. 22. The members other than the light distributing lens are composed similarly to the first practical example, and are labeled with the same reference numerals as the first practical example, detailed description thereof being omitted here.

Figure 21:
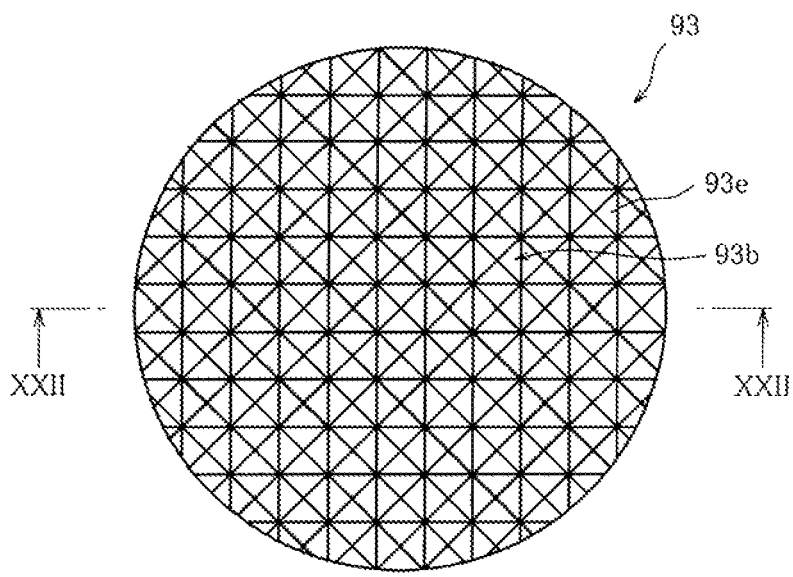
FIG. 21 is a plan diagram of a light distributing lens relating to a sixth modification of the first practical example, as observed from the side of the light-exiting surface.
Figure 22:
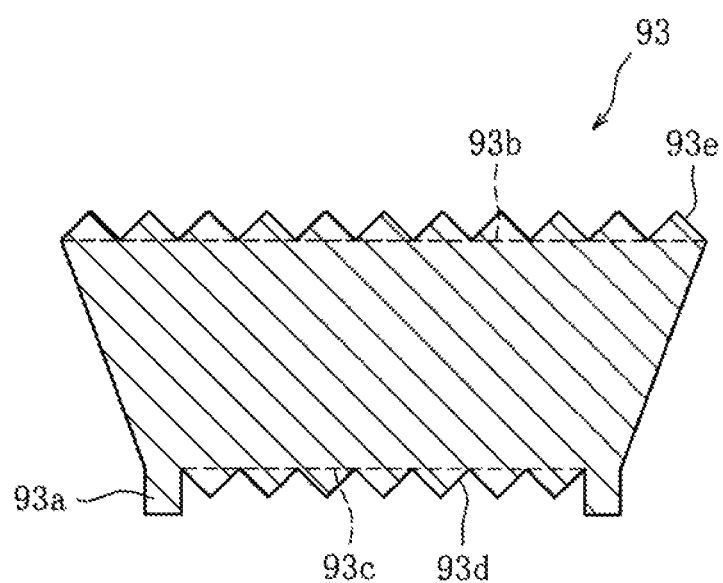
FIG. 22 is a cross-sectional diagram of the light distributing lens along line XXII-XXII in FIG. 21.

FIG. 21 is a plan diagram of the light distributing lens 93 relating to the present modification as observed from the side of the light-exiting surface 93b, and FIG. 22 is a cross-sectional diagram of the light distributing lens 93 along line XXII-XXII in FIG. 21. The light distributing lens 93 according to the present modification differs from the light distributing lens 3 of the first practical example in terms of the composition of the light-exiting surface 93b, but the composition apart from this is the same. In other words, as shown in FIG. 21 and FIG. 22, in the light distributing lens 93 according to the present modification, in contrast to the light distributing lens 3 of the first practical example, a plurality of square pyramid-shaped projections (pyramid-shaped projections) 93e are provided on the light-exiting surface 93b. Furthermore, similarly to the light distributing lens 3 of the first practical example, a plurality of V-shaped grooves 93d are also provided in the light-entering surface 93c.

In the present modification, the number of the projections 93e provided on the light-exiting surface 93b is not limited to the number shown in FIG. 21, and can be increased or decreased according to requirements. Furthermore, the size of each projection 93e can be increased or reduced according to requirements, and it is also possible to adopt projections 93e of a plurality of different sizes rather than having a uniform size. Moreover, in the present modification, a plurality of projections 93e are arranged densely on the light-exiting surface 93b, but at least a portion of these projections 93e may be spaced apart.

In the present modification also, the light-entering surface 93c of the light distributing lens 93 is surrounded by an abutting section 93a which forms a ring-shaped wall provided in the perimeter edge section, and similarly to the first practical example, the light distributing lens 93 is fixed to the light-emitting unit 2 in a state where the abutting section 93a is abutted against the substrate 4 of the light-emitting unit 1. In this case, the light-entering surface 93c is in a state facing the first light-emitting surface 14a and the second light-emitting surface 15a of the light-emitting unit 1.

Therefore, when the light-emitting unit 2 respectively emits primary light from the first light-emitting surface 14a and the second light-emitting surface 15a, this primary light enters into the light distributing lens 93 while being dispersed by the plurality of V-shaped grooves 93d provided on the light-entering surface 93c. Due to this dispersion, the white light of two types having mutually different color temperatures which is respectively emitted from the first light-emitting surface 14a and the second light-emitting surface 15a is mixed well and radiated from the light-exiting surface 93b of the light distributing lens 93. In this case, the white light is further mixed by the projections 93e formed on the light-exiting surface 93b. As a result of this, in the present modification also, in combination with the mixing performed by the light-entering surface 93c, it is possible to even more satisfactorily prevent separation of light of two types having mutually different color temperatures, in the combined light which is radiated from the light distributing lens 93.

In the present modification, the projections 93e provided on the light-exiting surface 93b are formed in a square pyramid shape, but it is also possible to use various shapes other than a square pyramid shape, such as a conical shape, a triangular pyramid shape, a truncated pyramid shape, a truncated conical shape, and the like. Furthermore, it is also possible to mix projections of the various shapes described thus far, rather than using the same shape for all of the projections. Moreover, in the present modification and the fifth modification described above, V-shaped grooves similar to the first practical example are provided in the light-entering surface 93c and the light distributing lens 93, but it is also possible to use projections such as those of the third and the fourth modifications instead of V-shaped grooves.

Seventh Modification

In the first practical example and the first to sixth modification examples described above, it is possible to increase the condensation of the light by forming the whole of the light-entering surface and the light-exiting surface as a convex shape (in other words, a convex lens shape), as well as providing a plurality of depressions and projections on the light-entering surface and the light-exiting surface of the light distributing lens. Therefore, a seventh modification is also described here as one example of a further condensing lens which is capable of performing satisfactory color mixing and condensing of the incident light.

Figure 23:
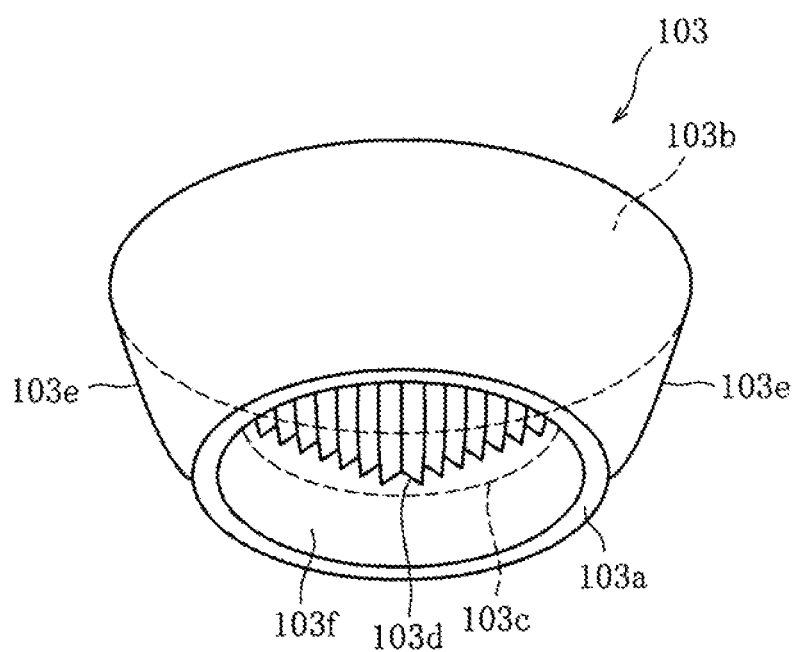
FIG. 23 is a perspective diagram of a light distributing lens relating to a seventh modification of the first practical example.
Figure 24:
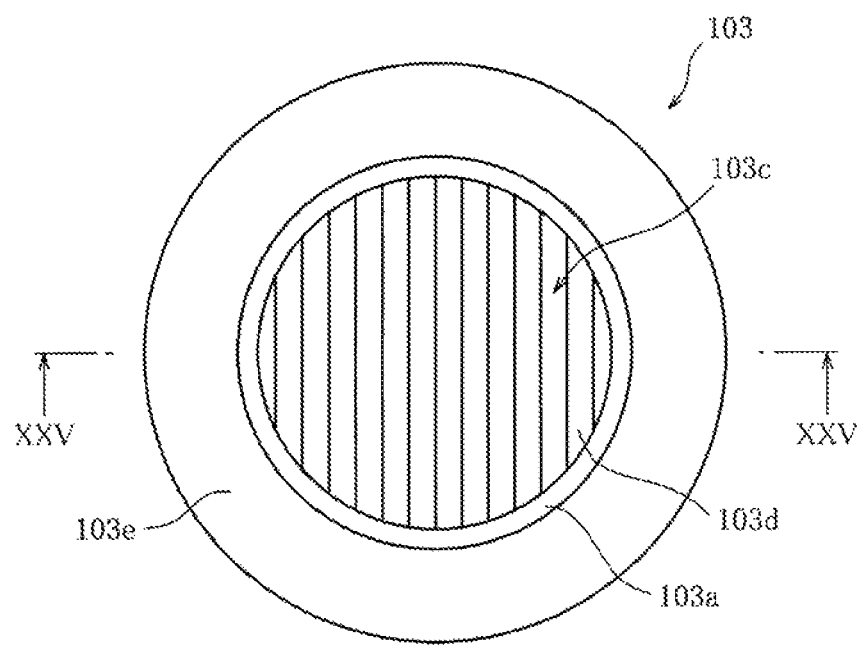
FIG. 24 is a plan diagram where the light distributing lens in FIG. 23 is observed from the side of the light-entering surface.
Figure 25:
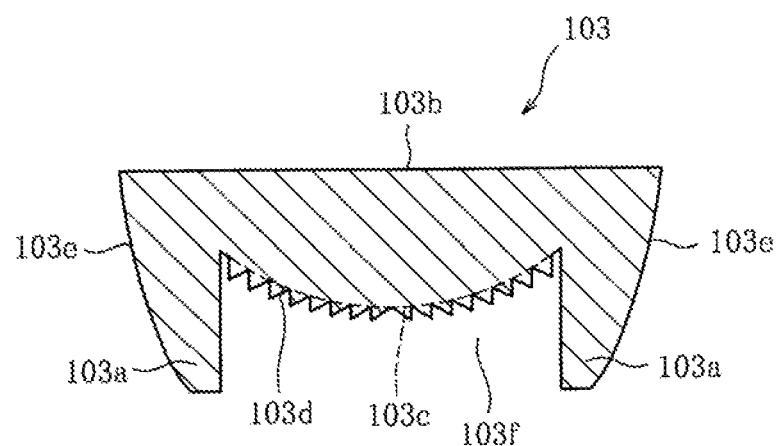
FIG. 25 is a cross-sectional diagram of the light distributing lens along line XXV-XXV in FIG. 24.
Figure 26A:
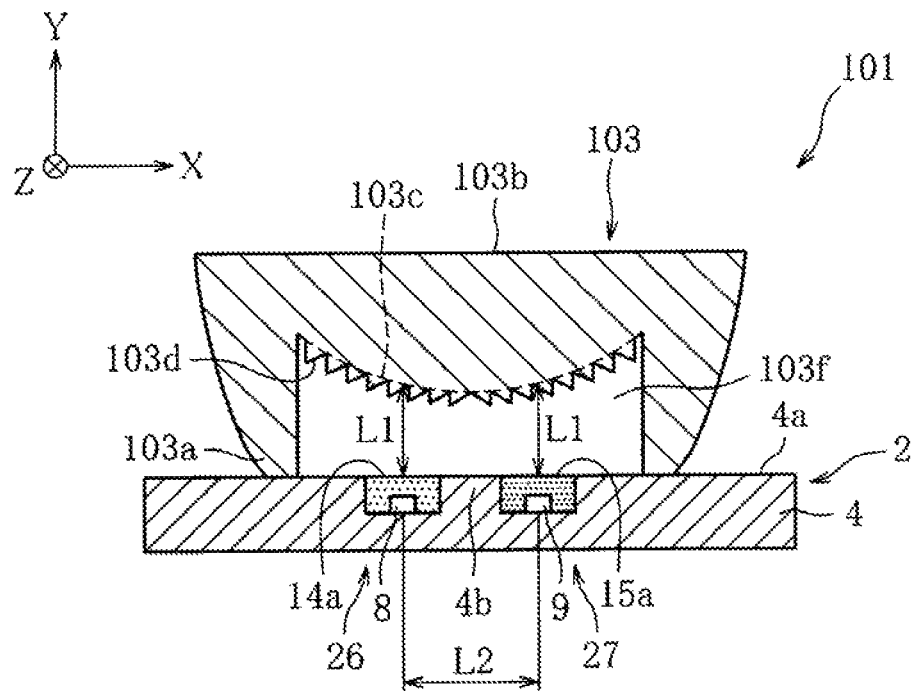
FIG. 26A is a cross-sectional diagram of a light-emitting apparatus using the light distributing lens relating to the seventh modification of the first practical example.

FIG. 23 is a perspective diagram of a light distributing lens 103 relating to a seventh modification of the first practical example. FIG. 24 is a plan diagram where the light distributing lens 103 in FIG. 23 is observed from the side of the light-entering surface. Furthermore, FIG. 25 is a cross-sectional diagram of a light distributing lens 103 along line XXV-XXV in FIG. 24. Moreover, FIG. 26A is a cross-sectional diagram of a light-emitting apparatus 101 which uses a light distributing lens 103 relating to a seventh modification of the first practical example. In FIG. 26A, the direction in which the second LEDs are arranged with respect to the first LED chips 8 is the X direction (and in particular, the direction from the first LED chip 8 towards the second LED chips is the +X direction), the thickness direction of the substrate is the Y direction (and in particular, the direction from the light-entering surface 103c towards the light-exiting surface 103b is the +Y direction), and the direction perpendicular to the X direction and the Y direction (in other words, the direction perpendicular to the plane of the drawings) is the Z direction (and in particular, the direction away from the reader is the +Z direction). Furthermore, in the present modification, only the light distributing lens is different from the first practical example, and the light-emitting unit is the same as the first practical example. Therefore, members relating to the light-emitting unit are labeled with the same reference numerals and detailed description thereof is omitted here.

The light distributing lens 103 is made from glass or a resin, or the like, having translucent properties, similarly to the first practical example described above. As shown in FIG. 23 and FIG. 25, a side surface 103e, which is an outer peripheral surface of the light distributing lens 103, forms an approximate surface of a paraboloid of revolution. Therefore, the light distributing lens 103 is a paraboloid of revolution. Furthermore, in the light distributing lens 103, an opening 103*f* is formed from the small diameter surface towards the interior of the lens, and an outer side portion of the opening 103*f* functions as an abutting section 103*a* for abutting against the substrate on which the LED chips are mounted. The large diameter-side end section of the light distributing lens 103 forms a light-exiting surface 103*b*, and the small diameter-side section forms a light-entering surface 103*c*. More specifically, in the light distributing lens 103, the light-exiting surface 103*b* has a larger diameter than the light-entering surface 103*c*.

As shown in FIG. 26A, the abutting section described above 103*a* abuts against a first surface 4*a* of the substrate 4 and also surrounds a first depression 5 and a second depression 6, when the light distributing lens 103 is installed in the light-emitting unit 2, similarly to the first practical example. Consequently, a light-entering surface 103*c* which is on the inner side of the abutting section 103*a* respectively faces the first light-emitting surface 14*a* and the second light-emitting surface 15*a*. Consequently, when light is radiated respectively from the first light-emitting surface 14*a* and the second light-emitting surface 15*a*, then this light enters respectively into the light distributing lens 103 from the light-entering surface 103*c*. This combined light is radiated towards the exterior of the light distributing lens 103 from the light-exiting surface 103*b* on the large diameter-side of the light distributing lens 103. Below, similarly to the first practical example, the light radiated from the light-exiting surface 103*b* is called combined light as described above, and the light radiated respectively from the first light-emitting surface 14*a* and the second light-emitting surface 15*a* is called primary light.

As shown in FIG. 25, the whole of the light-entering surface 103*c* of the light distributing lens 103 protrudes, and a convex lens shape is formed on the side of the light-entering surface 103*c*. By forming a convex lens shape of this kind, the light distributing lens 103 is able to satisfactorily condense the light radiated from the first light-emitting surface 14*a* and the second light-emitting surface 15*a*.

As shown in FIG. 23 to FIG. 25, a plurality of sawtooth-shaped grooves 103*d* having a sawtooth-shaped cross-section are provided extending in the same direction (the Z direction) in the light-entering surface 103*c* of the light distributing lens 103. By providing these sawtooth-shaped grooves 103*d*, the light-entering surface 103*c* of the light distributing lens 103 has depressions and projections formed therein due to an alternating arrangement of valleys and ridges each having a sawtooth-shaped cross-section. The sawtooth-shaped grooves 103*d* can also be called sawtooth-shaped projections.

Furthermore, the sawtooth-shaped grooves 103*d* are provided extending in the direction of extension of the partitioning wall 4*b* which separates the first depression 5 and the second depression 6, similarly to the first practical example. Here, the first light-emitting surface 14*a* which is the upper surface of the first fluorescent member 14 is formed by the opening of the first depression 5 on the first surface 4*a* of the substrate 4, and the second light-emitting surface 15*a* which is the upper surface of the second fluorescent member 15 is formed by the opening of the second depression 6 on the first surface 4*a* of the substrate 4. Similarly to the first practical example, the partitioning wall 4*b* which separates the first depression 5 and the second depression 6 forms a dividing line between the first light-emitting surface and the second light-emitting surface of the present invention, and therefore the respective sawtooth-shaped grooves 103*d* are provided so as to extend in parallel with the dividing line between the first light-emitting surface 14*a* and the second light-emitting surface 15*a*.

As shown in FIG. 23, FIG. 25 and FIG. 26A, the sawtooth shape on the light-entering surface 103*c* is formed to have a left/right cross-section which is reversed about a plane extending in the Y direction and passing through the center of the partitioning wall 4*b* forming the dividing line, in other words, the sawtooth shape is formed so as to have left/right symmetry. Consequently, in the sawtooth-shaped grooves 103*d* positioned to the first light-emitting surface 14*a* side of the central line of the light-entering surface 103*c* which is parallel to the dividing line (in other words, on the −X side of the dividing line), the side surfaces on the +X side are formed perpendicularly with respect to the first surface 4*a* of the substrate 4, and the side surfaces on the −X side are inclined with respect to the first surface 4*a* of the substrate 4. On the other hand, in the sawtooth-shaped grooves 103*d* positioned to the second light-emitting surface 15*a* side of the central line of the light-entering surface 103*c* which is parallel to the dividing line (in other words, on the +X side of the dividing line), the side surfaces on the −X side are formed perpendicularly with respect to the first surface 4*a* of the substrate 4, and the side surfaces on the +X side are inclined with respect to the first surface 4*a* of the substrate 4. In the portion above the dividing line (+Y direction), the sawtooth-shaped grooves 103*d* on either side of the central line of the light distributing lens 103 which follows the dividing line are formed in such a manner that the perpendicular side surfaces described above meet each other and become unified.

Due to this sawtooth shape on the light-entering surface 103*c*, in the portion where the sawtooth-shaped grooves 103*d* positioned to the −X side of the dividing line are formed, primary light radiated from the first light-emitting surface 14*a* is refracted in the −X direction at the side surfaces which are inclined with respect to the first surface 4*a*, and then enters into the light distributing lens 103. On the other hand, primary light radiated from the second light-emitting surface 15*a* is hardly refracted at all at the side surfaces which are inclined with respect to the first surface 4*a* and enters linearly into the light distributing lens 103 and is then reflected by the side surfaces which are perpendicular to the first surface 4*a* so as to advance in the +X direction. Consequently, in the portion where the sawtooth-shaped grooves 103*d* positioned to the −X side of the dividing line are formed, the primary light entering from the first light-emitting surface 14*a* and the primary light entering from the second light-emitting surface 15*a* is diffused, and hence this primary light can be mixed well.

Meanwhile, in the portion where the sawtooth-shaped grooves 103*d* positioned to the +X side of the dividing line are formed, primary light radiated from the second light-emitting surface 15*a* is refracted in the +X direction at the side surfaces which are inclined with respect to the first surface 4*a*, and then enters into the light distributing lens 103. On the other hand, primary light radiated from the first light-emitting surface 14*a* is hardly refracted at all at the side surfaces which are inclined with respect to the first surface 4*a* and enters linearly into the light distributing lens 103 and is then reflected by the side surfaces which are perpendicular to the first surface 4*a* so as to advance in the −X direction. Consequently, in the portion where the sawtooth-shaped grooves 103*d* positioned to the +X side of the dividing line are formed, similarly, the primary light entering from the first light-emitting surface 14*a* and the primary light entering from the second light-emitting surface 15*a* is diffused, and hence this primary light can be mixed well.

Therefore, in the light distributing lens 103 according to this modification, primary light radiated from the first light-emitting surface 14a and the second light-emitting surface 15a is mixed well by the sawtooth-shaped grooves 103d, and the light radiated from the first light-emitting surface 14a and the second light-emitting surface 15a is condensed well due to the convex lens shape of the light-entering surface 103c.

Figure 26B:
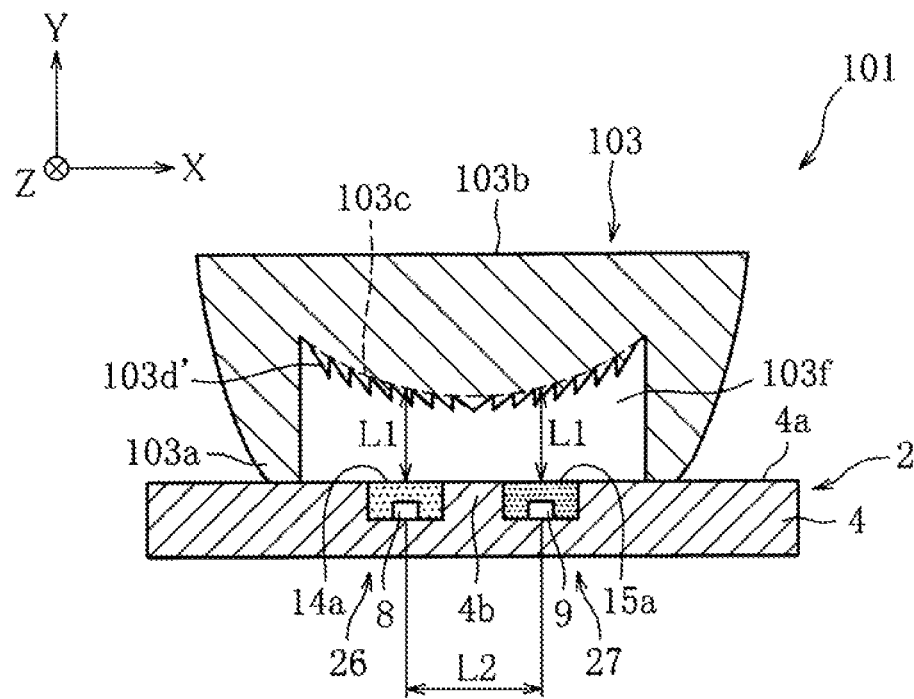
FIG. 26B is a cross-sectional diagram of a light-emitting apparatus using a further light distributing lens relating to the seventh modification of the first practical example.

In the seventh modification described above, the sawtooth-shaped grooves 103d which are positioned on the first light-emitting surface 14a side are formed in such a manner that the side surfaces on the +X side thereof are perpendicular with respect to the first surface 4a and the side surfaces on the −X side are inclined with respect to the first surface 4a of the substrate 4, and the sawtooth-shaped grooves 103d positioned on the side of the second light-emitting surface 15a are formed in such a manner that the side surfaces on the −X side are perpendicular with respect to the first surface 4a of the substrate 4 and the side surfaces on the +X side are inclined with respect to the first surface 4a of the substrate 4, but the sawtooth-shaped grooves 103d are not limited to this form, and it is also possible to form sawtooth-shaped grooves 103d such as those shown in FIG. 26B, for example.

More specifically, as shown in FIG. 26B, the sawtooth shape on the light-entering surface 103c is formed to have a left/right cross-section which is reversed about a plane extending in the Y direction and passing through the center of the partitioning wall 4b forming the dividing line, in other words, the sawtooth shape is formed so as to have left/right symmetry. Therefore, in the sawtooth-shaped grooves 103d positioned to the first light-emitting surface 14a side of the central line of the light-entering surface 103c which is parallel to the dividing line (in other words, on the −X side of the dividing line), the side surfaces on the −X side are formed perpendicularly with respect to the first surface 4a of the substrate 4, and the side surfaces on the +X side are inclined with respect to the first surface 4a of the substrate 4. On the other hand, in the sawtooth-shaped grooves 103d positioned to the second light-emitting surface 15a side of the central line of the light-entering surface 103c which is parallel to the dividing line (in other words, on the +X side of the dividing line), the side surfaces on the +X side are formed perpendicularly with respect to the first surface 4a of the substrate 4, and the side surfaces on the −X side are inclined with respect to the first surface 4a of the substrate 4.

In this way, even if the direction of inclination of the sawtooth-shaped grooves is reversed with respect to FIG. 26A, it is possible to obtain similar beneficial effects to the light distributing lens 103 shown in FIG. 26A. The direction of inclination of the sawtooth-shaped grooves of this kind should be selected appropriately on the basis of the relationship between the distances between the two light sources (the distances between the first LED 26 and the second LED 27) and the distance from the light-emitting sources to the light distributing lens 103.

Furthermore, in order that the primary light radiated from the first light-emitting surface 14a and the second light-emitting surface 15a is well mixed, the distance in the Y direction from the light-entering surface 103c of the light distributing lens 103 to the light-emitting sources (in other words, the first LED 26 and the second LED 27) (the distance L1 in FIGS. 26A and 26B) is desirably no less than 0.5 times and no more than 2 times the focal distance of the light distributing lens 103. More desirably, the distance L1 from the light-entering surface 103c of the light distributing lens 103 to the light-emitting sources is set to be no less than 0.5 times and no more than 1.5 times the focal distance of the light distributing lens 103. Even more desirably, the distance L1 from the light-entering surface 103c of the light distributing lens 103 to the light-emitting sources is set so as to be substantially equal to approximately one times the focal distance of the light distributing lens 103, in other words, the distance L1 from the light-entering surface 103c of the light distributing lens 103 to the light-emitting sources and the focal distance of the light distributing lens 103.

Moreover, in order that the primary light radiated from the first light-emitting surface 14a and the second light-emitting surface 15a is well mixed, the distance L1 from the light-entering surface 103c of the light distributing lens 103 to the light-emitting sources (in other words, the first LED 26 and the second LED 27) is desirably no less than 0.5 times and no more than 2 times the distance between the two light-emitting sources (the distance L2 in FIGS. 26A and 26B). More desirably, the distance L1 from the light-entering surface 103c of the light distributing lens 103 to the light-emitting sources is set to be no less than 0.5 times and no more than 1.5 times the distance between the two light-emitting sources. Even more desirably, the distance L1 from the light-entering surface 103c of the light distributing lens 103 to the light-emitting sources is set so as to be substantially equal to approximately one times the distance L2 between the two light-emitting sources, in other words, the distance L1 from the light-entering surface 103c of the light distributing lens 103 to the light-emitting sources and the distance L2 between the two light-emitting sources.

Eighth Modification

In the seventh modification described above, a plurality of sawtooth-shaped grooves 103d are formed following the dividing line in the light-entering surface 103c, but the depressions and projections provided on the light-entering surface 103c are not limited to a shape of this kind and it is possible to adopt various shapes. Therefore, one example of a light distributing lens in which sawtooth-shaped grooves formed in left/right symmetry about the dividing line are provided on the light-entering surface is described here with reference to FIG. 27 as an eighth modification. Since the composition apart from the shape of the depressions and projections provided on the light-entering surface is the same as the seventh modification, then portions apart from the shape of depressions and projections are labeled with the same reference numerals as the seventh modification and detailed description thereof is omitted here.

Figure 27:
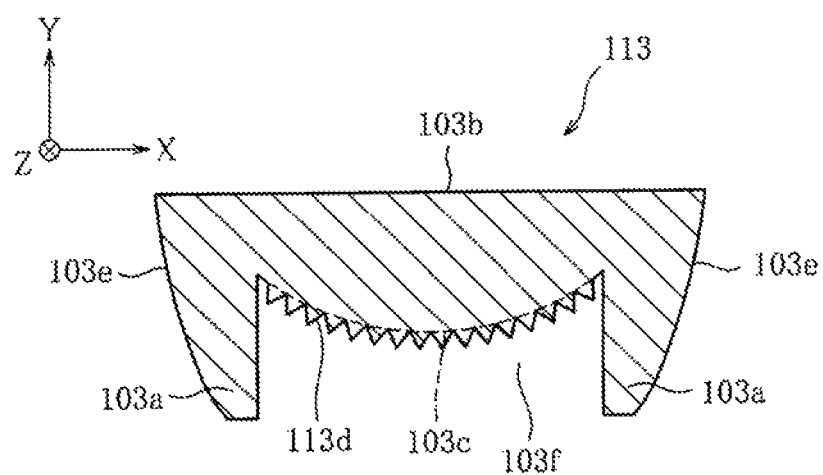
FIG. 27 is a cross-sectional diagram similar to FIG. 25, showing a light distributing lens relating to an eighth modification of the first practical example.

FIG. 27 is a cross-sectional diagram similar to FIG. 25, showing a light distributing lens 113 relating to the eighth modification of the first practical example. A plurality of tooth-shaped grooves 113d are provided in the light-entering surface 103c of the light distributing lens 113 relating to the present modification. The tooth-shaped grooves 113d are provided extending in the same direction (Z direction) along the dividing line, similarly to the sawtooth-shaped grooves 103d of the seventh modification. By providing these tooth-shaped grooves 113d, the light-entering surface 103c of the light distributing lens 113 has depressions and projections formed thereon due to an alternating arrangement of valleys and ridges each having a V-shaped cross-section. The tooth-shaped grooves 113d can also be called tooth-shaped projections.

As shown in FIG. 27, the light-entering surface 103c of the light distributing lens 113 relating to the present modification is also formed in a convex lens shape, similarly to the seventh modification, and tooth-shaped grooves 113d are provided along the convex lens-shaped surface. Furthermore, the tooth shape on the light-entering surface 103c of the light distributing lens 113 is formed with left/right symmetry about the partitioning wall 4b which is the dividing line. By providing the tooth-shaped grooves 113d in this way, light from two different light-emitting surfaces can be mixed well.

Furthermore, the apex angle of the ridges of V-shaped cross-section which are formed by the two mutually adjacent tooth-shaped grooves 113d is 120°, similarly to the V-shaped grooves of the first practical example. The apex angle is not limited to an angle of 120 degrees, but desirably is an obtuse angle in order that the primary light from the respective light-emitting sources is mixed well. More specifically, the apex angle A is desirably 95 to 170 degrees and more desirably 110 to 140 degrees.

The relationship between the distance from the light-entering surface 103c of the light distributing lens 113 to the light-emitting sources, and the focal distance of the light distributing lens 113, and the relationship between the distance from the light-entering surface 103c of the light distributing lens 113 to the light-emitting sources, and the distance between the two light-emitting sources, is similar to the seventh modification and therefore description thereof is omitted here.

Ninth Modification

In the seventh modification described above, a plurality of sawtooth-shaped grooves 103d are formed following the dividing line in the light-entering surface 103c, but the depressions and projections provided on the light-entering surface 103c are not limited to a shape of this kind and it is possible to adopt various shapes. Therefore, one example of a light distributing lens in which a plurality of semicircular column projections which extend in a direction parallel to the dividing line (Z direction) and which have a semicircular cross-section in a plane perpendicular to the direction of extension of the dividing line, is described here as a modification on the basis of FIG. 28. Since the composition apart from the shape of the depressions and projections provided on the light-entering surface is the same as the seventh modification, then portions apart from the shape of depressions and projections are labeled with the same reference numerals as the seventh modification and detailed description thereof is omitted here.

Figure 28:
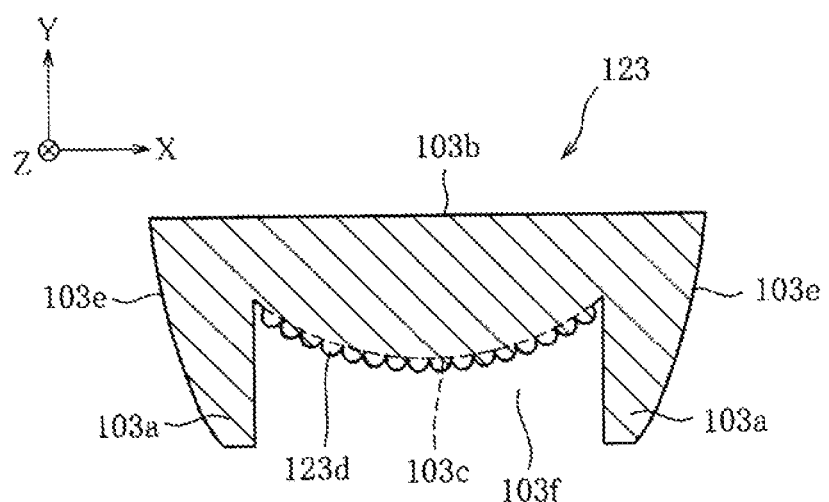
FIG. 28 is a cross-sectional diagram similar to FIG. 25, showing a light distributing lens relating to a ninth modification of the first practical example.

FIG. 28 is a cross-sectional diagram similar to FIG. 25, showing a light distributing lens 123 relating to the ninth modification of the first practical example. A plurality of semicircular column projections 123d are provided on the light-entering surface 103c of the light distributing lens 123 relating to the present modification. Here, the semicircular column projections 123d are projections which extend in a direction parallel to the dividing line and which have a semicircular cross-section in a plane perpendicular to the direction of extension of the dividing line.

As shown in FIG. 28, the light-entering surface 103c of the light distributing lens 123 relating to the present modification is also formed in a convex lens shape, similarly to the seventh modification, and semicircular column projections 123d are provided along the convex lens-shaped surface. Furthermore, the semicircular column projections 123d on the light-entering surface 103c of the light distributing lens 123 are formed with left/right symmetry about the partitioning wall 4b which represents the dividing line. By providing the semicircular column projections 123d in this way, light from the two different light-emitting surfaces can be mixed well.

The relationship between the distance from the light-entering surface 103c of the light distributing lens 123 to the light-emitting sources, and the focal distance of the light distributing lens 123, and the relationship between the distance from the light-entering surface 103c of the light distributing lens 123 to the light-emitting sources, and the distance between the two light-emitting sources, are similar to the seventh modification and therefore description thereof is omitted here.

Tenth Modification

It is possible to form a convex lens shape on the side of the light-exiting surface described above, similarly to light-entering surface side, for example. Therefore, one example of a light distributing lens in which a convex lens shape is formed on the light-entering surface side and the light-exiting surface side is described here as a modification with reference to FIG. 29. Since the composition apart from the shape of the light-exiting surface is the same as the seventh modification, then portions apart from the shape of the light-exiting surface are labeled with the same reference numerals as the seventh modification and detailed description thereof is omitted here.

Figure 29:
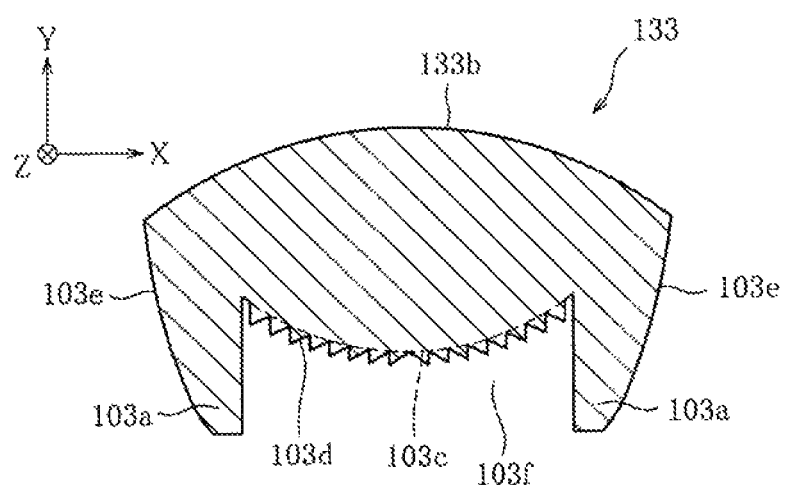
FIG. 29 is a cross-sectional diagram similar to FIG. 25, showing a light distributing lens relating to a tenth modification of the first practical example.

FIG. 29 is a cross-sectional diagram similar to FIG. 25, showing a light distributing lens 133 relating to the tenth modification of the first practical example. As shown in FIG. 29, the whole of the light-exiting surface 133b of the light distributing lens 133 protrudes, and a convex lens shape is formed on the side of the light-exiting surface 133b. A convex lens shape is also formed on the side of the light-entering surface 103c. The light distributing lens 133 forms a biconvex lens in this way, the light radiated from the first light-emitting surface 14a and the second light-emitting surface 15a can therefore be condensed better by the light distributing lens 133.

The shape on the light-entering surface 103c side is not limited to being the same shape as the seventh modification, and it is also possible to suitably combine the shapes of the eighth modification and the ninth modification. Moreover, the light-entering surface 103c side may be formed without a convex lens shape. Even in this case, since the light distributing lens functions as a convex lens, the light radiated from the first light-emitting surface 14a and the second light-emitting surface 15a can be condensed and mixed well by the light distributing lens.

Eleventh Modification

In the tenth modification described above, a convex lens shape is provided on the light-exiting surface 133b side, but depressions and projections are not formed on the light-exiting surface 133b. However, it is also possible to form depressions and projections on the light-exiting surface of the light distributing lens as well. Therefore, below, one example of a light distributing lens in which depressions and projections are also formed on the light-exiting surface in the tenth modification is described here as an eleventh modification with reference to FIG. 30. Since the composition apart from the shape of the light-exiting surface is the same as the seventh modification, then portions apart from the shape of the light-exiting surface are labeled with the same reference numerals as the seventh modification and detailed description thereof is omitted here.

Figure 30:
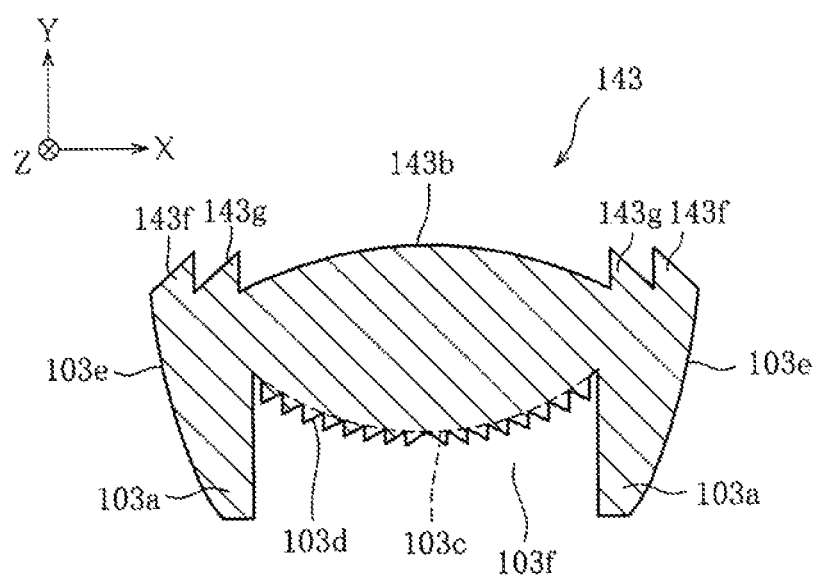
FIG. 30 is a cross-sectional diagram similar to FIG. 25, showing a light distributing lens relating to an eleventh modification of the first practical example.

FIG. 30 is a cross-sectional diagram similar to FIG. 25, showing a light distributing lens 143 relating to the eleventh modification of the first practical example. The light distributing lens 143 according to the present modification differs from the light distributing lens 133 of the tenth modification in terms of the composition of the light-exiting surface 133b, but the composition apart from this is the same. In other words, as shown in FIG. 30, in the light distributing lens 143 according to the present modification, in contrast to the light distributing lens 133 of the tenth modification, two projections 143f, 143g are formed in the shape of concentric circles following the external perimeter portion of the light-exiting surface 143b. In other words, the light distributing lens 143 forms a Fresnel lens by means of the projections 143f, 143g on the light-exiting surface 143b. Furthermore, the light-entering surface 103c has the same composition as the light distributing lens 103 of the seventh modification.

The number of projections 143f, 143g provided on the light-exiting surface 143b is not limited to two and can be increased or decreased according to requirements. Furthermore, the size of the projections 143f, 143g can be increased or reduced according to requirements. Moreover, in the present modification, a plurality of projections 143f, 143g are arranged in close mutual proximity on the light-exiting surface 143b, but these projections 143f, 143g may be spaced apart with a predetermined distance. More specifically, the quantity, shape and structure, etc., of the projections can be changed appropriately, provided that the light distributing lens 143 can function as a Fresnel lens.

By the light distributing lens 143 functioning as a Fresnel lens in this way, the primary light radiated from the first light-emitting surface 14a and the second light-emitting surface 15a can be condensed better by the light distributing lens 143.

In the present modification, a Fresnel lens is constituted by the projections 143f, 143g provided on the light-exiting surface 143b, but it is also possible to form a fly-eye lens by means of a plurality of semicircular projections. Furthermore, instead of projections of this kind, it is also possible to adopt projections of a variety of shapes, such as a square pyramid shape, a conical shape, a triangular pyramid shape, a truncated pyramid shape, a truncated conical shape, and the like. Furthermore, it is also possible to mix projections of various shapes described thus far, rather than using the same shape for all of the projections.

The shape on the light-entering surface 103c side is not limited to being the same shape as the seventh modification, and it is also possible to suitably combine the shapes of the eighth modification and the ninth modification. Moreover, the light-entering surface 103c side may be formed without a convex lens shape. Even in this case, since the light distributing lens functions as a convex lens, the light radiated from the first light-emitting surface 14a and the second light-emitting surface 15a can be condensed and mixed well by the light distributing lens.

The first to eleventh modifications have been described above in relation to the first practical example, and it is also possible to compose various light-emitting apparatuses and light distributing lenses by suitably combining the respective shapes of these modifications. For example, it is possible to form a plurality of sawtooth-shaped grooves 103d according to the seventh modification, or a plurality of tooth-shaped grooves 113d or a plurality of semicircular column projections 123d, on the light-entering surface according to the first practical example, or the first modification to sixth modification.

Second Practical Example

In the light-emitting unit 2 according to the first practical example, a first LED 26 and a second LED 27 which are a first light-emitting source and a second light-emitting source of the present invention are composed by using a first depression 5 and a second depression 6 formed on the substrate 4. However, the composition of the light-emitting unit is not limited to this and can be modified or replaced variously. Therefore, one further example of a light-emitting unit is described below as a second practical example of the present invention.

(Overall Composition of Light-Emitting Unit)

Figure 31:
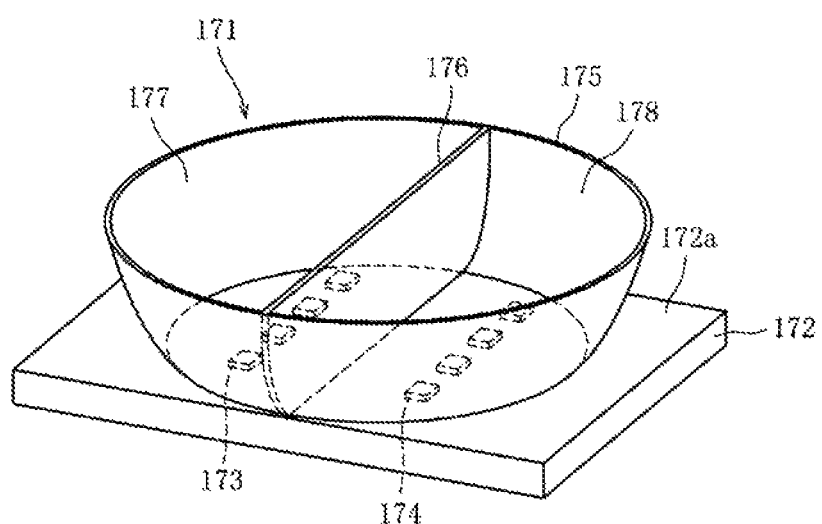
FIG. 31 is a perspective diagram showing a schematic composition of a light-emitting unit used in a light-emitting apparatus relating to a second practical example of the present invention.
Figure 32:
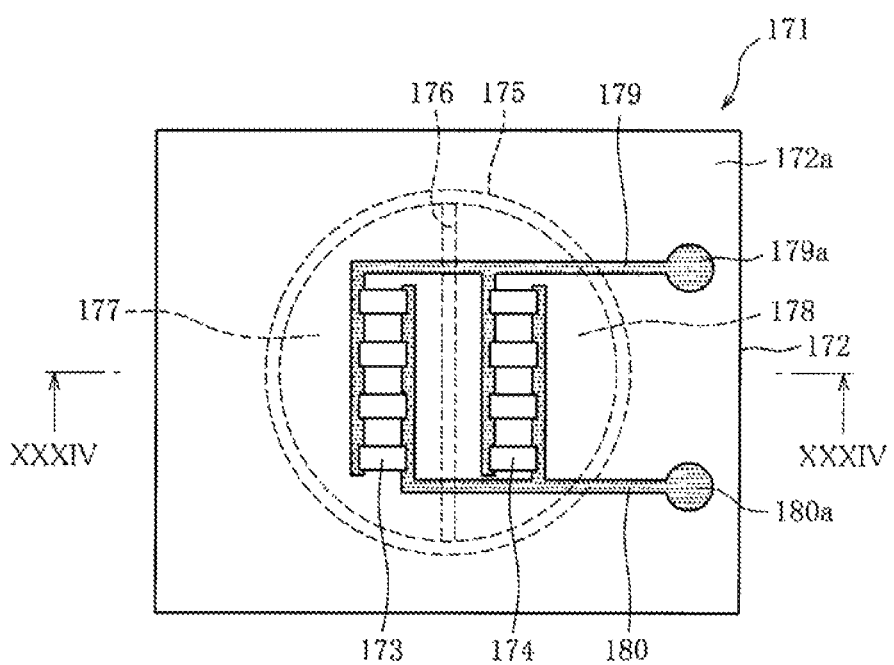
FIG. 32 is a plan diagram showing a schematic view of the light-emitting unit in FIG. 31.
Figure 33:
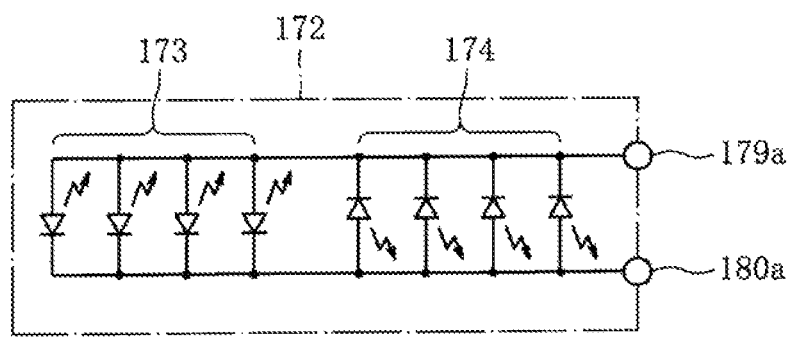
FIG. 33 is a circuit diagram showing an electrical circuit composition of the light-emitting unit in FIG. 31.
Figure 34:
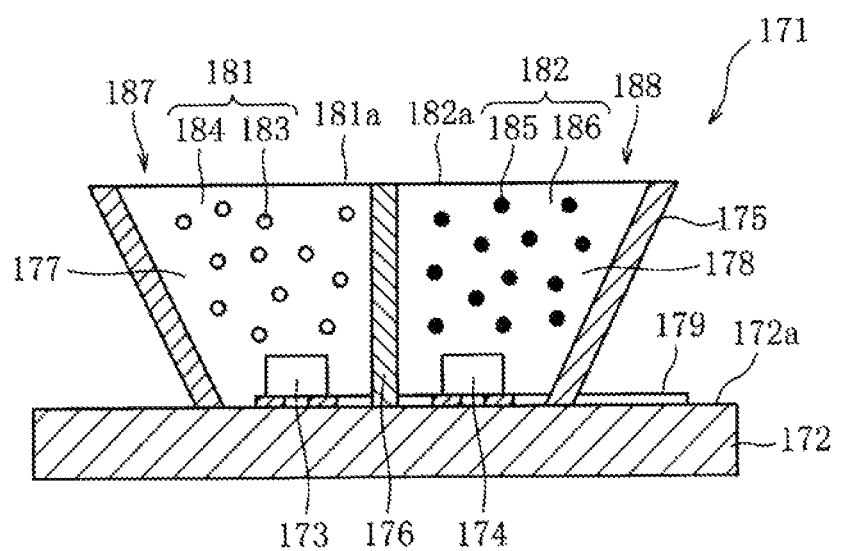
FIG. 34 is a cross-sectional diagram of the light-emitting unit along line XXXIV-XXXIV in FIG. 32.

FIG. 31 is a perspective diagram showing a schematic composition of a light-emitting unit 171 which is used in a light-emitting apparatus relating to the present practical example, and FIG. 32 is a plan diagram showing a schematic view of a light-emitting unit 171. Furthermore, FIG. 33 is a circuit diagram showing an electrical circuit composition of the light-emitting unit 171, and FIG. 34 is a cross-sectional diagram of a light-emitting unit 171 along line XXXIV-XXXIV in FIG. 32. As shown in FIG. 31 and FIG. 32, the light-emitting unit 171 includes four first LED chips 173 and four second LED chips 174 which are mounted on a chip mounting surface 172a of a substrate 172 made of an aluminum-type ceramic having excellent electrical insulating properties and good heat radiating properties.

Moreover, a ring-shaped, truncated conical reflector 175 is provided on the chip mounting surface 172a of the substrate 172 so as to surround the first LED chips 173 and the second LED chips 174. The inner side of the reflector 175 is divided by a partitioning member 176 into a first region 177 and a second region 178. The reflector 175 and the partitioning member 176 can be made of resin, metal, ceramic, or the like, and are fixed to the substrate 172 by using adhesive, or the like. Furthermore, if a material having electrical conductivity is used for the reflector 175 and the partitioning member 176, then a process for imparting electrical insulating properties to the wiring pattern, which is described below, becomes necessary.

The number of the first LED chips 173 and the second LED chips 174 in the present practical example is just one example and can be increased or decreased according to requirements. Consequently, it is also possible to provide one first LED chip 173 and one second LED chip 174, and for the numbers of the respective chips to be different. Moreover, the material of the substrate 172 is not limited to an alumina type ceramic, and it is possible to use various materials, for example, a material selected from ceramic, resin, glass epoxy, or a composite resin which contains filler, or the like. Alternatively, in improving the light emission efficiency of the light-emitting apparatus by raising the reflectivity of light at the chip mounting surface 172a of the substrate 172, it is desirable to use a silicone resin which includes white pigment, such as alumina powder, silica powder, magnesium oxide, titanium oxide, and the like. Moreover, it is also possible to improve heat radiating properties by using a metal substrate of any kind, such as a copper substrate or aluminum substrate. In this case, it is necessary to form a wiring pattern on the wiring substrate via an electrical insulation.

Furthermore, the shapes of the reflector 175 and the partitioning member 176 described above are an example, and can be modified variously. For example, instead of a previously formed reflector 175 and partitioning member 176, a ring-shaped wall section corresponding to a reflector 175 may be formed on the chip mounting surface 172a of the substrate 172, using a dispenser, or the like, and a partitioning wall corresponding to a partitioning member 176 may then be formed. In this case, the material used for the ring-shaped wall section and the partitioning wall section may be, for instance, a thermally curable resin material or a UV-curable resin material, or the like, in the form of a paste, and a silicone resin containing an inorganic filler is desirable.

As shown in FIG. 31 and FIG. 32, four first LED chips 173 are arranged in one row parallel to the direction of extension of the partitioning member 176, in a first region 177 inside the reflector 175, and four second LED chips 174 are arranged in one row in the same direction as the direction of arrangement of the first LED chips 173, in a second region 178 inside the reflector 175. In FIG. 32, the reflector 175 and the partitioning member 176 are depicted by dotted lines, for the sake of clarity.

A wiring pattern 179 and a wiring pattern 180 for supplying drive current respectively to the first LED chips 173 and the second LED chips 174 are formed on the chip mounting surface 172a of the substrate 172, as shown in FIG. 32. An external connection land 179a is formed in one end section of the wiring pattern 179, and the other end section of the wiring pattern 179 is provided extending along the direction of arrangement of the first LED chips 173 as shown in FIG. 32. Furthermore, the wiring pattern 179 is branched along the direction of arrangement of the second LED chips 174 from an intermediate portion positioned in the second region 178 inside the reflector 175, as shown in FIG. 32.

On the other hand, an external connection land 180a for external connection is formed in one end section of the wiring pattern 180, and the other end section of the wiring pattern 180 is provided extending along the direction of arrangement of the first LED chips 173 as shown in FIG. 32. Furthermore, the wiring pattern 180 is branched along the direction of arrangement of the second LED chips 174 from an intermediate portion positioned in the second region 178 inside the reflector 175, as shown in FIG. 32.

As shown in FIG. 32, the four first LED chips 173 are connected mutually in parallel between the wiring pattern 179 and the wiring pattern 180, each with the anode of the chip on the side of the wiring pattern 179. Furthermore, the four second LED chips 174 are connected mutually in parallel between the wiring pattern 179 and the wiring pattern 180, each with the cathode of the chip on the side of the wiring pattern 179. By mounting the first LED chips 173 and the second LED chips 174 on the substrate 172 in this way, an electrical circuit such as that in FIG. 33 is composed in the light-emitting unit 171. In other words, the first LED chips 173 and the second LED chips 174 are connected mutually in parallel between the external connection land 179a and the external connection land 180a, with their polarities mutually reversed.

More specifically, two electrodes for supplying drive current (not illustrated) are provided on the substrate 172 side surface of each of the first LED chips 173 and the second LED chips 174. One electrode (p electrode) of each first LED chip 173 is connected to the wiring pattern 179, and the other electrode (n electrode) thereof is connected to the wiring pattern 180. Furthermore, one electrode (p electrode) of each second LED chip 174 is connected to the wiring pattern 180, and the other electrode (n electrode) thereof is connected to the wiring pattern 179.

This mounting of the first LED chips 173 and the second LED chips 174 and the connection of the respective electrodes to the wiring patterns 179 and 180 uses flip-chip mounting, and is performed by eutectic soldering via metal bumps (not illustrated). The method of mounting the first LED chips 173 and the second LED chips 174 on the substrate 172 is not limited to this, and a suitable method can be selected in accordance with the type and structure of the LED chips, and so on. For instance, it is also possible to use double-wire bonding in which the first LED chips 173 and the second LED chips 174 are respectively bonded and fixed at prescribed positions on the substrate 172 as described above, and then the respective electrodes of the first LED chips 173 and the second LED chips 174 are connected to the corresponding wiring patterns by wire bonding, and it is also possible to use single-wire bonding in which one electrode is bonded to a wiring pattern as described above and the other electrode is connected to the wiring pattern by wire bonding.

As shown in FIG. 34, a first fluorescent member (first wavelength conversion member) 181 is accommodated in the first region 177 inside the reflector 175, so as to respectively cover the four first LED chips 173. Furthermore, a second fluorescent member (second wavelength conversion member) 182 is accommodated in the second region 178 inside the reflector 175, so as to respectively cover the four second LED chips 174.

The first fluorescent member 181 is composed similarly to the first fluorescent member 14 according to the first practical example which was described above. In other words, the first fluorescent member 181 is constituted by a first fluorescent body 183 which is excited by the light emitted by the first LED chips 173 and radiates light of a different wavelength from the light emitted by the first LED chips 173, and a filling material 184 which holds the first fluorescent body 183 in a dispersed fashion. Furthermore, the second fluorescent member 182 is composed similarly to the second fluorescent member 15 according to the first practical example which was described above. In other words, the second fluorescent member 182 is constituted by a second fluorescent body 185 which is excited by the light emitted by the second LED chips 174 and radiates light of a different wavelength from the light emitted by the second LED chips 174, and a filling material 186 which holds the second fluorescent body 185 in a dispersed fashion.

Consequently, in the present practical example, the combination of the first LED chips 173 and the first fluorescent member 181 constitutes a first LED 187, as well as corresponding to a first light-emitting source which is one light-emitting source of the present invention. Furthermore, the combination of the second LED chips 174 and the second fluorescent member 182 constitutes a second LED 188, as well as corresponding to a second light-emitting source which is another light-emitting source of the present invention. The upper surface of the first fluorescent member 181 which is exposed in the first region 177 corresponds to a first light-emitting surface according to the present invention, and the upper surface of the second fluorescent member 182 which is exposed in the second region 178 corresponds to a second light-emitting surface according to the present invention. Therefore, below, the upper surface 181a of the first fluorescent member 181 is called the first light-emitting surface and the upper surface 182a of the second fluorescent member 182 is called the second light-emitting surface. Furthermore, the first region 177 and the second region 178 are separated by a partitioning member 176 as described above, and therefore the partitioning member 176 forms a dividing line between the first light-emitting surface and the second light-emitting surface of the present invention.

(LED Chip)

The first LED chips 173 and the second LED chips 174 used in the present practical example are both LED chips which emit near-ultraviolet light having a peak wavelength of 405 nm, similarly to the case of the first practical example. More specifically, it is desirable for an LED chip of this kind to be a GaN type LED chip, or the like, which emits light in a near-ultraviolet region, using an InGaN semiconductor as a light-emitting layer. The type and light emission wavelength characteristics of the first LED chips 173 and the second LED chips 174 are not limited in particular to this, and it is possible to use various LED chips provided that the essence of the present invention is not changed. It is also possible to use an LED chip which emits blue light, for example, as an LED chip other than an LED chip which emits near-ultraviolet light. Consequently, in the present practical example, the peak wavelength of the light emitted by the first LED chips 173 and the second LED chips 174 in the present practical example is desirably in a range of 360 nm to 460 nm, and preferably in a range of 400 nm to 450 nm.

(Fluorescent Member)

As described above, the first fluorescent member 181 is composed similarly to the first fluorescent member 14 in the first practical example, and the second fluorescent member 182 is composed similarly to the second fluorescent member 15 in the first practical example. In other words, the first fluorescent body 183 in the first fluorescent member 181 and the second fluorescent body 185 in the second fluorescent member 182 have mutually different wavelength conversion characteristics. Various combinations of these different wavelength conversion characteristics are possible, but in the present practical example, similarly to the case of the first practical example, fluorescent bodies of three types, namely, a red fluorescent body, a green fluorescent body and a blue fluorescent body are used in combination for each of the first fluorescent body 183 and the second fluorescent body 185.

The wavelength of the near-ultraviolet light emitted by the four first LED chips 173 is converted respectively into red light, green light and blue light by the red fluorescent body, green fluorescent body and blue fluorescent body which are held in distributed fashion as the first fluorescent body 183 inside the first fluorescent member 181, and white light obtained by combining the red light, green light and blue light is radiated from the upper surface of the first fluorescent member 181, in other words, the first light-emitting surface 181a. Furthermore, the wavelength of the near-ultraviolet light emitted by the four second LED chips 174 is converted respectively into red light, green light and blue light by the red fluorescent body, green fluorescent body and blue fluorescent body which are held in distributed fashion as the second fluorescent body 185 inside the second fluorescent member 182, and white light obtained by combining the red light, green light and blue light is radiated from the upper surface of the second fluorescent member 182, in other words, the second light-emitting surface 182a.

Here, the mixing ratios of the red fluorescent body, the green fluorescent body and the blue fluorescent body are different in the first fluorescent body 183 and the second fluorescent body 185, and the first color temperature T1 of the white light radiated from the first light-emitting surface 181a and the second color temperature T2 of the white light radiated from the second light-emitting surface 182a are mutually different. In other words, the white light radiated from the first light-emitting surface 181a corresponds to light of a first chromaticity according to the present invention, and the white light radiated from the second light-emitting surface 182a corresponds to light of a second chromaticity according to the present invention. In the present practical example also, the first color temperature T1 is taken to be 2500 K, for example, and the second color temperature T2 is set to 6500 K, which is higher than the first color temperature T1. The values of the first color temperature T1 and the second color temperature T2 are not limited to these values, and can be set variously in accordance with the characteristics required in the light-emitting apparatus.

Similarly to the case of the first practical example, the first fluorescent body 183 and the second fluorescent body 185 are not limited to mixtures of a red fluorescent body, a green fluorescent body and a blue fluorescent body such as that described above. For instance, it is also possible to form a first fluorescent body 183 and a second fluorescent body 185 by mixing a blue fluorescent body and a yellow fluorescent body. In this case, the wavelength of the near-ultraviolet light emitted by the first LED chips 173 is converted into blue light and yellow light by the blue fluorescent body and the yellow fluorescent body held in a distributed fashion as a first fluorescent body 183 inside the first fluorescent member 181, and the white light obtained by combining the blue light and yellow light is radiated from the first light-emitting surface 181a. In the second fluorescent member 182, similarly, white light is radiated from the second light-emitting surface 182a by the second fluorescent body 185 converting the wavelength of near-ultraviolet light emitted by the second LED chips 174. In this case also, by altering the mixing ratios of the blue fluorescent body and the yellow fluorescent body in the first fluorescent body 183 and the second fluorescent body 185, the first color temperature T1 of the white light radiated from the light-emitting surface 181a and the second color temperature T2 of the white light radiated from the second light-emitting surface 182a can be made mutually different.

Moreover, rather than mixing a blue fluorescent body and a yellow fluorescent body as described above, it is also possible to use a blue fluorescent body for the first fluorescent body 183 and to use a yellow fluorescent body for the second fluorescent body 185. In this case, the wavelength of the near-ultraviolet light emitted by the first LED chips 173 is converted into blue light by the first fluorescent body 183, and the wavelength of the near-ultraviolet light emitted by the second LED chips 174 is converted into yellow light by the second fluorescent body 185. Consequently, it is possible to obtain white light of various color temperatures by combining the blue light and yellow light.

Instead of this combination of a blue fluorescent body and a yellow fluorescent body, it is also possible to use a combination of a red fluorescent body and a blue/green (cyan) fluorescent body in a similar method. In other words, it is possible to mix a red fluorescent body and a blue/green fluorescent body and to use these as a first fluorescent body 183 and a second fluorescent body 185 by altering the mixing ratio thereof, and it is also possible to use a red fluorescent body as the first fluorescent body 183 and to use a blue/green fluorescent body as the second fluorescent body 185.

Moreover, as described previously, it is also possible to use an LED chip which emits light other than near-ultraviolet light, for the first LED chips 173 and the second LED chips 174. For example, if an LED chip which emits blue light is used for the first LED chips 173 and the second LED chips 174, then it is possible to use a mixture of a red fluorescent body which converts the wavelength of the blue light and radiates red light, and a green fluorescent body which converts the wavelength of the blue light and radiates green light, for the first fluorescent body 183 and the second fluorescent body 185.

By adopting a combination of this kind, in the first fluorescent member 181, it is possible to obtain white light by combining the blue light emitted by the first LED chips 173 with the red light radiated by the red fluorescent body and the green light radiated by the green fluorescent body. Furthermore, in the second fluorescent member 182 also, it is possible to obtain white light by combining the blue light emitted by the second LED chips 174 with the red light radiated by the red fluorescent body and the green light radiated by the green fluorescent body. Consequently, by altering the mixing ratio of the red fluorescent body and the green fluorescent body, between the first fluorescent member 181 and the second fluorescent member 182, then it is possible to radiate white light of respectively different color temperatures from the first light-emitting surface 181a and the second light-emitting surface 182a, similarly to the present practical example.

In this way, fluorescent bodies of various types can be used in the first fluorescent body 183 and the second fluorescent body 185. Similarly to the case of the first practical example, the light obtained respectively from the first fluorescent member 181 and the second fluorescent member 182, and the light obtained by combining these is not limited to white light, and the types of the first fluorescent body 183 and the second fluorescent body 185 should be selected appropriately in such a manner that the first chromaticity of the light radiated from the first light-emitting surface 181a and the second chromaticity of the light radiated from the second light-emitting surface 182a are mutually different, in accordance with the chromaticity, brightness, and the like, of the radiated light required in the light-emitting apparatus. Concrete examples of the fluorescent bodies and filling materials of various types described above follow the concrete examples stated in relation to the first fluorescent member 14 and the second fluorescent member 15 in the first practical example.

(Light Distributing Lens)

The light distributing lens 193 which is installed in the light-emitting unit 171 composed in this way is constituted in substantially similar fashion to the light distributing lens 3 of the first practical example. However, whereas the first LED 26 and the second LED 27 are accommodated in a first depression 5 and a second depression 6 formed in the substrate 4 in the first practical example, in the present practical example, the first LED 187 and the second LED 188 protrude on the chip mounting surface 172a of the substrate 172. Consequently, the composition of the light distributing lens 193 differs from that of the light distributing lens 3 in that the abutting section 193a provided in the small diameter-side end section of the light distributing lens 193 is elongated with respect to the abutting section 3a provided on the light distributing lens 3 of the first practical example, in order to avoid interference between the light distributing lens 193 and the first LED 187 and the second LED 188. The composition of the light distributing lens 193 apart from this abutting section 193a is similar to that of the light distributing lens 3 according to the first practical example, and detailed description thereof is omitted here.

In the present practical example also, it is also possible to adopt the first to eleventh modifications stated in relation to the first practical example. In other words, the light distributing lens 193 can be installed on the light-emitting unit 171 by using pin members according to the first modification or the second modification as shown in FIG. 13 or FIG. 14. Moreover, projections such as those of the third modification or the fourth modification may be provided on the light-entering surface 193c of the light distributing lens 193, and projections such as those of the fifth modification or the sixth modification may be provided on the light-exiting surface 193b of the light distributing lens 193.

Figure 35:
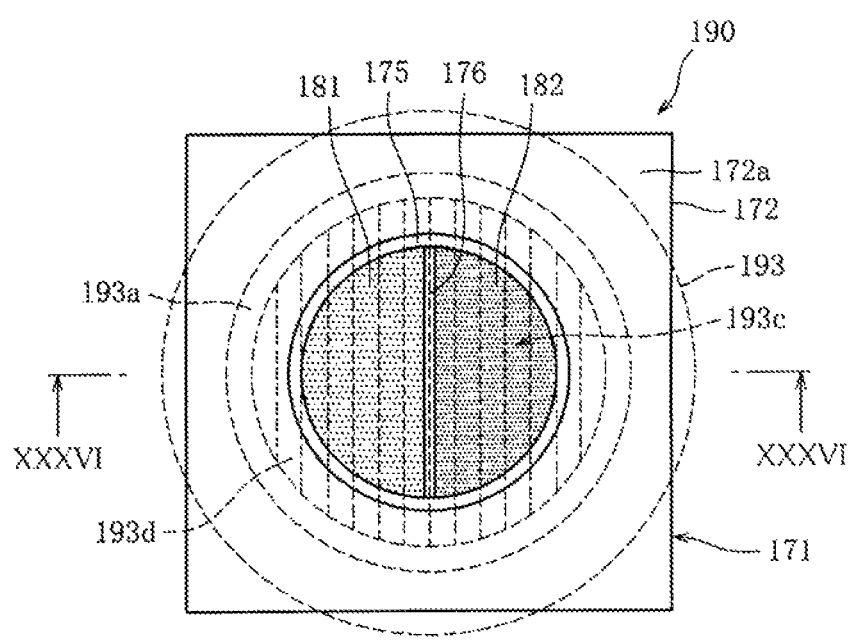
FIG. 35 is a plan diagram showing a schematic view of the light-emitting apparatus relating to the second practical example.
Figure 36:
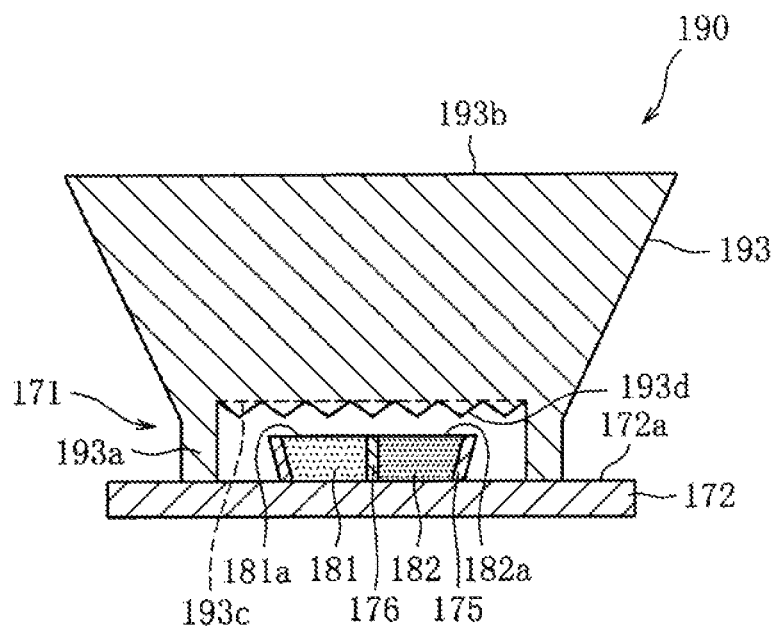
FIG. 36 is a schematic cross-sectional diagram of the light-emitting apparatus along line XXXVI-XXXVI in FIG. 35.

FIG. 35 is a plan diagram showing a schematic view of the light-emitting apparatus 190 relating to the present practical example, and FIG. 36 is a schematic cross-sectional diagram of the light-emitting apparatus 190 along line XXXVI-XXXVI in FIG. 35. In FIG. 35, for the sake of convenience, the light distributing lens 193 is depicted by dotted lines. As shown in FIG. 35 and FIG. 36, the abutting section 193a of the light distributing lens 193 abuts against the chip mounting surface 172a of the substrate 172, and also surrounds the reflector 175 of the light-emitting unit 171, in other words, the first light-emitting surface 181a and the second light-emitting surface 182a, when the light distributing lens 193 is installed in the light-emitting unit 171.

Consequently, the light-entering surface 193c which is on the inner side of the abutting section 193a respectively faces the first light-emitting surface 181a and the second light-emitting surface 182a. Consequently, when light is radiated respectively from the first light-emitting surface 181a and the second light-emitting surface 182a, then this light enters respectively into the light distributing lens 193 from the light-entering surface 193c, similarly to the first practical example. This combined light is radiated towards the exterior of the light distributing lens 193 from the light-exiting surface 193b on the large diameter-side of the light distributing lens 193. Below, the light radiated from the light-exiting surface 193b is called combined light as described above, and the light radiated respectively from the first light-emitting surface 181a and the second light-emitting surface 182a is called primary light.

As shown in FIG. 35 and FIG. 36, a plurality of V-shaped grooves 193d having a V-shaped cross-section are provided extending in the same direction in the light-entering surface 193c of the light distributing lens 193, similarly to the light distributing lens 3 of the first practical example. By providing these V-shaped grooves 193d, the light-entering surface 193c of the light distributing lens 193 has depressions and projections formed therein due to an alternating arrangement of valleys and ridges each having a V-shaped cross-section.

As shown in FIG. 35, similarly to the light-emitting apparatus of the first practical example, the V-shaped grooves 193d are provided extending in the direction of extension of the partitioning member 176 which forms a dividing line between the first light-emitting surface 181a and the second light-emitting surface 182a. By forming a plurality of V-shaped grooves 193d of this kind in the light-entering surface 193c of the light distributing lens 193, the primary light radiated respectively from the first light-emitting surface 181a and the second light-emitting surface 182a becomes more readily diffused in a direction perpendicular to the direction of extension of the V-shaped grooves 193d. In other words, the primary light radiated respectively from the first light-emitting surface 181a and the second light-emitting surface 182a is readily diffused in mutually intersecting directions, and therefore the primary light of two types is mixed well after passing through the V-shaped grooves 193d. As a result of this, the combined light radiated outwards from the light-exiting surface 193b of the light distributing lens 193 is excellent combined light in which the light of two types radiated respectively from the first light-emitting surface 181a and the second light-emitting surface 182a is not liable to become separated.

Moreover, in the present practical example, a first LED 187 is composed by first LED chips 173 and a first fluorescent member 181 which converts the wavelength of at least a portion of the light emitted by the first LED chips 173, and a second LED 188 is composed by second LED chips 174 and a second fluorescent member 182 which converts the wavelength of at least a portion of the light emitted by the second LED chips 174. Therefore, it is possible to obtain combined light having excellent color rendition compared to a case where light emitted by an LED chip is used directly as primary light.

(Application to Lighting Apparatus)

Therefore, when the light-emitting apparatus according to the present practical example is used as a light source of a lighting apparatus, similarly to the first practical example, it is possible to achieve a lighting apparatus in which the color temperature of the illuminating light can be adjusted between a first color temperature T1 and a second color temperature T2, by using an electric circuit having the composition shown in FIG. 10. In other words, the light-emitting unit 171 according to the present practical example constitutes an electrical circuit such as that shown in FIG. 33, as described above. Therefore, when the external connection land 179a of the substrate 172 is connected to the connection terminal 31 of the drive unit 29 shown in FIG. 10, and the external connection land 180a of the substrate 172 is connected to the connection terminal 32 of the drive unit 29 shown in FIG. 10, then similarly to the first practical example, it is possible to supply drive current to the first LED chips 173 and the second LED chips 174.

Therefore, similarly to the case of the first practical example, it is possible to obtain, as the illuminating light of the lighting apparatus, white light of which color temperature can be varied between a first color temperature T1 and a second color temperature T2, by adjusting the on time t1 of the transistors Q1 and Q4 and the on time t2 of the transistors Q2 and Q3 in the drive unit 29. In this case, since the light distributing lens 193 is provided in the light-emitting apparatus as stated previously, then the white light of the first color temperature T1 which is radiated from the first light-emitting surface 181a and the white light of a second color temperature T2 which is radiated from the second light-emitting surface 182a are mixed well, and white light having excellent color rendition in which the two types of white light are not liable to become separated can be obtained as the illuminating light of the lighting apparatus.

In the light-emitting apparatus according to the first practical example and modifications thereof and according to the second practical example, in each case, by using a light distributing lens as a light distributing member, the light of two types having mutually different chromaticities which is emitted from the two light sources is mixed well and separation of the light of two types having mutually different chromaticities in the light which is radiated from the light-emitting apparatus is prevented satisfactorily. There follows an example of a light-emitting apparatus which uses a light mixing member instead of a light distributing member of this kind in order that light of two types having mutually different chromaticities emitted from two light sources is mixed well, and separation of light of two types having mutually different chromaticities in the light radiated from the light-emitting apparatus is prevented satisfactorily.

Third Practical Example (General Composition of Light-Emitting Apparatus)

Figure 37:
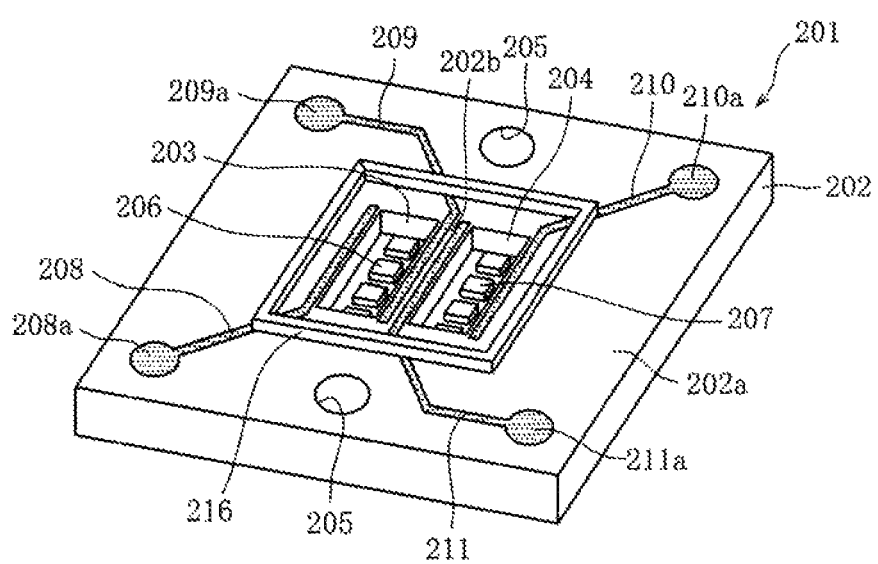
FIG. 37 is a perspective diagram showing a schematic composition of a light-emitting apparatus relating to a third practical example of the present invention.
Figure 38:
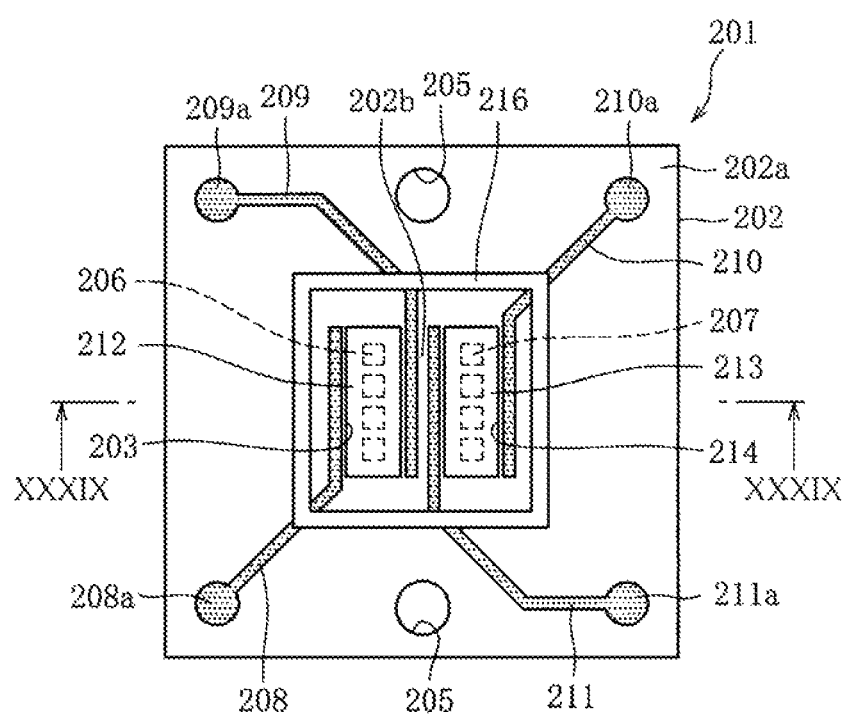
FIG. 38 is a plan diagram showing a schematic view of the light-emitting apparatus in FIG. 37.
Figure 39:
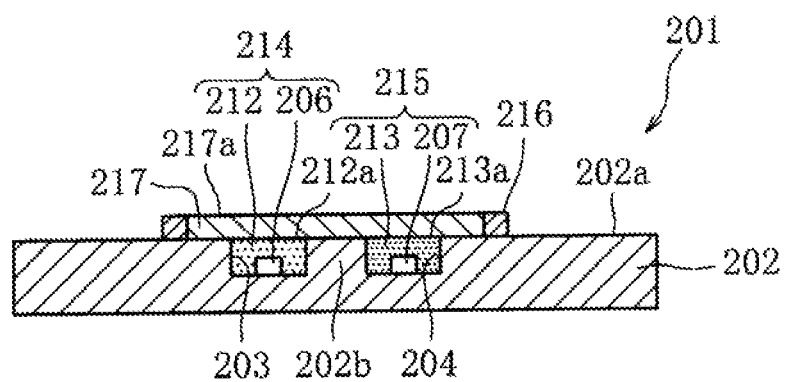
FIG. 39 is a schematic cross-sectional diagram of the light-emitting apparatus along line XXXIX-XXXIX in FIG. 38.

FIG. 37 is a perspective diagram showing a schematic composition of a light-emitting apparatus 201 relating to the third practical example according to the present invention, and FIG. 38 is a plan diagram showing a schematic view of a light-emitting apparatus 201. Furthermore, FIG. 39 is a schematic cross-sectional diagram of a light-emitting apparatus 201 along line XXXIX-XXXIX in FIG. 38. As shown in FIG. 37 to FIG. 39, the light-emitting apparatus 201 includes a substrate 202 made of an alumina type ceramic having excellent electrical insulating properties and good heat radiating properties.

A first depression 203 and a second depression 204 are formed in the substrate 202 so as to be open respectively on a first surface 202a of the substrate 202. The first depression 203 and the second depression 204 are formed in such a manner that the opening surface area and the opening shape on the first surface 202a of the substrate 202 are substantially the same, and are arranged alongside each other on either side of a partitioning wall 202b which is one portion of the substrate 202. In the present practical example, the first depression 203 and the second depression 204 have a rectangular opening shape, but the opening shape is not limited to this and may be modified to various shapes. As described hereinafter, desirably, both of the depressions in the first surface 202a of the substrate 202 have substantially the same opening surface area and opening shape.

A pair of circular holes 205 passing through the substrate 202 are formed in the substrate 202. These circular holes 205 are used as installation holes for fixing the light-emitting apparatus 201 to the main body or cooling mechanism, or the like, of a lighting apparatus, or the like, when the light-emitting apparatus 201 is used as a light source for a lighting apparatus or other various apparatuses. The number, shape, arrangement, and the like, of the circular holes 205 are not limited to those indicated in the present practical example and can be modified variously in accordance with requirements. Furthermore, it is also possible to omit these circular holes 205.

As shown in FIG. 37 and FIG. 38, four first LED chips 206 are arranged in one row along the partitioning wall 202b on a bottom surface of the first depression 203, and four second LED chips 207 are arranged in one row along the partitioning wall 202b on a bottom surface of the second depression 204. Furthermore, in order to supply a drive current to the first LED chips 206 and the second LED chips 207, a first wiring pattern 208, a second wiring pattern 209, a third wiring pattern 210 and a fourth wiring pattern 211 made of metal having good electrical conductivity, such as copper foil, are respectively formed on the first surface 202a of the substrate 202.

The number of the first LED chips 206 and the second LED chips 207 in the present practical example is just one example and can be increased or decreased according to requirements. Consequently, it is also possible to provide one first LED chip 206 and one second LED chip 207, and for the numbers of the respective chips to be different. The material of the substrate 202 is not limited to an alumina type ceramic as used in the present practical example, and it is possible to use various materials suited to the substrate 202, for example, a material selected from ceramic, resin, glass epoxy, or a composite resin which contains filler, or the like. Alternatively, in improving the light emission efficiency of the light-emitting apparatus 1 by raising the reflectivity of light at the first surface 202a of the substrate 202, it is desirable to use a silicone resin which includes white pigment, such as alumina powder, silica powder, magnesium oxide, titanium oxide, and the like. Moreover, in improving the heat radiating properties, it is also possible to use a metal substrate such as a copper substrate, an alumina substrate, or the like. If a metal substrate is used, however, it is necessary to form a wiring pattern on the substrate via an electrical insulation.

External connection lands 208a and 209a for connecting external wires are provided respectively on one end of the first wiring pattern 208 and one end of the second wiring pattern 209. On the other hand, the other end of the first wiring pattern 208 and the other end of the second wiring pattern 209 are respectively extended along the first depression 203 so as to be situated on either side of the first depression 203, as shown in FIG. 37 and FIG. 38. Furthermore, external connection lands 210a and 211a for connecting external wires are provided respectively on one end of the third wiring pattern 210 and one end of the fourth wiring pattern 211. On the other hand, the other end of the third wiring pattern 210 and the other end of the fourth wiring pattern 211 are respectively extended along the second depression 204 so as to be situated on either side of the second depression 204, as shown in FIG. 37 and FIG. 38.

As shown in FIG. 38 and FIG. 39, the interior of the first depression 203 is filled so as to cover the four first LED chips 206 with a first fluorescent member (first wavelength conversion member) 212 which converts a wavelength of a portion or all of the light emitted by the first LED chip 206. Similarly, the interior of the second depression 204 is filled so as to cover the four second LED chips 207 with a second fluorescent member (second wavelength conversion member) 213 which converts a wavelength of a portion or all of the light emitted by the second LED chips 207. In FIG. 37, for the sake of convenience, the first fluorescent member 212 and the second fluorescent member 213 are not depicted.

By providing first LED chips 206 and a first fluorescent member 212 inside the first depression 203 in this way, when the first LED chips 206 emit light, a wavelength of a portion of all of the light emitted by the first LED chips 206 is converted by the first fluorescent member 212, and the light obtained by this wavelength conversion is radiated from the first fluorescent member 212 via the opening of the first depression 203. Furthermore, when the second LED chips 207 emit light, the wavelength of a portion or all of the light emitted by the second LED chips 207 is converted by the second fluorescent member 213, and the light obtained by this wavelength conversion is radiated from the second fluorescent member 213 via the opening of the second depression 204.

Consequently, the combination of the first LED chips 206 and the first fluorescent member 212 constitutes a first LED 214 which corresponds to a first light-emitting source of the present invention. Furthermore, the combination of the second LED chips 207 and the second fluorescent member 213 constitutes a second LED 215, as well as corresponding to a second light-emitting source of the present invention. On the first surface 202a of the substrate 202, an upper surface 212a of the first fluorescent member 212 which is exposed via the opening of the first depression 203 corresponds to a first light-emitting surface of the present invention, and an upper surface 213a of the second fluorescent member 213 which is exposed via the opening of the second depression 204 corresponds to a second light-emitting surface of the present invention. Therefore, below, the upper surface 212a of the first fluorescent member 212 is called the first light-emitting surface and the upper surface 213a of the second fluorescent member 213 is called the second light-emitting surface.

As shown in FIG. 37 and FIG. 38, a projection-shaped frame 216 which surrounds the first depression 203 and the second depression 204 is provided in the first surface 202a of the substrate 202. This projection-shaped frame 216 is made of resin, metal, ceramic, or the like, and is fixed to the first surface 202a of the substrate 202 by adhesive, or the like. However, if the projection-shaped frame 216 is made from a material having electrical conductivity, then processing is required to ensure electrical insulation with respect to the wiring pattern formed on the first surface 202a of the substrate 202.

In the present practical example, a projection-shaped frame 216 formed in a quadrilateral shape is used, but the shape of the projection-shaped frame 216 is not limited to this and may adopt various shapes. In other words, it is possible to adopt any shape, as long as the frame is provided so as to protrude from the first surface 202a of the substrate 202 and surround the first depression 203 and the second depression 204. Furthermore, the projection-shaped frame 216 may be previously formed in the shape of a frame and fixed to the first surface 202a of the substrate 202 using adhesive, or the like, or may be formed by applying a material in the form of a paste made of thermoplastic resin, thermally curable resin, light-curable resin, or the like, to the first surface 202a of the substrate 202 using a dispenser, or the like.

As shown in FIG. 39, the inner side of the projection-shaped frame 216 is filled with a light mixing member 217 that is applied by using a dispenser, or the like. Consequently, the first light-emitting surface 212a and the second light-emitting surface 213a are covered with the light mixing member 217 which is provided at a position facing the first light-emitting surface 212a and the second light-emitting surface 213a in this way. As described in detail below, this light mixing member 217 is provided in order to mix light radiated respectively from the first light-emitting surface 212a and the second light-emitting surface 213a, and the combined light obtained by mixing this light is radiated from a radiating surface 217a. Furthermore, the projection-shaped frame 216 is provided so as to hold the light mixing member 217 at a prescribed position so as to cover the first light-emitting surface 212a and the second light-emitting surface 213a when the light mixing member 217 is applied to the first surface 202a of the substrate 202. The light mixing member 217 is not depicted in FIG. 37 and FIG. 38, to facilitate the description.

Figure 40:
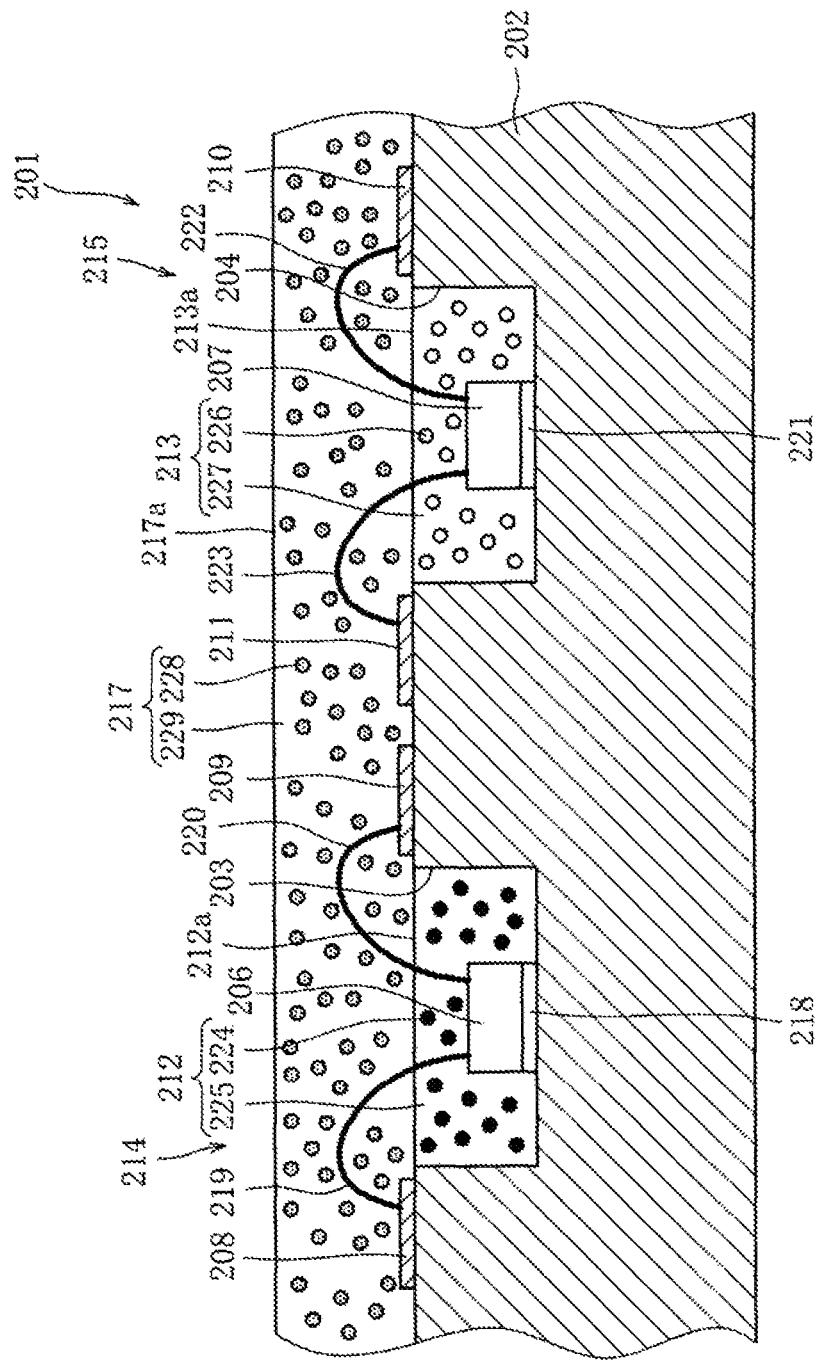
FIG. 40 is a principal enlarged diagram of the periphery of a first depression and a second depression in a cross-section of FIG. 39.

FIG. 40 is a principal enlarged diagram of the periphery of the first depression 203 and the second depression 204 in a cross-section of FIG. 39. As shown in FIG. 40, the first LED chip 206 is bonded and fixed to the bottom surface of the first depression 203 via an adhesive 218, and two electrodes, namely, a p electrode and an n electrode provided on the upper surface of the chip are respectively connected by wire bonding to corresponding wiring patterns. More specifically, a p electrode of the first LED chip 206 is connected to a first wiring pattern 208 by a metal wire 219, and an n electrode thereof is connected to a second wiring pattern 209 by a metal wire 220. FIG. 40 shows a connected state of one first LED chip 206, but four first LED chips 206 are each connected in a similar fashion to the first wiring pattern 208 and the second wiring pattern 209. Consequently, the four first LED chips 206 are connected mutually in parallel between the first wiring pattern 208 and the second wiring pattern 209, with their respective anodes on the side of the first wiring pattern 208.

Similarly, the second LED chips 207 are also bonded and fixed to the bottom surface of the second depression 204 via an adhesive 221, and two electrodes, namely, a p electrode and an n electrode, provided on the upper surface of each chip are respectively connected by wire bonding to corresponding wiring patterns. More specifically, an n electrode of the second LED chip 207 is connected to a third wiring pattern 210 by a metal wire 222, and a p electrode is connected to a fourth wiring pattern 211 by a metal wire 223. FIG. 40 shows a connected state of one second LED chip 207, but four second LED chips 207 are each connected in a similar fashion to the third wiring pattern 210 and the fourth wiring pattern 211. Consequently, the four second LED chips 207 are connected mutually in parallel between the third wiring pattern 210 and the fourth wiring pattern 211, with their respective anodes on the side of the fourth wiring pattern 211.

The installation of the first LED chips 206 and the second LED chips 207 on the substrate 202 and the connection thereof to the wiring patterns is not limited to this, and a suitable method can be selected in accordance with the type and structure, and the like, of the LED chips. For example, it is also possible to using flip-chip mounting, in such a manner that two electrodes on the lower surface of each LED chip are bonded to wiring patterns formed on the bottom surfaces of the first depression 203 and the second depression 204. Alternatively, one electrode on the lower surface of each LED chip may be bonded to a wiring pattern formed on the bottom surface of the first depression 203 or the second depression 204, and one electrode on the upper surface of each LED chip may be connected by wire bonding to a wiring pattern formed on the first surface 202a of the substrate 202.

As described above, the interior of the first depression 203 is filled so as to cover the first LED chips 206 with a first fluorescent member 212 which converts the wavelength of a portion or all of the light emitted by the first LED chips 206. This first fluorescent member 212 is constituted by a first fluorescent body 224 which is excited by the light emitted by the first LED chips 206 and radiates light of a different wavelength from the light emitted by the first LED chips 206, and a filling material 225 which holds the first fluorescent body 224 in a distributed fashion. On the other hand, the interior of the second depression 204 is filled so as to cover the second LED chips 207 with a second fluorescent member 213 which converts a wavelength of a portion or all of the light emitted by the second LED chips 207. The second fluorescent member 213 is constituted by a second fluorescent body 226 which is excited by the light emitted by the second LED chips 207 and radiates light of a different wavelength from the light emitted by the second LED chips 207, and a filling material 227 which holds the second fluorescent body 226 in a dispersed fashion.

Furthermore, the first light-emitting surface 212a of the first LED 214 which is constituted by the first LED chips 206 and the first fluorescent member 212, and the second light-emitting surface 213a of the second LED 215 which is constituted by the second LED chips 207 and the second fluorescent member 213 are covered by the light mixing member 217 which is filled inside the projection-shaped frame 216 (not illustrated in FIG. 40). In this case, metal wires 219, 220, 222 and 223 which are connected respectively to the first LED chips 206 and the second LED chips 207 and which protrude upwards beyond the first surface 202a of the substrate 202 from the first light-emitting surface 212a and the second light-emitting surface 213a are each covered by the light mixing member 217 and are positioned inside the light mixing member 217.

The light mixing member 217 is constituted by a granular light diffusing material 228 which diffuses and mixes light emitted respectively by the first LED 214 and the second LED 215, and a transparent translucent base material 229 which holds this light diffusing material 228 in a dispersed fashion. Next, the specific composition of the first LED chips 206 and the second LED chips 207, the first fluorescent member 212 and the second fluorescent member 213, and the light mixing member 217, will be described in detail.

(LED Chip)

The first LED chips 206 and the second LED chips 207 used in the present practical example are both LED chips which emit near-ultraviolet light having a peak wavelength of 405 nm, similarly to the cases of the first practical example and the second practical example. More specifically, it is desirable for an LED chip of this kind to be a GaN type LED chip, or the like, which emits light in a near-ultraviolet region, using an InGaN semiconductor as a light-emitting layer. The type and light emission wavelength characteristics of the first LED chips 206 and the second LED chips 207 are not limited in particular to this, and it is possible to use various LED chips provided that the essence of the present invention is not changed. It is also possible to use an LED chip which emits blue light, for example, as an LED chip other than an LED chip which emits near-ultraviolet light. Consequently, in the present practical example, the peak wavelength of the light emitted by the first LED chips 206 and the second LED chips 207 in the present practical example is desirably in a range of 360 nm to 460 nm, and preferably in a range of 400 nm to 450 nm.

(Fluorescent Member)

In the present practical example, the first fluorescent body 224 in the first fluorescent member 212 and the second fluorescent body 226 in the second fluorescent member 213 have mutually different wavelength conversion characteristics. It is possible to adopt various combinations of different wavelength conversion characteristics of this kind. In the present practical example, similarly to the cases of the first practical example and the second practical example, a combination of three types of fluorescent body, namely, a red fluorescent body, a green fluorescent body and a blue fluorescent body, is used in both the first fluorescent body 224 and the second fluorescent body 226.

The wavelength of the near-ultraviolet light emitted by the four first LED chips 206 is converted respectively into red light, green light and blue light by the red fluorescent body, green fluorescent body and blue fluorescent body which are held in distributed fashion as the first fluorescent body 224 inside the first fluorescent member 212, and white light obtained by combining the red light, green light and blue light is radiated from the upper surface of the first fluorescent member 212, in other words, the first light-emitting surface 212a. Furthermore, the wavelength of the near-ultraviolet light emitted by the four second LED chips 207 is converted respectively into red light, green light and blue light by the red fluorescent body, green fluorescent body and blue fluorescent body which are held in distributed fashion as the second fluorescent body 226 inside the second fluorescent member 213, and white light obtained by combining the red light, green light and blue light is radiated from the upper surface of the second fluorescent member 213, in other words, the second light-emitting surface 213a.

Here, the mixing ratios of the red fluorescent body, the green fluorescent body and the blue fluorescent body are different in the first fluorescent body 224 and the second fluorescent body 226, and the first color temperature T1 of the white light radiated from the first light-emitting surface 212a and the second color temperature T2 of the white light radiated from the second light-emitting surface 213a are mutually different. In other words, the white light radiated from the first light-emitting surface 212a corresponds to light of a first chromaticity according to the present invention, and the white light radiated from the second light-emitting surface 213a corresponds to light of a second chromaticity according to the present invention. In the present practical example, for example, the first color temperature T1 is set to be 2500 K, which corresponds to a general warm white bulb color, and the second color temperature T2 is set to 6500 K, which corresponds to a daylight color that is higher than the first color temperature T1. The values of the first color temperature T1 and the second color temperature T2 are not limited to these values, and can be set variously in accordance with the characteristics required in the light-emitting apparatus 201.

Similarly to the cases of the first practical example and the second practical example, the first fluorescent body 224 and the second fluorescent body 226 are not limited to mixtures of a red fluorescent body, a green fluorescent body and a blue fluorescent body such as those of the present practical example. For instance, it is also possible to form a first fluorescent body 224 and a second fluorescent body 226 by mixing a blue fluorescent body and a yellow fluorescent body. In this case, the wavelength of the near-ultraviolet light emitted by the first LED chips 206 is converted into blue light and yellow light by the blue fluorescent body and the yellow fluorescent body held in a distributed fashion as a first fluorescent body 224 inside the first fluorescent member 212, and the white light obtained by combining the blue light and yellow light is radiated from the first light-emitting surface 212a. In the second fluorescent member 213 also, similarly, white light is radiated from the second light-emitting surface 213a by the second fluorescent body 226 converting the wavelength of near-ultraviolet light emitted by the second LED chips 207. In this case also, by altering the mixing ratios of the blue fluorescent body and the yellow fluorescent body in the first fluorescent body 224 and the second fluorescent body 226, the first color temperature T1 of the white light radiated from the first light-emitting surface 212a and the second color temperature T2 of the white light radiated from the second light-emitting surface 213a can be made mutually different.

Moreover, rather than mixing a blue fluorescent body and a yellow fluorescent body as described above, it is also possible to use a blue fluorescent body for the first fluorescent body 224 and to use a yellow fluorescent body for the second fluorescent body 226. In this case, the wavelength of the near-ultraviolet light emitted by the first LED chips 206 is converted into blue light by the first fluorescent body 224, and the wavelength of the near-ultraviolet light emitted by the second LED chips 207 is converted into yellow light by the second fluorescent body 226. Consequently, it is possible to obtain white light of various color temperatures by combining the blue light and yellow light.

Instead of this combination of a blue fluorescent body and a yellow fluorescent body, it is also possible to use a combination of a red fluorescent body and a blue (cyan) fluorescent body in a similar method. In other words, it is possible to mix a red fluorescent body and a blue/green fluorescent body and to use these as a first fluorescent body 224 and a second fluorescent body 226 by altering the mixing ratio thereof, and it is also possible to use a red fluorescent body as the first fluorescent body 224 and to use a blue/green fluorescent body as the second fluorescent body 226.

Moreover, as described previously, it is also possible to use an LED chip which emits light other than near-ultraviolet light, for the first LED chips 206 and the second LED chips 207. For example, if an LED chip which emits blue light is used for the first LED chips 206 and the second LED chips 207, then it is possible to use a mixture of a red fluorescent body which converts the wavelength of the blue light and radiates red light, and a green fluorescent body which converts the wavelength of the blue light and radiates green light, for the first fluorescent body 224 and the second fluorescent body 226.

By adopting a combination of this kind, in the first fluorescent member 212, it is possible to obtain white light by combining the blue light emitted by the first LED chips 206 with the red light radiated by the red fluorescent body and the green light radiated by the green fluorescent body. Furthermore, in the second fluorescent member 213 also, it is possible to obtain white light by combining the blue light emitted by the second LED chips 207 with the red light radiated by the red fluorescent body and the green light radiated by the green fluorescent body. Consequently, by altering the mixing ratio of the red fluorescent body and the green fluorescent body, between the first fluorescent member 212 and the second fluorescent member 213, it is possible to radiate white light of respectively different color temperatures from the first light-emitting surface 212a and the second light-emitting surface 213a, similarly to the present practical example.

In this way, fluorescent bodies of various types can be used in the first fluorescent body 224 and the second fluorescent body 226. Similarly to the cases of the first practical example and the second practical example, the light obtained respectively from the first fluorescent member 212 and the second fluorescent member 213, and the light obtained by combining these is not limited to white light, and the types of the first fluorescent body 224 and the second fluorescent body 226 should be selected appropriately in such a manner that the first chromaticity of the light radiated from the first light-emitting surface 212a and the second chromaticity of the light radiated from the second light-emitting surface 213a are mutually different, in accordance with the chromaticity, brightness, and the like, of the radiated light required in the light-emitting apparatus 201. Concrete examples of the fluorescent bodies and filling materials of various types described above follow the concrete examples stated in relation to the first fluorescent member 14 and the second fluorescent member 15 in the first practical example.

(Light Mixing Member)

As described above, the light mixing member 217 mixes light emitted from the first LED 214 and light emitted from the second LED 215 and radiates the light as combined light. In order to obtain a function of this kind, in the present practical example, the light mixing member 217 holds a light diffusing material 228 in a dispersed fashion in a translucent base material 229 made of a transparent resin, and the light diffusing material 228 diffuses and mixes the light emitted respectively from the first LED 214 and the second LED 215.

The light diffusing material 228 used in the light mixing member 217 desirably adopts a material which minimizes loss upon diffusion of light, and loss of this kind can be suppressed provided that the light is diffused by utilizing refraction of the light. More specifically, glass beads, silica beads, or beads made of transparent resin, such as acrylic or styrene, or the like, are suitable. Furthermore, apart from beads of this kind, it is also possible to use alumina, titania or zirconia, or the like, which has been formed into granules.

On the other hand, the translucent base material 229 used in the light mixing member 217 is desirably a thermoplastic resin, a thermally curable resin, a light-curable resin, or the like, in order to apply the light mixing member 217 using a dispenser, or the like, onto the inside of the projection-shaped frame 216 which is provided on the first surface 202a of the substrate 202. Furthermore, if a LED chip which emits near-ultraviolet light is used for the first LED chips 206 or the second LED chips 207, then there is a possibility that a portion of the near-ultraviolet light emitted by these LED chips will reach the light mixing member 217, and hence it is desirable to use a material having sufficient transparency and durability with respect to the near-ultraviolet light emitted by the first LED chips 206 and the second LED chips 207. Consequently, for the translucent base material 229, it is suitable to use a material similar to the filling material of the first fluorescent member 212 or the second fluorescent member 213 described above. In the present practical example, a transparent resin is used as the translucent base material 229, but it is possible to use a translucent base material 229 which is not transparent, such as a material having a milk white color, for example provided that the material has translucent properties.

By composing the light mixing member 217 as described above, the white light having a first color temperature T1 emitted by the first LED 214 and the white light having a second color temperature T2 emitted by the second LED 215 respectively enter inside the light mixing member 217 and is then diffused and mixed by the light diffusing material 228 which is held in a dispersed fashion by the translucent base material 229. The combined light obtained by mixing the white light of two types in this way is radiated towards the exterior of the light-emitting apparatus 201 from the radiating surface 217a of the light mixing member 217. In this way, the white light of two types having mutually different color temperatures is radiated towards the exterior of the light-emitting apparatus 201 after being mixed by the light diffusing material 228 of the light mixing member 217, and therefore the combined light radiated from the light-emitting apparatus 201 is excellent combined light in which the light of two types is not liable to become separated.

In the present practical example, since the first LED 214 is accommodated inside the first depression 203 formed in the substrate 202, and the second LED 215 is accommodated inside the second depression 204, then there is increased freedom with respect to the shape and size, etc., of the light mixing member 217 which is provided so as to cover the LEDs, and the light-emitting apparatus 201 can be composed compactly. Moreover, in this case, since the openings on the first surface 202a of the substrate 202 have substantially the same shape and surface area in the first depression 203 and the second depression 204, then shape deviation when mixing the white light emitted respectively from the first light-emitting surface 212a and the second light-emitting surface 213a is prevented, and the respective white light can be mixed better.

Moreover, in the present practical example also, a first LED 214 is composed by first LED chips 206 and a first fluorescent member 212 which converts the wavelength of at least a portion of the light emitted by the first LED chips 206, and a second LED 215 is composed by second LED chips 207 and a second fluorescent member 213 which converts the wavelength of at least a portion of the light emitted by the second LED chips 207. Therefore, not only is it possible to minimize power consumption, but it is also possible to obtain combined light having excellent color rendition compared to a case where light emitted by an LED chip is used directly.

Furthermore, in the present practical example, as described above, the first LED chips 206 and the second LED chips 207 are mounted on the substrate 202 by wire bonding. In this case, the metal wires 219, 220, 222 and 223 which protrude upwards beyond the first surface 202a of the substrate 202 respectively from the first light-emitting surface 212a and the second light-emitting surface 213a, are covered by the light mixing member 217 that is provided so as to cover the first light-emitting surface 212a and the second light-emitting surface 213a, and are positioned inside this light mixing member 217. Consequently, there is no need to separately provide coating, members, or the like, for protecting the metal wires 219, 220, 222 and 223.

(Application to Lighting Apparatus)

In the light-emitting apparatus 201 according to the present practical example also, white light of a first color temperature T1 is emitted from the first LED 214, white light of a second color temperature T2, which is higher than the first color temperature T1, is emitted from the second LED 215, and combined light obtained by mixing the white light of two types is radiated from the light-emitting apparatus 201, and therefore it is possible to obtain white light having a desired color temperature between the first color temperature T1 and the second color temperature T2 from the light-emitting apparatus. Consequently, the light-emitting apparatus 201 is suitable as a light source for a lighting apparatus, or the like, in cases where white light of a predetermined desired color temperature is to be obtained, or cases where illuminating light of which color temperature can be adjusted is to be obtained in the lighting apparatus. Therefore, an example of a lighting apparatus is described below, in which the color temperature of the illuminating light can be adjusted between the first color temperature T1 and the second color temperature T2, by using the light-emitting apparatus 201 according to the present practical example as a light source.

Figure 41:
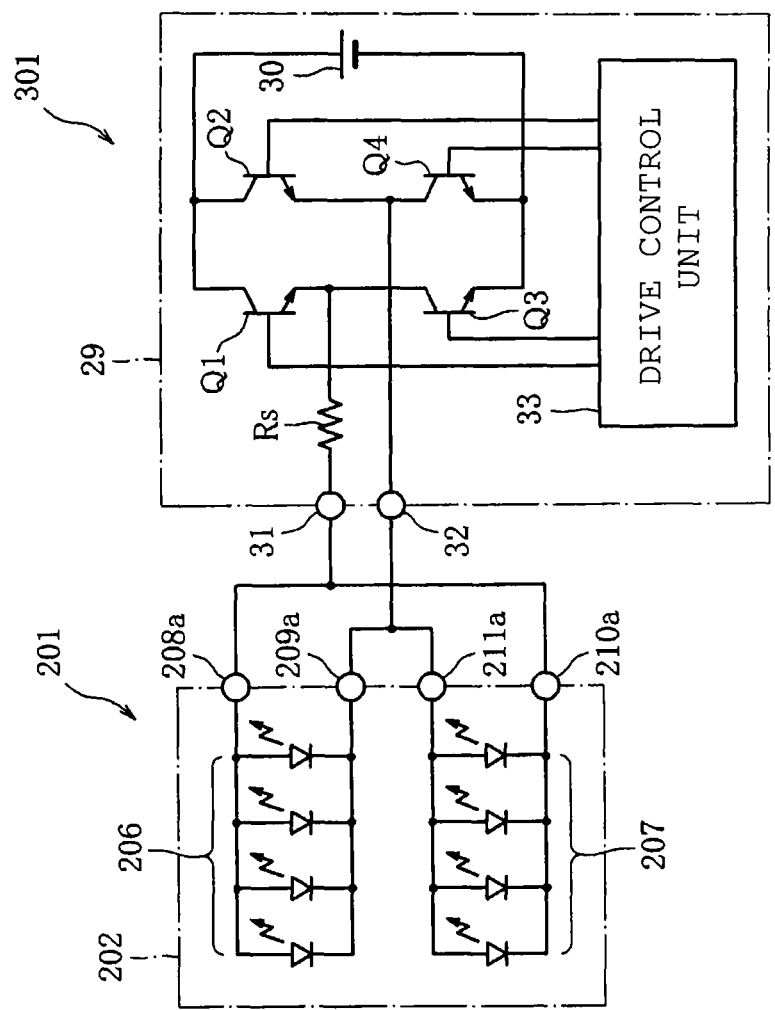
FIG. 41 is a circuit diagram showing a schematic view of an electrical circuit composition of a lighting apparatus in a case where the light-emitting apparatus in FIG. 37 is used in the lighting apparatus.

FIG. 41 is a circuit diagram showing a schematic view of an electrical circuit composition of a lighting apparatus 301 in a case where the light-emitting apparatus 201 according to the present practical example is used in the lighting apparatus 301. As stated previously, by installing the first LED chips 206 and the second LED chips 207 on the substrate 202, the light-emitting apparatus 201 has an electrical circuit composition as shown in FIG. 41. In other words, the four first LED chips 206 are connected mutually in parallel between the two external connection lands 208a and 209a provided on the substrate 202, with the anodes on the side of the external connection land 208a. On the other hand, the four second LED chips 207 are connected mutually in parallel between the two external connection lands 210a and 211a provided on the substrate 202, with the anodes on the side of the external connection land 211a. Therefore, an electric circuit for the light-emitting apparatus 201 according to the present practical example is composed similarly to the light-emitting apparatus 1 according to the first practical example, and the first LED chips 206 and the second LED chips 207 are electrically separated in such a manner that drive current can be supplied independently thereto.

As shown in FIG. 41, in the present practical example also, similarly to the case of the first practical example, the external connection land 208a and the external connection land 210a are electrically connected outside the substrate 202. Furthermore, the external connection land 209a and the external connection land 211a are also electrically connected outside the substrate 202. Therefore, the four first LED chips 206 and the four second LED chips 207 are connected in parallel, with their polarities mutually reversed. A connection of this kind can be achieved by a wiring pattern formed on the substrate 202, rather than outside the substrate 202, as in the present practical example.

By making electrical connections outside the substrate 202 in this way, it is possible to use a drive unit 29 as applied in the first practical example and the second practical example, in the lighting apparatus 301 as well. In order that drive current is supplied respectively to the first LED chips 206 and the second LED chips 207 of the light-emitting apparatus 201 and that this supply of drive current is controlled, the drive unit 29 used in the first practical example and the second practical example is also provided in the lighting apparatus 301. The connection terminal 31 of the drive unit 29 is connected electrically to the external wiring lands 208a and 210a on the side of the light-emitting unit 201, and the connection terminal 32 of the drive unit 29 is connected electrically to the external wiring lands 209a and 211a on the side of the light-emitting unit 201.

By means of the electric circuit composition described above, if the transistors Q1 and Q4 are both switched on by a base signal from the drive control unit 33, then the positive electrode of the drive source 30 is connected to the external connection lands 208a and 210a of the light-emitting apparatus 201 via the transistor Q1 and the resistance Rs, and the negative electrode of the drive source 30 is connected to the external connection lands 209a and 211a of the light-emitting apparatus 201 via the transistor Q4. Consequently, in this case, only the first LED chips 206 emit light, since a forward-direction current flows only in the first LED chips 206 in the light-emitting apparatus 201.

The wavelength of a portion or all of the near-ultraviolet light emitted from the first LED chips 206 due to this supply of current is converted as described above by the first fluorescent body 224 which is held in a distributed fashion in the first depression 203 of the substrate 202, similarly to the first LED chips 206, and white light of a first color temperature T1 is radiated from the first light-emitting surface 212a.

On the other hand, if the transistors Q2 and Q3 are both switched on by the base signal from the drive control unit 33, then the positive electrode of the drive source 30 is connected to the external connection lands 209a and 211a of the light-emitting apparatus 201 via the transistor Q2, and the negative electrode of the drive source 30 is connected to the external connection lands 208a and 210a of the light-emitting apparatus 201 via the resistance Rs and the transistor Q3. Consequently, in this case, only the second LED chips 207 emit light, since a forward-direction current flows only in the second LED chips 207 in the light-emitting apparatus 201.

The wavelength of a portion or all of the near-ultraviolet light emitted from the second LED chips 207 due to this supply of current is converted as described above by the second fluorescent body 226 which is held in a distributed fashion in the second fluorescent member 213 accommodated inside the second depression 204 of the substrate 202, similarly to the second LED chips 207, and white light of a second color temperature T2 is radiated from the second light-emitting surface 213a.

In this way, the drive unit 29 is composed so as to be able to independently control the first drive current supplied to the first LED chips 206 of the light-emitting apparatus 201 which are connected to the drive unit 29, and the second drive current which is supplied to the second LED chips 207. When alternately switching between an on state of the transistors Q1 and Q4 and an on state of the transistors Q2 and Q3, if one on period is made long and the other on period is made short, then the LED chips having the shorter on period receive insufficient drive current and cease to emit light.

Consequently, for example, if the on period of the transistors Q2 and Q3 is made short and a second drive current of a size capable of causing the second LED chips 207 to emit light ceases to be supplied to the second LED chips 207, then only white light from the first fluorescent member 212 is radiated from the light-emitting apparatus 201. On the other hand, if the on period of the transistors Q1 and Q4 is made short and a first drive current of a size capable of causing the first LED chips 206 to emit light ceases to be supplied to the first LED chips 206, then only white light from the second fluorescent member 213 is radiated from the light-emitting apparatus 201. Furthermore, if the on time of the transistors Q1 and Q4 and the on time of the transistors Q2 and Q3 are adjusted, and first and second drive currents of a size capable of respectively causing the first LED chips 206 and the second LED chips 207 to emit light are supplied respectively to the first LED chips 206 and the second LED chips 207, then combined light of white light radiated from the first fluorescent member 212 and white light radiated from the second fluorescent member 213 is radiated from the light-emitting apparatus 201.

In this way, in the present practical example also, similarly to the first practical example and the second practical example, by adjusting the on time t1 and the on time t2, it is possible to obtain, as the illuminating light of the lighting apparatus 301, white light of which color temperature can be changed between the first color temperature T1 and the second color temperature T2. In this case, since the light mixing member 217 is provided in the light-emitting apparatus 201, as stated previously, then the white light of the first color temperature T1 which is radiated from the first light-emitting surface 212a and the white light of a second color temperature T2 which is radiated from the second light-emitting surface 213a are mixed well, and excellent white light in which the two types of white light are not liable to become separated can be obtained as the illuminating light of the lighting apparatus 301. The on time t1 and the on time t2 can be adjusted by using an operating member, or the like, which is provided in the drive unit 29, for example, or can be adjusted automatically in accordance with the ambient environment or a predetermined pattern, or the like.

Furthermore, as described previously, in the present practical example also, since the first LED 214 is constituted by the first LED chips 206 and the first fluorescent member 212, and the second LED 215 is constituted by the second LED chips 207 and the second fluorescent member 213, then it is possible to obtain combined light having excellent color rendition as the illuminating light, compared to a case where light emitted from a LED chip is used directly. Moreover, by using the first LED chips 206 and the second LED chips 207, it is possible to keep the power consumption low, compared to a case where an incandescent lamp, or the like, is used.

(Modification of Light Mixing Member)

In the present practical example, by applying the light mixing member 217 to the inner side of the projection-shaped frame 216 provided on the first surface 202a of the substrate 202 by using a dispenser, or the like, the first light-emitting surface 212a and the second light-emitting surface 213a are covered by the light mixing member 217, but the method of installing the light mixing member 217 on the substrate 202, and the composition of the light mixing member 217 are not limited to this and can adopt various modes. For example, in the present practical example, when applying the light mixing member 217 onto the first surface 202a of the substrate 202, a projection-shaped frame 216 is provided in order to hold the light mixing member 217 at a prescribed position so as to cover the first light-emitting surface 212a and the second light-emitting surface 213a, but the projection-shaped frame 216 can also be omitted in cases where the light mixing member 217 has sufficiently high viscosity during application and does not flow out from the prescribed position on the first surface 202a of the substrate 202.

Figure 42:
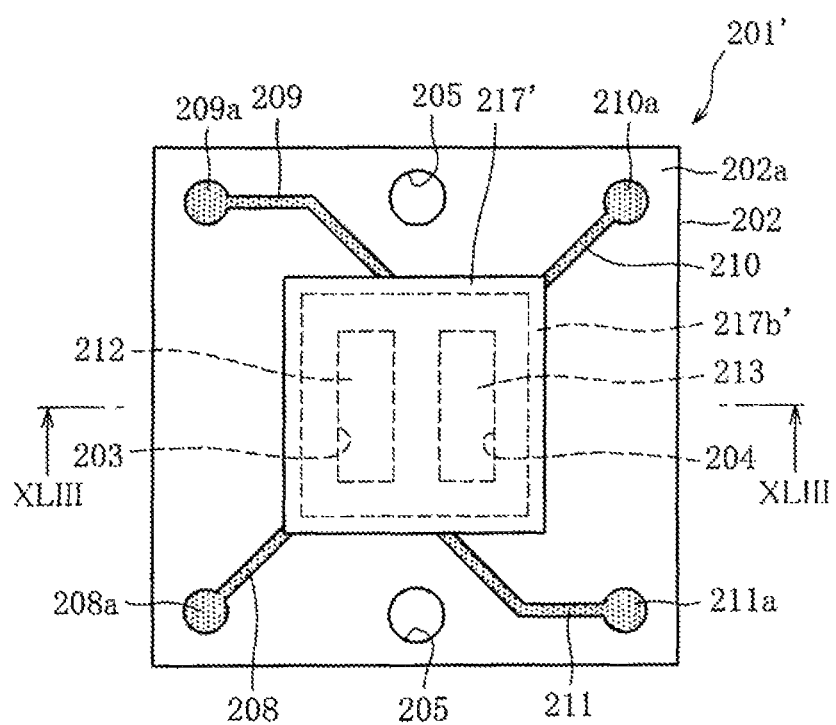
FIG. 42 is a plan diagram showing a schematic view of a light-emitting apparatus which adopts a modification of the light mixing member.
Figure 43:
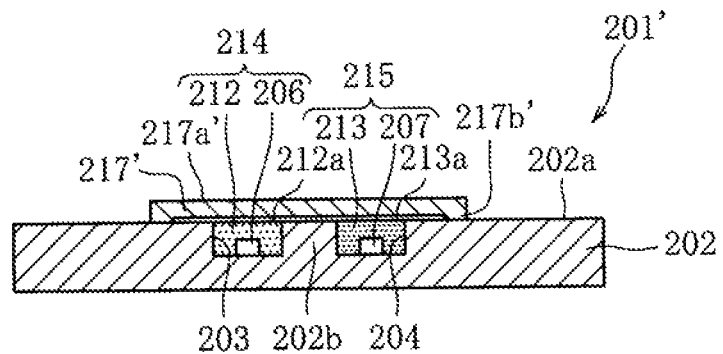
FIG. 43 is a schematic cross-sectional diagram of the light-emitting apparatus along line XLIII-XLIII in FIG. 42.

Moreover, it is also possible to bond a light mixing member previously formed in a plate shape on the first surface 202a of the substrate 202, instead of applying the light mixing member 217 as in the present practical example. FIG. 42 is a plan diagram showing a schematic view of a light-emitting apparatus 201' which uses a light mixing member 217' previously formed in a plate shape, as a modification of this kind, and FIG. 43 is a schematic cross-sectional diagram of a light-emitting apparatus 201' along line XLIII-XLIII in FIG. 42. As shown in FIG. 42 and FIG. 43, since a light mixing member 217' previously formed in a plate shape is used in the present modification, the projection-shaped frame 216 used in the third practical example is not adopted. In this way, the light-emitting apparatus 201' according to the present modification differs from the light-emitting apparatus 201 according to the third practical example in that it has no projection-shaped frame 216 and uses a plate-shaped light mixing member 217', but the composition apart from this is the same as the light-emitting apparatus 201 according to the third practical example. Therefore, in the present modification also, the composition which is the same as the light-emitting apparatus 201 according to the third practical example is labeled with the same reference numerals and detailed description thereof is omitted here.

As shown in FIG. 42 and FIG. 43, the light mixing member 217' is formed in a quadrilateral plate shape and is bonded to the first surface 202a of the substrate 202 using adhesive, or the like, so as to cover the first light-emitting surface 212a which is the upper surface of the first fluorescent member 212 and the second light-emitting surface 213a which is the upper surface of the second fluorescent member 213. Therefore, the light mixing member 217' is situated in a position respectively facing the first light-emitting surface 212a and the second light-emitting surface 213a.

As described in relation to the light-emitting apparatus 201 according to the third practical example, the metal wires 219, 220, 222 and 223 used in the wire bonding of the first LED chips 206 and the second LED chips 207 protrude from the first light-emitting surface 212a and the second light-emitting surface 213a. Therefore, in the present modification, a gap is provided between the light mixing member 217', the first light-emitting surface 212a and the second light-emitting surface 213a, and a projection 217b' is formed along a perimeter edge portion of the surface of the light mixing member 217' which faces the first surface 202a of the substrate 202, so as to prevent interference between the light mixing member 217' and the metal wires 219, 220, 222 and 223. Therefore, the light mixing member 217' is installed on the substrate 202 in a state where the projection 217b' is abutted against the first surface 202a of the substrate 202.

Similarly to the light mixing member 217 according to the third practical example, the light mixing member 217' is constituted by a granular light diffusing material which diffuses and mixes light emitted respectively by the first LED 214 and the second LED 215, and a transparent translucent base material which holds this light diffusing material in a dispersed fashion. The light diffusing material and the translucent base material can use the same materials as the light diffusing material 228 and the translucent base material 229 which constitute the light mixing member 217 according to the third practical example. In the present modification, the light mixing member 217' is formed in a quadrilateral plate shape, but the shape of the light mixing member 217' is not limited to this and may adopt various shapes. Furthermore, the light diffusing material and the translucent base material may also be modified and rearranged variously, similarly to the case of the third practical example.

In the light-emitting apparatus 201' according to the present modification also, since the light mixing member 217' is bonded to the substrate 202 so as to cover the first light-emitting surface 212a and the second light-emitting surface 213a, then white light of a first color temperature T1 which is emitted from the first LED 214 and white light of a second color temperature T2 which is emitted from the second LED 215 enter respectively into the light mixing member 217' and are diffused and mixed by the light diffusing material which is held in a dispersed fashion by the translucent base material. The combined light obtained by mixing the white light of two types is radiated towards the exterior of the light-emitting apparatus 201' from the radiating surface 217a' of the light mixing member 217'. In this way, white light of two types having mutually different color temperatures is radiated towards the exterior of the light-emitting apparatus 201' after being mixed by the light diffusing material of the light mixing member 217', and therefore, similarly to the case of the light-emitting apparatus 201 according to the third practical example, the combined light radiated from the light-emitting apparatus 201' is excellent combined light in which the light of two types is not liable to become separated.

(Modification in Case of Application to Lighting Apparatus)

In the third practical example described above, when the light-emitting apparatus 201 is applied to a lighting apparatus 301, the combined light radiated from the light-emitting apparatus 201 is used directly as illuminating light of the lighting apparatus 301. However, the combined light radiated from the light-emitting apparatus 201 is radiated while being diffused by the light mixing member 217, and therefore it is also possible to radiate the combined light radiated from the light-emitting apparatus 201 as illuminating light after directing the light in a prescribed direction by a light distributing lens, reflector or other light distributing member.

Figure 44:
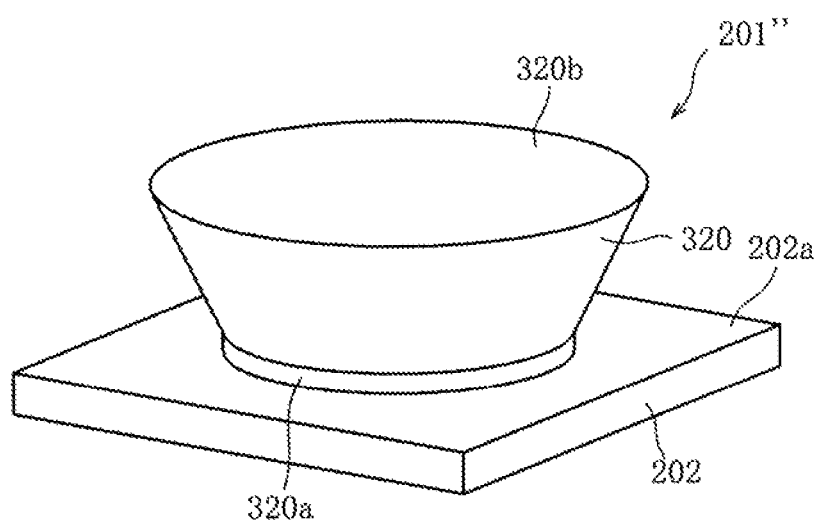
FIG. 44 is a perspective diagram showing a modification of a case where the light-emitting apparatus in FIG. 37 is used in a lighting apparatus.
Figure 45:
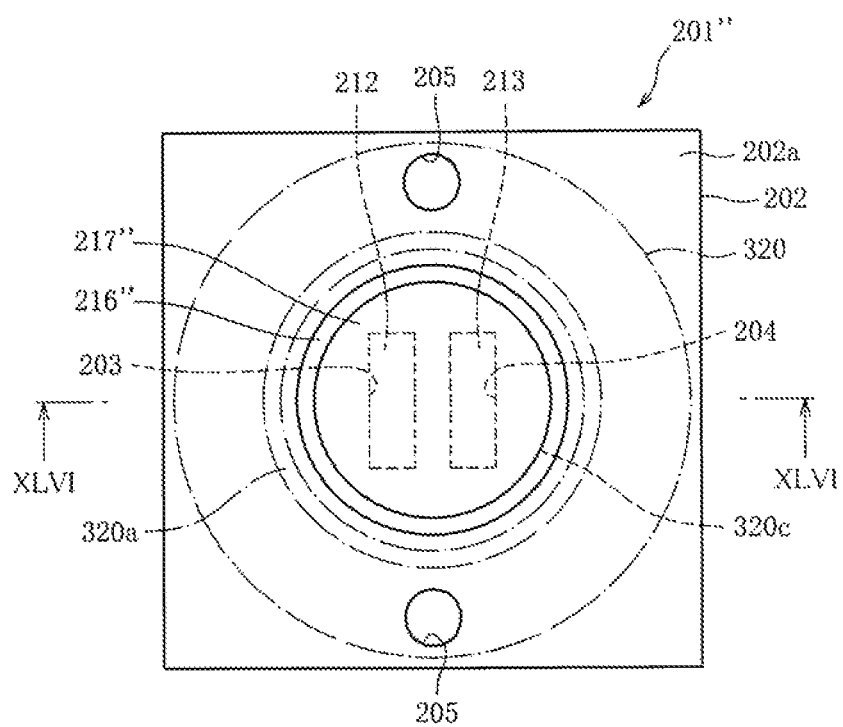
FIG. 45 is a plan diagram showing a schematic view of the modification in FIG. 44.
Figure 46:
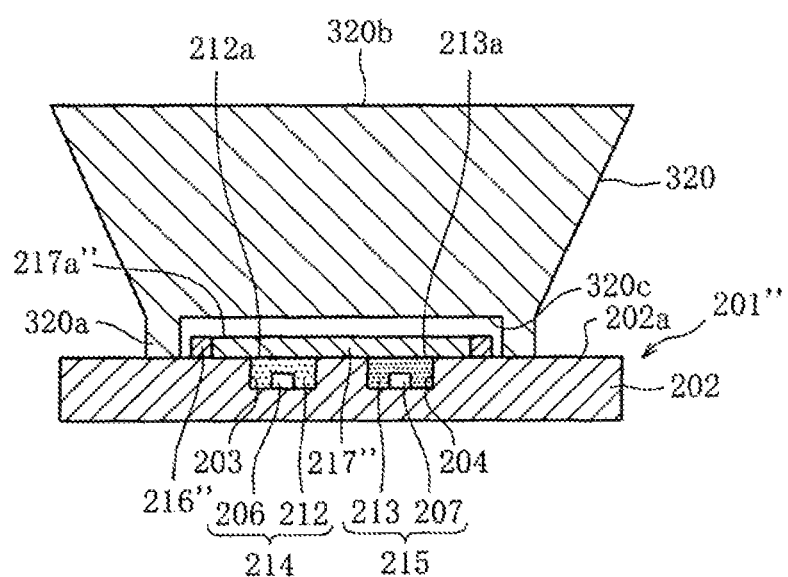
FIG. 46 is a schematic cross-sectional diagram of the light-emitting apparatus and the light distributing lens along line XLVI-XLVI in FIG. 45.

FIG. 44 is a perspective diagram showing a light-emitting apparatus 201" in which a light distributing lens (liquid distributing member) 320 is installed, as a modification of a case of application to a lighting apparatus in this way. Furthermore, FIG. 45 is a plan diagram showing a schematic view of this modification and FIG. 46 is a cross-sectional diagram of the light-emitting apparatus 201" and the light distributing lens 320 along line XLVI-XLVI in FIG. 45. In FIG. 45, for the sake of convenience, the light distributing lens 320 is depicted by single-dotted lines. In the present modification, the light-emitting apparatus 201" is composed similarly to the light-emitting apparatus 201 according to the third practical example, apart from the portion relating to the light mixing member 217" which is described below. Therefore, in the present modification also, the composition which is the same as the light-emitting apparatus 201 according to the third practical example is labeled with the same reference numerals and detailed description thereof is omitted here.

As shown in FIG. 44, in the present modification, the light-emitting apparatus 201" and the light distributing lens 320 are applied in combined fashion to a lighting apparatus. The light distributing lens 320 is formed in a truncated conical shape, from glass or a resin having translucent properties, or the like. This light distributing lens 320 is assembled in the light-emitting apparatus 201" by fixing the abutting section 320a formed in the small diameter-side end section to the first surface 202a of the substrate 202 of the light-emitting apparatus 201" by using adhesive, or the like. Furthermore, the light distributing lens 320 has a light-exiting surface 320b on the large diameter-side and a light-entering surface 320c on the small diameter-side, and the perimeter of the light-entering surface 320c is surrounded by the abutting section 320a. As described above, in this light distributing lens 320, light emitted from the light-emitting unit 201" enters from a light-entering surface 320c and is then radiated from the light-exiting surface 320b, in a predetermined direction and range with respect to this light-exiting surface 320b.

As shown in FIG. 45, in the light-emitting apparatus 201" according to the present modification, a projection-shaped frame 216" is fixed to the first surface 202a of the substrate 202 surrounding the first depression 203 and the second depression 204, with a similar object to the projection-shaped frame 216 according the third practical example. This projection-shaped frame 216" is made of resin, metal, ceramic, or the like, in a circular ring shape, and is fixed to the first surface 202a of the substrate 202 by adhesive, or the like. However, if the projection-shaped frame 216" is made from a material having electrical conductivity, then processing is required to ensure electrical insulation with respect to the wiring pattern formed on the first surface 202a of the substrate 202.

In the present modification, a projection-shaped frame 216" formed in a circular ring shape is adopted, but the shape of the projection-shaped frame 216" is not limited to a circular ring shape and may adopt various shapes, such as a quadrilateral shape similar to that of the projection-shaped projection 216 according to the third practical example. In other words, it is possible to adopt any shape, as long as the frame is provided so as to protrude from the first surface 202a of the substrate 202 and surround the first depression 203 and the second depression 204. Furthermore, the projection-shaped frame 216" may be previously formed in the shape of a frame and fixed to the first surface 202a of the substrate 202, or may be formed by applying a material in the form of a paste made of thermoplastic resin, thermally curable resin, light-curable resin, or the like, to the first surface 202a of the substrate 202 using a dispenser, or the like.

As shown in FIG. 46, the inner side of the projection-shaped frame 216" is filled with a light mixing member 217" that is applied by using a dispenser, or the like. Consequently, the first light-emitting surface 212a and the second light-emitting surface 213a are covered with the light mixing member 217" which is provided at a position facing the first light-emitting surface 212a and the second light-emitting surface 213a in this way. Similarly to the light mixing member 217 according to the third practical example, this light mixing member 217" is provided in order to mix light radiated respectively from the first light-emitting surface 212a and the second light-emitting surface 213a, and the combined light obtained by mixing the light is radiated from a radiating surface 217a". Furthermore, the projection-shaped frame 216" is provided so as to hold the light mixing member 217" at a prescribed position so as to cover the first light-emitting surface 212a and the second light-emitting surface 213a when the light mixing member 217" is applied to the first surface 202a of the substrate 202. As shown in FIG. 46, the light mixing member 217" and the light-entering surface 320c are mutually separated. Therefore, in the first LED 214 and the second LED 215, a gap is provided between the light mixing member 217" and the light-entering surface 320c. Consequently, the light radiated from the light mixing member 217" enters the light-entering surface 320c of the light distributing lens 320 via air which has a lower refractive index than the light distributing lens 320.

Similarly to the light mixing member 217 according to the third practical example, the light mixing member 217" is constituted by a granular light diffusing material which diffuses and mixes light emitted respectively by the first LED 214 and the second LED 215, and a transparent translucent base material which holds this light diffusing material in a dispersed fashion. The light diffusing material and the translucent base material can use the same materials as the light diffusing material 228 and the translucent base material 229 which constitute the light mixing member 217 according to the third practical example. In the present modification also, if the viscosity of the light mixing member 217" during application is sufficiently high and the light mixing member 217" does not flow out from the prescribed position on the first surface 202a of the substrate 202, then the projection-shaped frame 216" can be omitted. Furthermore, the light diffusing material and the translucent base material may also be modified and rearranged variously, similarly to the case of the third practical example.

In the light-emitting apparatus 201" according to the present modification also, since the light mixing member 217" is applied to the substrate 202 so as to cover the first light-emitting surface 212a and the second light-emitting surface 213a, then white light of a first color temperature T1 which is emitted from the first LED 214 and white light of a second color temperature T2 which is emitted from the second LED 215 enter respectively into the light mixing member 217" and are diffused and mixed by the light diffusing material which is held in a dispersed fashion by the translucent base material. The combined light obtained by mixing the white light of two types in this way is radiated towards the exterior of the light-emitting apparatus 201" from the radiating surface 217a" of the light mixing member 217". In this way, white light of two types having mutually different color temperatures is radiated towards the exterior of the light-emitting apparatus 201" after being mixed by the light diffusing material of the light mixing member 217", and therefore, similarly to the case of the light-emitting apparatus 201 according to the third practical example, the combined light radiated from the light-emitting apparatus 201" is excellent combined light in which the light of two types is not liable to become separated.

The light distributing lens 320 which is used in combination with the light-emitting apparatus 201" of this kind is formed in a truncated conical shape by glass or resin having translucent properties, or the like, as described above, and an abutting section 320a forming a ring-shaped wall is formed about the whole circumference of the perimeter edge section of the small diameter-side end section of the light distributing lens 320. This abutting section 320a is abutted against the first surface 202a of the substrate 202 and fixed by adhesive, or the like, when the light distributing lens 320 is installed in the light-emitting apparatus 201". In this case, the abutting section 320a surrounds the projection-shaped frame 216" which is fixed to the first surface 202a of the substrate 202 and the light mixing member 217" filled inside the projection-shaped frame 216", as shown in FIG. 45 and FIG. 46. Consequently, the light-entering surface 320c of the light distributing lens 320 which is situated on the inner side of the abutting section 320a is situated in a position facing the radiating surface 217a" of the light mixing member 217".

By providing a light distributing lens 320 in this way, white light of a first color temperature T1 which is radiated from the first LED 214 and white light of a second color temperature which is radiated from the second LED 215 are mixed by the light mixing member 217" as described above, radiated from the radiating surface 217a" as combined light, and then enter into the light distributing lens 320 via the light-entering surface 320c of the light distributing lens 320. The combined light which has entered into the light distributing lens 320 is radiated as illuminating light of the lighting apparatus towards the exterior of the light distributing lens 320, from the light-exiting surface 320b in the large diameter-side end section of the light distributing lens 320.

As described previously, excellent combined light in which the white light of two types having a first color temperature T1 and a second color temperature T2 is not liable to become separated is obtained from the light-emitting apparatus 201", but this combined light is radiated while being diffused from the radiating surface 217a" of the light mixing member 217". In this case, in the lighting apparatus according to the present modification, since a light distributing lens 320 having a light-entering surface 320c is provided in a position facing the radiating surface 217a", then the combined light radiated from the radiating surface 217a" can be directed efficiently in a predetermined range and direction.

Figure 47:
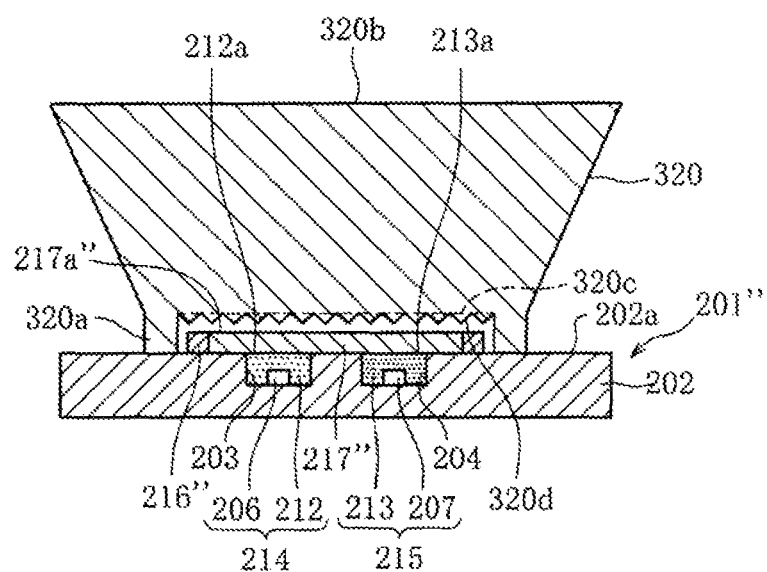
FIG. 47 is a cross-sectional diagram similar to FIG. 46, showing a modification of the light distributing lens.

In this modification, depressions and projections may be provided on at least one of the light-entering surface 320c and the light-exiting surface 320b of the light distributing lens 320. For example, as shown in FIG. 47 which is a cross-sectional diagram similar to FIG. 46, when depressions and projections 320d are formed in the light-entering surface 320c, the white light of a first color temperature T1 radiated from the first LED 214 and the white light of a second color temperature radiated from the second LED 215 are mixed by the light mixing member 217" as described above and are radiated from the radiating surface 217a" as combined light, and upon subsequently entering from the light-entering surface 320c of the light distributing lens 320, is further mixed by the depressions and projections 320d on the light-entering surface 320c. As a result of this, the white light of a first color temperature T1 and the white light of a second color temperature are mixed even better, and the separation of the light of two types in the illuminating light radiated from the lighting apparatus can be prevented even more effectively.

Figure 48:
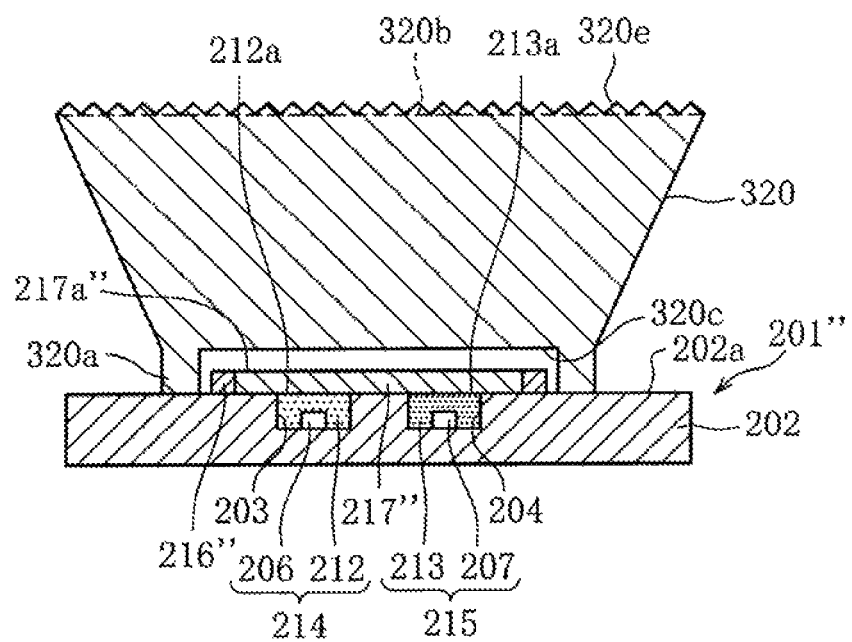
FIG. 48 is a cross-sectional diagram similar to FIG. 46, showing a further modification of the light distributing lens.

Furthermore, as shown in FIG. 48 which is a cross-sectional diagram similar to FIG. 46, when depressions and projections 320e are formed on the light-exiting surface 320b of the light distributing lens 320, the white light of a first color temperature T1 radiated from the first LED 214 and the white light of a second color temperature radiated from the second LED 215 are mixed by the light mixing member 217" as described above and upon subsequently being radiated from the light-exiting surface 320b of the light distributing lens 320, are further mixed by the depressions and projections 320e on the light-exiting surface 320b. As a result of this, the white light of a first color temperature T1 and the white light of a second color temperature are mixed even better, and the separation of the light of two types in the illuminating light radiated from the lighting apparatus can be prevented even more effectively.

Moreover, if depressions and projections 320d and 320e are formed on both the light-entering surface 320c and the light-exiting surface 320b of the light distributing lens 320, then the white light of the first color temperature T1 radiated from the first LED 214 and the white light of a second color temperature radiated from the second LED 215 are mixed by the light mixing member 217" and are then subsequently mixed further two times, upon entering the light distributing lens 320 and upon exiting the light distributing lens 320. As a result of this, separation of the light of two types in the illuminating light radiated from the lighting apparatus can be prevented even more effectively.

The depressions and projections 320d formed on the light-entering surface 320c of the light distributing lens 320 and the depressions and projections 320e formed on the light-exiting surface 320b can be achieved, for instance, by a plurality of projections formed in a hemispherical shape or a plurality of semicircular column projections, or by a plurality of grooves having a V-shaped cross-section, a sawtooth-shaped cross-section or a tooth-shaped cross-section, similarly to the light distributing lens described in the first practical example and modifications thereof given above. Furthermore, instead of hemispherical projections, it is also possible to adopt conical projections, or pyramid-shaped projections, such as triangular pyramid or quadrilateral pyramid-shaped projections, or the like. Moreover, instead of a transparent light distributing lens 320, it is also possible to form a light distributing lens using a colored translucent material, such as a milk white material, or the like.

Figure 49:
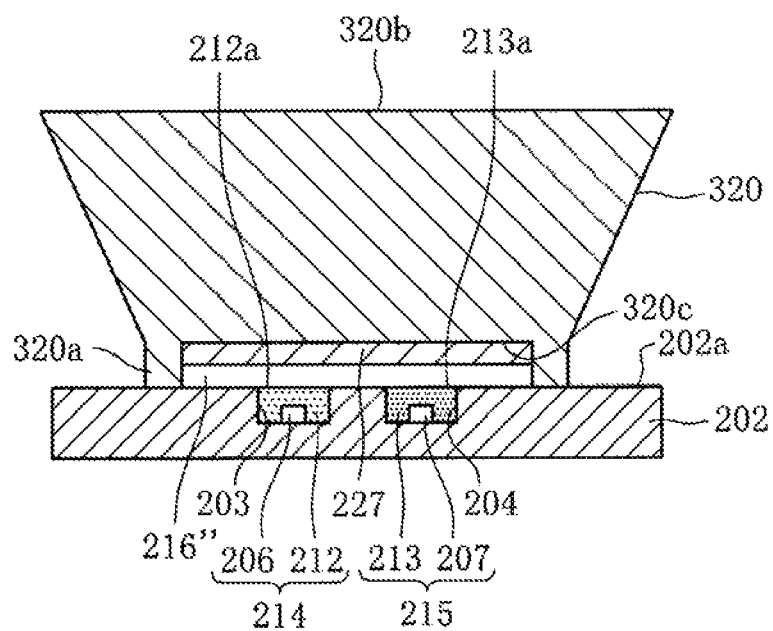
FIG. 49 is a cross-sectional diagram similar to FIG. 46, showing a modification of the light mixing member.

Furthermore, in the various modifications of the third practical example described above, the light mixing member is installed on the side of the light-emitting apparatus, in all cases, but it is also possible to provide the light mixing member on the side of the light distributing lens 320. FIG. 49 shows an example of the composition of a light-emitting apparatus and a light distributing lens 320 of this kind, in a cross-sectional diagram similar to FIG. 46. The composition of the light-emitting apparatus is a similar composition to the modification in FIG. 46, apart from the fact that the light mixing member is not installed, and the composition of the light distributing lens 320 is similar to the modification in FIG. 46.

In the modification in FIG. 49, the light mixing member 227 is applied to the light-entering surface 320c of the light distributing lens 320 by using a dispenser, or the like. Similarly to the light mixing member 217 according to the third practical example, the light mixing member 227 is constituted by a granular light diffusing material which diffuses and mixes light emitted respectively by the first LED 214 and the second LED 215, and a transparent translucent base material which holds this light diffusing material in a dispersed fashion. The light diffusing material and the translucent base material can use the same materials as the light diffusing material 228 and the translucent base material 229 which constitute the light mixing member 217 according to the third practical example. Furthermore, rather than applying the light mixing member to the light-entering surface 320c of the light distributing lens 320, it is also possible to bond a light mixing member formed previously in a plate shape to the light-entering surface 320c.

By composing the light mixing member 227 in this way, in the modification shown in FIG. 49 also, the white light having a first color temperature T1 emitted by the first LED 214 and the white light having a second color temperature T2 emitted by the second LED 215 respectively enter inside the light mixing member 227 and are then diffused and mixed by the light diffusing material which is held in a dispersed fashion by the translucent base material. The combined light obtained by mixing the white light of two types in this way enters into the light distributing lens 320 from the light-entering surface 320c of the light distributing lens 320, and is then radiated as illuminating light of the lighting apparatus towards the exterior of the light distributing lens 320 from the light-exiting surface 320b of the light distributing lens. Consequently, similarly to the case of the light-emitting apparatus 201 of the third practical example, excellent combined light in which the light of two types is not liable to become separated can be obtained as the illuminating light of the lighting apparatus, and furthermore, similarly to the modifications described above, the illuminating light can be directed efficiently in a predetermined range and direction by the light distributing lens 320.

Figure 50:
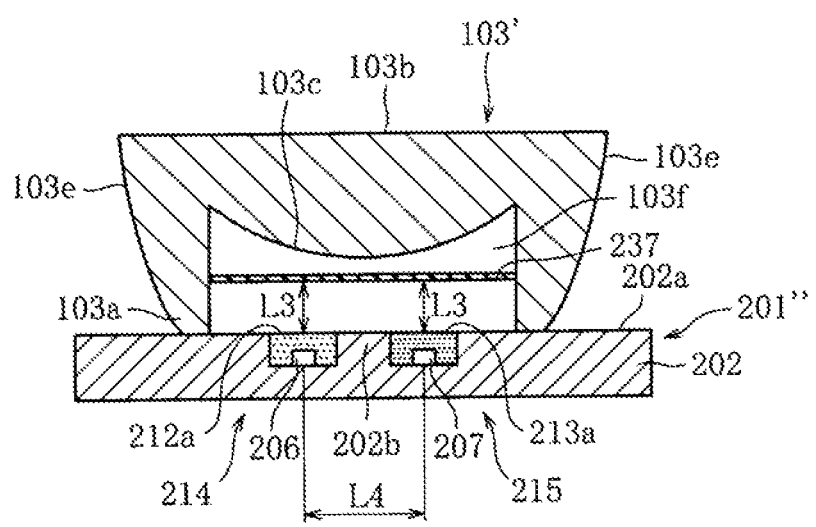
FIG. 50 is a cross-sectional diagram similar to FIG. 46, showing a further modification of the light mixing member.

Furthermore, in the modification shown in FIG. 49 described above, a light distributing lens 320 formed in a truncated conical shape from glass or a resin having translucent properties, or the like, is used, but it is also possible to use the light distributing lens 103 relating to the seventh modification of the first practical example. FIG. 50 shows a cross-sectional diagram similar to FIG. 46 depicting a composition of a case which uses a light distributing lens 103' in which the depressions and projections (sawtooth-shaped grooves 103d) on the side of the light-entering surface 103c are removed from the light distributing lens 103 relating to the seventh modification of the first practical example, and where a light mixing member is provided on the side of the light distributing lens 103'. The composition of the light-emitting apparatus is similar to the modification in FIG. 46, apart from the fact that the light mixing member is installed, and as stated previously, the light distributing lens 103' is a lens in which the depressions and projections (sawtooth-shaped grooves 103d) on the side of the light-entering surface 103c are removed from the light distributing lens 103 relating to the seventh modification of the first practical example. Therefore, the respective constituent members are labeled with the same reference numerals as in the modifications, and detailed description thereof is omitted here.

In the modification shown in FIG. 50, a light mixing member 237 which is formed in a flat plate shape is arranged between the light-entering surface 103c, and the first light-emitting surface 212a and the second light-emitting surface 213a. More specifically, the light mixing member 237 is fitted into an opening 103f in the light distributing lens 103' while being separated from the light-entering surface 103c. More specifically, a prescribed gap is provided between the light mixing member 237, and the first light-emitting surface 212a and the second light-emitting surface 213a, and a prescribed gap is also provided between the light mixing member 237 and the light-entering surface 103c. By arranging the light mixing member 237 in this way, it is possible for light which has entered from the first LED 214 and the second LED 215 and which is radiated from the light mixing member 237 to enter the light-entering surface 103c of the light distributing lens 103' via air which has a low refractive index.

Similarly to the light mixing member 217 according to the third practical example, the light mixing member 237 is constituted by a granular light diffusing material which diffuses and mixes light emitted respectively by the first LED 214 and the second LED 215, and a transparent translucent base material which holds this light diffusing material in a dispersed fashion. The light diffusing material and the translucent base material can use the same materials as the light diffusing material 228 and the translucent base material 229 which constitute the light mixing member 217 according to the third practical example.

In order that the primary light radiated from the first light-emitting surface 212a and the second light-emitting surface 213a is well mixed, the distance from the light-entering surface of the light mixing member 237 to the respective light-emitting sources (in other words, the first LED 214 and the second LED 215) (the distance L3 in FIG. 50) is desirably no less than 0.5 times and no more than 2 times the focal distance of the light distributing lens 103'. More desirably, the distance L3 from the light-entering surface of the light mixing member 237 to the light-emitting sources is set to be no less than 0.5 times and no more than 1.5 times the focal distance of the light distributing lens 103. Even more desirably, the distance L3 from the light-entering surface of the light distributing lens 237 to the light-emitting sources is set so as to be substantially equal to approximately one times the focal distance of the light distributing lens 103', in other words, the distance L3 from the light-entering surface of the light mixing member 237 to the light-emitting sources and the focal distance of the light distributing lens 103'.

Furthermore, in order that the primary light radiated from the first light-emitting surface 212a and the second light-emitting surface 213a is well mixed, the distance L3 from the light-entering surface of the light mixing member 237 to the respective light-emitting sources (in other words, the first LED 214 and the second LED 215) is desirably no less than 0.5 times and no more than 2 times the distance between the two light-emitting sources (the distance L4 in FIG. 50). More desirably, the distance L3 from the light-entering surface of the light mixing member 237 to the light-emitting sources is set to be no less than 0.5 times and no more than 1.5 times the distance L4 between the two light-emitting sources. Even more desirably, the distance L3 from the light-entering surface of the light distributing lens 237 to the light-emitting sources is set so as to be substantially equal to approximately one times the distance L4 between the two light-emitting sources, in other words, the distance L3 from the light-entering surface of the light mixing member 237 to the light-emitting sources and the distance L4 between the two light-emitting sources.

By providing the light mixing member 237 of this kind at the position stated above, in the modification shown in FIG. 50 also, the white light having a first color temperature T1 emitted by the first LED 214 and the white light having a second color temperature T2 emitted by the second LED 215 respectively enter inside the light mixing member 237 and are then diffused and mixed by the light diffusing material which is held in a dispersed fashion by the translucent base material.

The combined light obtained by mixing the white light of two types in this way enters into the light distributing lens 103' from the light-entering surface 103c of the light distributing lens 103', and is then radiated as illuminating light of the lighting apparatus towards the exterior of the light distributing lens 103 from the light-exiting surface 103b of the light distributing lens 103'. Consequently, similarly to the case of the light-emitting apparatus 201 of the third practical example, excellent combined light in which the light of two types is not liable to become separated can be obtained as the illuminating light of the lighting apparatus, and furthermore, similarly to the modifications described above, illuminating light can be directed efficiently in a predetermined range and direction by the light distributing lens 103'.

Furthermore, as a light distributing member for radiating combined light radiated from the light-emitting apparatus as illuminating light while directing the light in a prescribed direction, it is possible to use the first practical example and the modifications thereof, instead of the light distributing lens 103' described above. In a case of this kind, if the combined light radiated from the light-emitting apparatus enters from the small diameter side and is radiated from the large diameter side, then the combined light can be directed in a desired range and direction.

Figure 51:
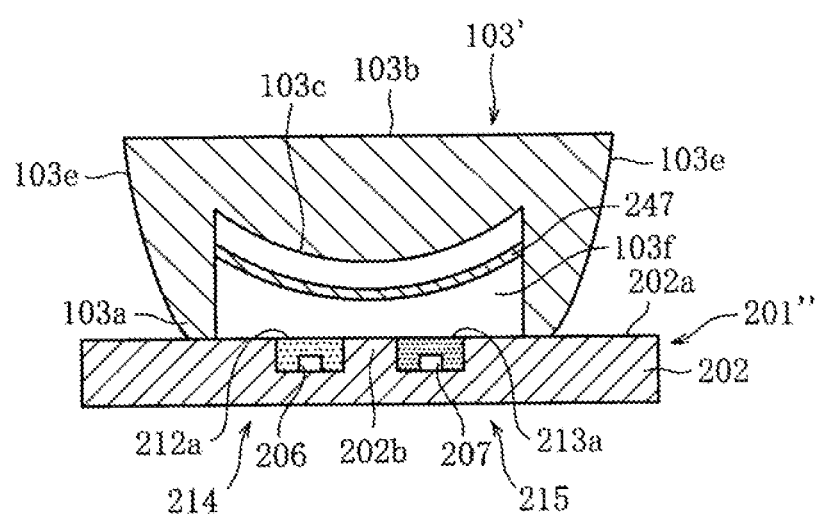
FIG. 51 is a cross-sectional diagram similar to FIG. 46, showing a further modification of the light mixing member.

In the modification in FIG. 50, the light mixing member 237 is formed in a flat plate shape, but the invention is not limited to this, and the light mixing member 237 can be formed in various shapes. For example, the light mixing member can be formed so as to have the same curvature as the light-entering surface of the light distributing lens 103'. FIG. 51 shows the composition of the light-emitting apparatus and the light distributing lens 103' when using a light mixing member of this kind, in a cross-sectional diagram similar to FIG. 46. The composition of the light-emitting apparatus is similar to the modification in FIG. 46, apart from the fact that the light mixing member is installed, and as stated previously, the light distributing lens 103' is a lens in which the depressions and projections (sawtooth-shaped grooves 103d) on the side of the light-entering surface 103c are removed from the light distributing lens 103 relating to the seventh modification of the first practical example. Therefore, the respective constituent members are labeled with the same reference numerals as in the modifications, and detailed description thereof is omitted here.

In the modification in FIG. 51, a light mixing member 247 which is formed so as to have the same curvature as the light-entering surface 103c of the light distributing lens 103' is arranged between the light-entering surface 103c, and the first light-emitting surface 212a and the second light-emitting surface 213a. More specifically, the light mixing member 247 is fitted into an opening 103f in the light distributing lens 103' while being separated from the light-entering surface 103c. More specifically, a prescribed gap is provided between the light mixing member 247, and the first light-emitting surface 212a and the second light-emitting surface 213a, and a prescribed gap is also provided between the light mixing member 247 and the light-entering surface 103c. By arranging the light mixing member 247 in this way, it is possible for light which has entered from the first LED 214 and the second LED 215 and which is radiated from the light mixing member 247 to enter the light-entering surface 103c of the light distributing lens 103' via air which has a low refractive index. Furthermore, since the light mixing member 247 is formed so as to have the same curvature as the light-entering surface 103c of the light distributing lens 103', then the primary light on the light mixing member 247 (the light emitted respectively by the first LED 214 and the second LED 215) can be mixed better.

Similarly to the light mixing member 217 according to the third practical example, the light mixing member 247 is constituted by a granular light diffusing material which diffuses and mixes light emitted respectively by the first LED 214 and the second LED 215, and a transparent translucent base material which holds this light diffusing material in a dispersed fashion. The light diffusing material and the translucent base material can use the same materials as the light diffusing material 228 and the translucent base material 229 which constitute the light mixing member 217 according to the third practical example.

Furthermore, if a light mixing member 247 of this kind is used, then the distance from the light-entering surface of the light mixing member 247 to the light-emitting sources (in other words, the first LED 214 and the second LED 215) is desirably no less than 0.5 times and no more than 2 times the focal distance of the light distributing lens 103, and more desirably, no less than 0.5 times and no more than 1.5 times, and especially desirably, approximately one times the focal distance of the light distributing lens 103'. By adopting this composition, the primary light radiated from the first light-emitting surface 212a and the second light-emitting surface 213a can be mixed well.

Furthermore, if a light mixing member 247 of this kind is used, then the distance from the light-entering surface of the light mixing member 247 to the light-emitting sources (in other words, the first LED 214 and the second LED 215) is desirably no less than 0.5 times and no more than 2 times the distance between the two light-emitting sources, and more desirably, no less than 0.5 times and no more than 1.5 times, and especially desirably, approximately one times the distance between the two light-emitting sources. By adopting this composition, the primary light radiated from the first light-emitting surface 212a and the second light-emitting surface 213a can be mixed well.

Furthermore, as a light distributing member for radiating combined light radiated from the light-emitting apparatus as illuminating light while directing the combined light in a prescribed direction, it is possible to use the first practical example and the modifications thereof, instead of the light distributing lens 103' described above. In a case of this kind also, if the combined light radiated from the light-emitting apparatus enters from the small diameter side and is radiated from the large diameter side, then the combined light can be directed in a desired range and direction.

Figure 52:
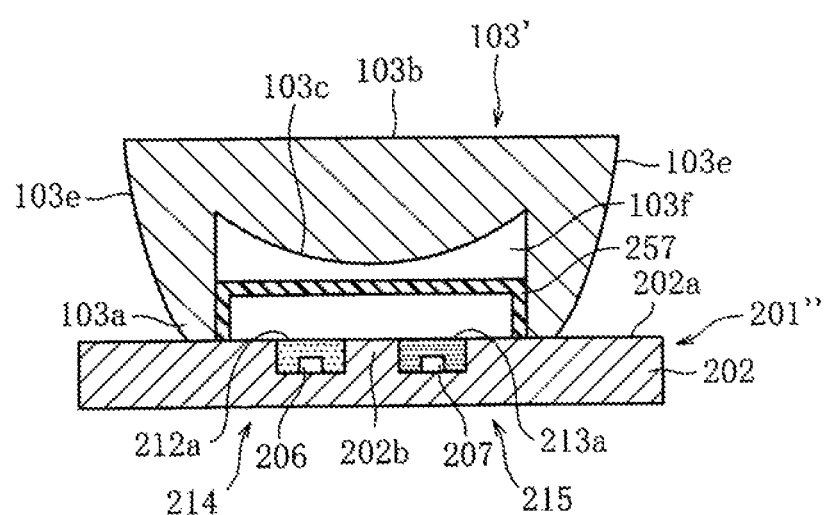
FIG. 52 is a cross-sectional diagram similar to FIG. 46, showing a further modification of the light mixing member.

In the modification in FIG. 50, the light mixing member 237 is formed in a flat plate shape, but the invention is not limited to this, and the light mixing member 237 can be formed in various shapes. For instance, the light mixing member can be formed in a cup shape. FIG. 52 shows the composition of the light-emitting apparatus and the light distributing lens 103' when using a light mixing member of this kind, in a cross-sectional diagram similar to FIG. 46. The composition of the light-emitting apparatus is similar to the modification in FIG. 46, apart from the fact that the light mixing member is installed, and as stated previously, the light distributing lens 103' is a lens in which the depressions and projections (sawtooth-shaped grooves 103d) on the side of the light-entering surface 103c are removed from the light distributing lens 103 relating to the seventh modification of the first practical example. Therefore, the respective constituent members are labeled with the same reference numerals as in the modifications, and detailed description thereof is omitted here.

In the modification in FIG. 52, the light mixing member 257 formed in a cap shape is fitted into an opening 103f of the light distributing lens 103', while being separated from the light-entering surface 103c of the light distributing lens 103'. More specifically, the bottom surface of the cup-shaped light mixing member 257 is separated from the light-entering surface 103c, but the bottom surface of the cap-shaped light mixing member 257 makes tight contact with the side surfaces of the opening 103f. Furthermore, a prescribed gap is provided between the light mixing member 257, and the first light-emitting surface 212a and the second light-emitting surface 213a, and a prescribed gap is also provided between the light mixing member 257 and the light-entering surface 103c. By arranging the light mixing member 257 in this way, it is possible for light which has entered from the first LED 214 and the second LED 215 and which is radiated from the light mixing member 257 to enter the light-entering surface 103c of the light distributing lens 103' via air which has a low refractive index. Since the cap-shaped light mixing member 257 is arranged so as to fill in the opening 103f of the light distributing lens 103', then the primary light which is radiated from the side surfaces of the opening 103f and then enters into the light distributing lens 103' can also be mixed well.

Similarly to the light mixing member 217 according to the third practical example, the light mixing member 257 is constituted by a granular light diffusing material which diffuses and mixes light emitted respectively by the first LED 214 and the second LED 215, and a transparent translucent base material which holds this light diffusing material in a dispersed fashion. The light diffusing material and the translucent base material can use the same materials as the light diffusing material 228 and the translucent base material 229 which constitute the light mixing member 217 according to the third practical example.

Furthermore, if a light mixing member 257 of this kind is used, then the distance from the light-entering surface of the light mixing member 257 to the light-emitting sources (in other words, the first LED 214 and the second LED 215) is desirably no less than 0.5 times and no more than 2 times the focal distance of the light distributing lens 103, and more desirably, no less than 0.5 times and no more than 1.5 times, and especially desirably, approximately one times the focal distance of the light distributing lens 103'. By adopting this composition, the primary light radiated from the first light-emitting surface 212a and the second light-emitting surface 213a can be mixed well.

Furthermore, if a light mixing member 257 of this kind is used, then the distance from the light-entering surface of the light mixing member 257 to the light-emitting sources (in other words, the first LED 214 and the second LED 215) is desirably no less than 0.5 times and no more than 2 times the distance between the two light-emitting sources, and more desirably, no less than 0.5 times and no more than 1.5 times, and especially desirably, approximately one times the distance between the two light-emitting sources. By adopting this composition, the primary light radiated from the first light-emitting surface 212a and the second light-emitting surface 213a can be mixed well.

The shape of the light mixing member 257 is not limited to a square U-shaped cross-section such as that shown in FIG. 52, and may be a round U-shaped cross-section, for example.

Furthermore, as a light distributing member for radiating the combined light radiated from the light-emitting apparatus, as illuminating light, while directing the combined light in a prescribed direction, it is possible to use a reflector having an outer shape formed in a truncated conical tube shape and having a reflective surface on an inner wall surface thereof, as a light distributing member, instead of the light distributing lens 320 described above. In a case where a reflector of this kind is used as well, if the combined light radiated from the light-emitting apparatus enters from the small diameter side and is radiated from the large diameter side, then the combined light can be directed in a desired range and direction.

Figure 53:
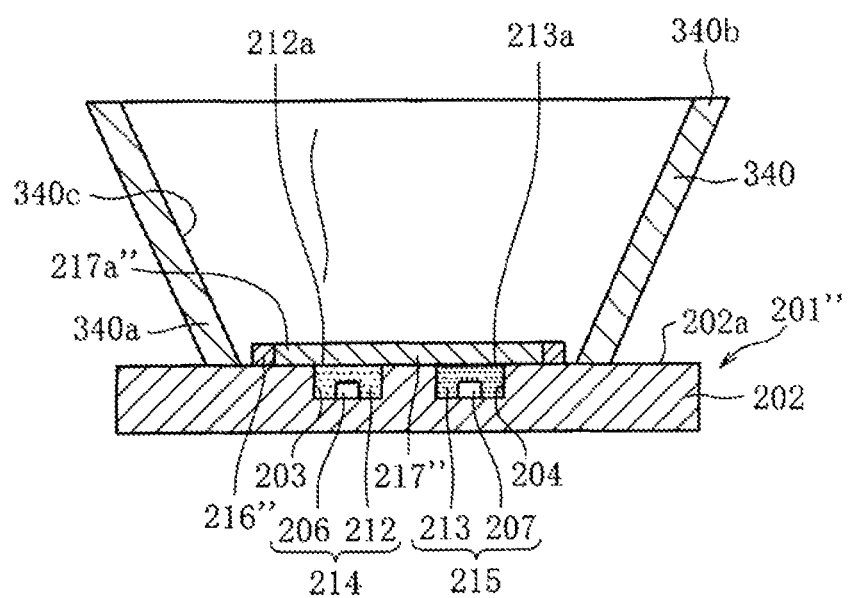
FIG. 53 is a cross-sectional diagram similar to FIG. 46, showing a modification which uses a reflector instead of a light distributing lens.

FIG. 53 shows an example of the composition in a case where a reflector 340 of this kind is used instead of a light distributing lens 320, similarly to the cross-sectional diagram in FIG. 46. In the modification in FIG. 53, a reflector 340 is installed in a light-emitting apparatus 201" similar to the example in FIG. 46. As shown in FIG. 53, a small diameter-side end section 340a of the reflector 340 is fixed by adhesive, or the like, to the first surface 202a of the substrate 202, as well as surrounding the light mixing member 217", and forms an entering section where the light radiated from the light mixing member 217" enters. On the other hand, a large diameter-side end section 340b of the reflector 340 forms an exiting section from which light that has entered from the entering section is radiated in a prescribed range and direction. Consequently, the opening surface which is surrounded by the small diameter-side end section 340a forms a light-entering surface of the reflector 340, and the opening surface which is surrounded by the large diameter-side end section 340b forms a light-exiting surface of the reflector 340.

By providing a reflector 340 in this way, white light of a first color temperature T1 which is radiated from the first LED 214 and white light of a second color temperature which is radiated from the second LED 215 are mixed by the light mixing member 217" as described above, radiated from the radiating surface 217a" of the light mixing member 217" as combined light, and then enter into the reflector 340 via the small diameter-side end section 340a. The combined light which has entered into the reflector 340 is directed in a predetermined range and direction by the inner wall surfaces 340c of the reflector 340, and is radiated as illuminating light of the lighting apparatus towards the exterior of the reflector 340, from the large diameter-side end section 340b.

As described previously, excellent combined light in which the white light of two types having a first color temperature T1 and a second color temperature T2 is not liable to become separated is obtained from the light-emitting apparatus 201", but this combined light is radiated while being diffused from the radiating surface 217a" of the light mixing member 217". In this case, in the lighting apparatus according to the present modification, a reflector 340 is provided so as to surround the light mixing member 217", and therefore the combined light radiated from the radiating surface 217a" can be directed efficiently in a predetermined range and direction.

When using a reflector 340 of this kind also, similarly to the modification in FIG. 49 described above, it is also possible to provide a previously formed light mixing member on the side of the reflector 340. In this case, the light mixing member may be provided on or in the vicinity of the small diameter-side end section 340a of the reflector 340, for example, so as to fit against the inner wall surfaces 340c, or may be provided on or in the vicinity of the large diameter-side end section 340b of the reflector 340, so as to fit against the inner wall surfaces 340c. Moreover, the light mixing member may also be provided in an intermediate portion between the large diameter-side end section 340a and the large diameter-side end section 340b, so as to fit against the inner wall surfaces 340c.

Fourth Practical Example

In the light-emitting unit 201 according to the third practical example, a first LED 214 and a second LED 215 which are a first light-emitting source and a second light-emitting source of the present invention are composed by using a first depression 203 and a second depression 204 that are formed in a substrate 202. However, the composition of the light-emitting apparatus is not limited to this and can be modified or replaced variously. Therefore, one further example of a light-emitting apparatus is described below as a fourth practical example of the present invention.

(General Composition of Light-Emitting Apparatus)

Figure 54:
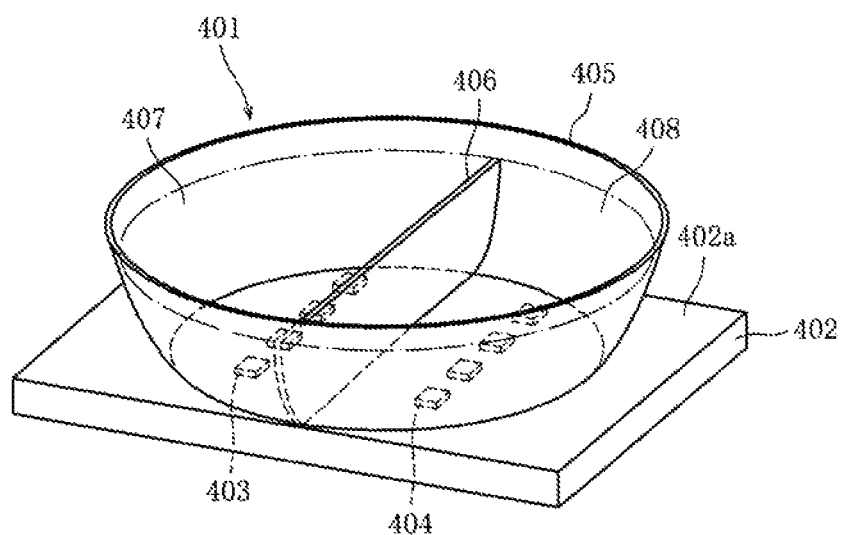
FIG. 54 is a perspective diagram showing a schematic composition of a light-emitting apparatus relating to a fourth practical example of the present invention.
Figure 55:
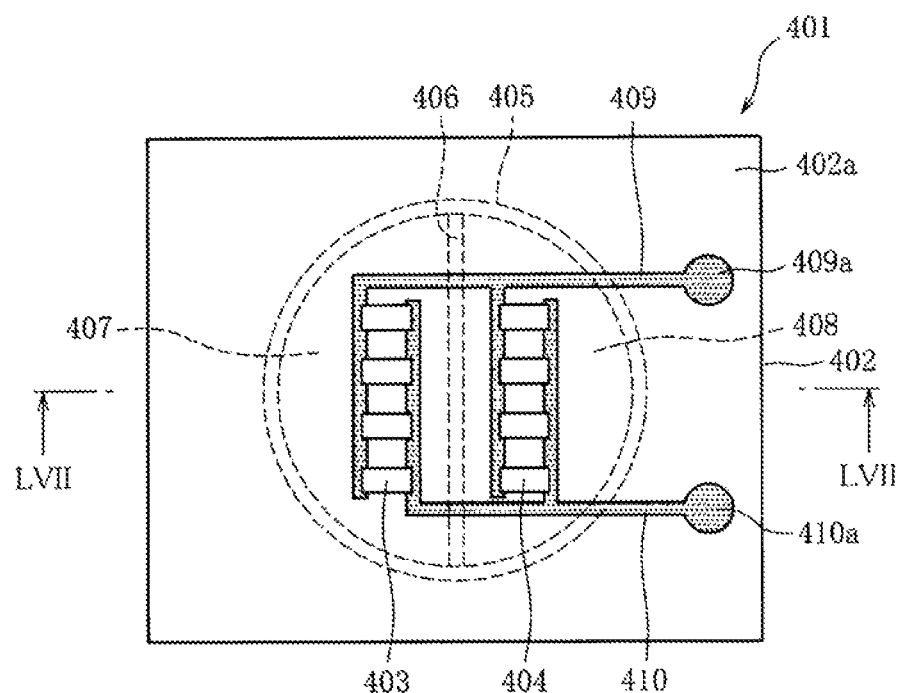
FIG. 55 is a plan diagram showing a schematic view of the light-emitting apparatus in FIG. 54.
Figure 56:
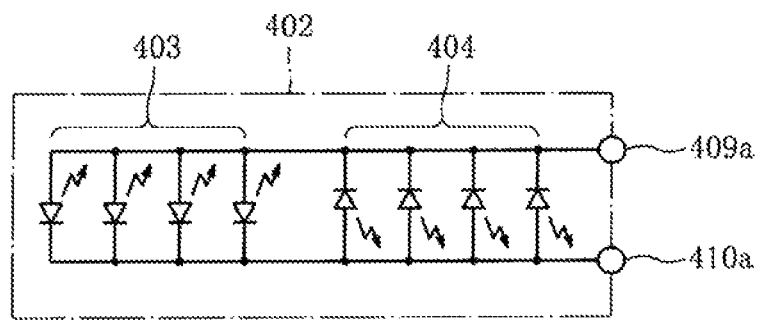
FIG. 56 is a circuit diagram showing an electrical circuit composition of the light-emitting apparatus in FIG. 54.
Figure 57:
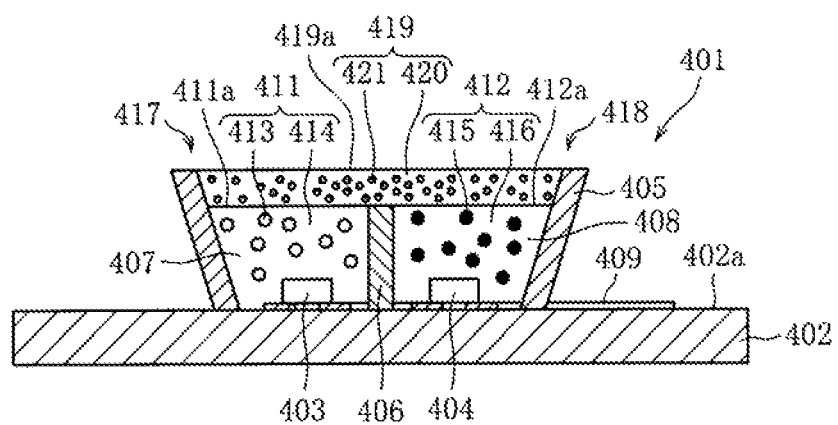
FIG. 57 is a schematic cross-sectional diagram of the light-emitting apparatus along line LVII-LVII in FIG. 55.

FIG. 54 is a perspective diagram showing a schematic composition of a light-emitting apparatus 401 which is used in a light-emitting apparatus relating to the present practical example, and FIG. 55 is a plan diagram showing a schematic view of the light-emitting apparatus 401. Furthermore, FIG. 56 is a circuit diagram showing an electrical circuit composition of the light-emitting apparatus 401, and FIG. 57 is a cross-sectional diagram of the light-emitting apparatus 401 along line LVII-LVII in FIG. 55. As shown in FIG. 54 and FIG. 55, the light-emitting apparatus 401 includes a substrate 402 made of alumina type ceramic which has excellent electrical insulating properties and good heat radiating properties, and four first LED chips 403 and four second LED chips 404 are installed on a chip mounting surface 402a of this substrate 402.

Moreover, a ring-shaped, truncated conical reflector 405 is provided on the chip mounting surface 402a of the substrate 402 so as to surround the first LED chips 403 and the second LED chips 404. The inner side of the reflector 405 is separated by a separating member 406 into a first region 407 and a second region 408. However, as shown in FIG. 54, the height of the partitioning member 406 is lower than the height of the reflector 405, and the first region 407 and the second region 408 are united inside the reflector 405 above the partitioning member 406.

The reflector 405 and the partitioning member 406 can be made of resin, metal, ceramic, or the like, and are fixed to the substrate 402 by using adhesive, or the like. However, if a material having electrical conductivity is used for the reflector 405 and the partitioning member 406, then a process for imparting electrical insulating properties to the wiring pattern, which is described below, becomes necessary.

The number of the first LED chips 403 and the second LED chips 404 in the present practical example is just one example and can be increased or decreased according to requirements. Consequently, it is also possible to provide one first LED chip 403 and one second LED chip 404, and for the numbers of the respective chips to be different. Moreover, the material of the substrate 402 is not limited to an alumina type ceramic as used in the present practical example, and it is possible to use various materials suited to the substrate 402, for example, a material selected from ceramic, resin, glass epoxy, or a composite resin which contains filler, or the like. Alternatively, in improving the light emission efficiency of the light-emitting apparatus 401 by raising the reflectivity of light at the chip mounting surface 402a of the substrate 402, it is desirable to use a silicone resin which includes white pigment, such as alumina powder, silica powder, magnesium oxide, titanium oxide, and the like. Moreover, in improving the heat radiating properties, it is also possible to use a metal substrate such as a copper substrate, an alumina substrate, or the like. If a metal substrate is used, however, it is necessary to form a wiring pattern on the wiring substrate via an electrical insulation.

Furthermore, the shapes of the reflector 405 and the partitioning member 406 described above are an example, and can be modified variously. For example, instead of a previously formed reflector 405 and partitioning member 406, a ring-shaped wall section corresponding to a reflector 405 may be formed on the chip mounting surface 402a of the substrate 402, using a dispenser, or the like, and a partitioning wall corresponding to a partitioning member 406 may then be formed. In this case, the material used for the ring-shaped wall section and the partitioning wall section may be, for instance, a thermally curable resin material or a UV-curable resin material, or the like, in the form of a paste, and a silicone resin containing an inorganic filler is desirable.

As shown in FIG. 54 and FIG. 55, four first LED chips 403 are arranged in one row parallel to the direction of extension of the partitioning member 406, in a first region 407 inside the reflector 405, and four second LED chips 404 are arranged in one row in the same direction as the direction of arrangement of the first LED chips 403, in a second region 408 inside the reflector 405. In FIG. 55, the reflector 405 and the partitioning member 406 are depicted by dotted lines, for the sake of clarity.

A wiring pattern 409 and a wiring pattern 410 for supplying drive current respectively to the first LED chips 403 and the second LED chips 404 are formed on the chip mounting surface 402a of the substrate 402, as shown in FIG. 55. An external connection land 409a for external connection is formed in one end section of the wiring pattern 409, and the other end section of the wiring pattern 409 is provided extending along the direction of arrangement of the first LED chips 403, as shown in FIG. 55. Furthermore, the wiring pattern 409 is branched along the direction of arrangement of the second LED chips 404 from an intermediate portion positioned in the second region 408 inside the reflector 405, as shown in FIG. 55.

On the other hand, an external connection land 410a for external connection is formed in one end section of the wiring pattern 410, and the other end section of the wiring pattern 410 is provided extending along the direction of arrangement of the first LED chips 403, as shown in FIG. 55. Furthermore, the wiring pattern 410 is branched along the direction of arrangement of the second LED chips 404 from an intermediate portion positioned in the second region 408 inside the reflector 405, as shown in FIG. 55.

As shown in FIG. 55, the four first LED chips 403 are connected mutually in parallel between the wiring pattern 409 and the wiring pattern 410, each with the anode of the chip on the side of the wiring pattern 409. Furthermore, the four second LED chips 404 are connected mutually in parallel between the wiring pattern 409 and the wiring pattern 410, each with the cathode of the chip on the side of the wiring pattern 409. By mounting the first LED chips 403 and the second LED chips 404 on the substrate 402 in this way, an electrical circuit such as that in FIG. 56 is composed in the light-emitting unit 401. In other words, the first LED chips 403 and the second LED chips 404 are connected in parallel between the external connection land 409a and the external connection land 410a, with their polarities mutually reversed.

More specifically, two electrodes for supplying drive current (not illustrated) are provided on the substrate 402 side surface of each of the first LED chips 403 and the second LED chips 404. One electrode (p electrode) of each first LED chip 403 is connected to the wiring pattern 409, and the other electrode (n electrode) thereof is connected to the wiring pattern 410. Furthermore, one electrode (p electrode) of each second LED chip 404 is connected to the wiring pattern 410, and the other electrode (n electrode) thereof is connected to the wiring pattern 409.

This mounting of the first LED chips 403 and the second LED chips 404 and the connection of the respective electrodes to the wiring patterns 409 and 410 uses flip-chip mounting, and is performed by eutectic soldering via metal bumps (not illustrated). The method of mounting the first LED chips 403 and the second LED chips 404 on the substrate 402 is not limited to this, and a suitable method can be selected in accordance with the type and structure of the LED chips, and so on. For instance, it is also possible to use double-wire bonding in which the first LED chips 403 and the second LED chips 404 are respectively bonded and fixed at prescribed positions on the substrate 402 as described above, and then the respective electrodes of the first LED chips 403 and the second LED chips 404 are connected to the corresponding wiring patterns by wire bonding, and it is also possible to use single-wire bonding in which one electrode is bonded to a wiring pattern as described above and the other electrode is connected to the wiring pattern by wire bonding.

As shown in FIG. 57, a first fluorescent member (first wavelength conversion member) 411 is accommodated in the first region 407 inside the reflector 405, to the height of the partitioning member 406, so as to respectively cover the four first LED chips 403. Furthermore, a second fluorescent member (second wavelength conversion member) 412 is similarly accommodated in the second region 408 inside the reflector 405, to the height of the partitioning member 406, so as to respectively cover the four second LED chips 404. In FIG. 54, for the sake of convenience, the first fluorescent member 411 and the second fluorescent member 412 are not depicted.

The first fluorescent member 411 is composed similarly to the first fluorescent member 14 of the first practical example, the first fluorescent member 111 of the second practical example and the first fluorescent member 212 of the third practical example described above. In other words, the first fluorescent member 411 is constituted by a first fluorescent body 413 which is excited by the light emitted by the first LED chips 403 and radiates light of a different wavelength from the light emitted by the first LED chips 403, and a filling material 414 which holds the first fluorescent body 413 in a dispersed fashion. The second fluorescent member 412 is composed similarly to the second fluorescent member 15 of the first practical example, the first fluorescent member 112 of the second practical example and the first fluorescent member 213 of the third practical example described above. In other words, the second fluorescent member 412 is constituted by a second fluorescent body 415 which is excited by the light emitted by the second LED chips 404 and radiates light of a different wavelength from the light emitted by the second LED chips 404, and a filling material 416 which holds the second fluorescent body 415 in a dispersed fashion.

Consequently, in the present practical example, the combination of the first LED chips 403 and the first fluorescent member 411 constitutes a first LED 417 which corresponds to a first light-emitting source of the present invention. Furthermore, the combination of the second LED chips 404 and the second fluorescent member 412 constitutes a second LED 418, as well as corresponding to a second light-emitting source of the present invention. Furthermore, the upper surface 411a of the first fluorescent member 411 corresponds to a first light-emitting surface of the present invention, and the upper surface 412a of the second fluorescent member 412 corresponds to a second light-emitting surface of the present invention. Therefore, below, the upper surface 411a of the first fluorescent member 411 is called the first light-emitting surface and the upper surface 412a of the second fluorescent member 412 is called the second light-emitting surface.

As described above, since the first fluorescent member 411 is accommodated inside the first region 407 in the reflector 405, and the second fluorescent member 412 is accommodated inside the second region 408, then the first light-emitting surface 411a and the second light-emitting surface 412a are situated at the height of the dotted line which corresponds to the height of the partitioning member 406, as shown in FIG. 54. Therefore, a region surrounded by the reflector 405 is present above the first light-emitting surface 411*a* and the second light-emitting surface 412*a*. This region is filled with a light mixing member 419 which is applied by using a dispenser, or the like, as shown in FIG. 57. Consequently, the first light-emitting surface 411*a* and the second light-emitting surface 412*a* are covered with the light mixing member 419 which is provided at a position facing the first light-emitting surface 411*a* and the second light-emitting surface 412*a* in this way. As described in detail below, this light mixing member 419 is provided in order to mix light radiated respectively from the first LED 417 and the second LED 418, and the combined light obtained by mixing the light is radiated from a radiating surface 419*a*. The light mixing member 419 is not depicted in FIG. 54, to facilitate the description.

(LED Chip)

The first LED chips 403 and the second LED chips 404 used in the present practical example are both LED chips which emit near-ultraviolet light having a peak wavelength of 405 nm, similarly to the cases of the first to third practical examples. More specifically, it is desirable for an LED chip of this kind to be a GaN type LED chip, or the like, which emits light in a near-ultraviolet region, using an InGaN semiconductor as a light-emitting layer. The type and light emission wavelength characteristics of the first LED chips 403 and the second LED chips 404 are not limited to this, and it is possible to use various LED chips provided that the essence of the present invention is not changed. It is also possible to use an LED chip which emits blue light, for example, as an LED chip other than an LED chip which emits near-ultraviolet light. Consequently, in the present practical example, the peak wavelength of the light emitted by the first LED chips 403 and the second LED chips 404 in the present practical example is desirably in a range of 360 nm to 460 nm, and preferably in a range of 400 nm to 450 nm.

(Fluorescent Member)

As described above, the first fluorescent member 411 is composed similarly to the first fluorescent member 14 in the first practical example, the first fluorescent member 111 in the second practical example and the first fluorescent member 212 in the third practical example, and the second fluorescent member 412 is composed similarly to the second fluorescent member 15 in the first practical example, the first fluorescent member 112 in the second practical example and the first fluorescent member 213 in the third practical example. In other words, the first fluorescent body 413 in the first fluorescent member 411 and the second fluorescent body 415 in the second fluorescent member 412 have mutually different wavelength conversion characteristics. Various combinations of these different wavelength conversion characteristics are possible, but in the present practical example, similarly to the cases of the first to third practical examples, fluorescent bodies of three types, namely, a red fluorescent body, a green fluorescent body and a blue fluorescent body, are used in combination for each of the first fluorescent body 413 and the second fluorescent body 415.

The wavelength of the near-ultraviolet light emitted by the four first LED chips 403 is converted respectively into red light, green light and blue light by the red fluorescent body, green fluorescent body and blue fluorescent body which are held in distributed fashion as the first fluorescent body 413 inside the first fluorescent member 411, and white light obtained by combining the red light, green light and blue light is radiated from the upper surface of the first fluorescent member 411, in other words, the first light-emitting surface 411*a*. Furthermore, the wavelength of the near-ultraviolet light emitted by the four second LED chips 404 is converted respectively into red light, green light and blue light by the red fluorescent body, green fluorescent body and blue fluorescent body which are held in distributed fashion as the second fluorescent body 415 inside the second fluorescent member 412, and white light obtained by combining the red light, green light and blue light is radiated from the upper surface of the second fluorescent member 412, in other words, the second light-emitting surface 412*a*.

Here, the mixing ratios of the red fluorescent body, the green fluorescent body and the blue fluorescent body are different in the first fluorescent body 413 and the second fluorescent body 415, and the first color temperature T1 of the white light radiated from the first light-emitting surface 411*a* and the second color temperature T2 of the white light radiated from the second light-emitting surface 412*a* are mutually different. In other words, the white light radiated from the first light-emitting surface 411*a* corresponds to light of a first chromaticity according to the present invention, and the white light radiated from the second light-emitting surface 412*a* corresponds to light of a second chromaticity according to the present invention. In the present practical example also, the first color temperature T1 is taken to be 2500 K, for example, and the second color temperature T2 is set to 6500 K, which is higher than the first color temperature T1. The values of the first color temperature T1 and the second color temperature T2 are not limited to these values, and can be set variously in accordance with the characteristics required in the light-emitting apparatus.

Similarly to the cases of the first to third practical examples, the first fluorescent body 413 and the second fluorescent body 415 are not limited to mixtures of a red fluorescent body, a green fluorescent body and a blue fluorescent body such as that described above. For instance, it is also possible to form a first fluorescent body 413 and a second fluorescent body 415 by mixing a blue fluorescent body and a yellow fluorescent body. In this case, the wavelength of the near-ultraviolet light emitted by the first LED chips 403 is converted into blue light and yellow light by the blue fluorescent body and the yellow fluorescent body held in a distributed fashion as a first fluorescent body 413 inside the first fluorescent member 411, and the white light obtained by combining the blue light and yellow light is radiated from the first light-emitting surface 411*a*. In the second fluorescent member 412, similarly, white light is radiated from the second light-emitting surface 412*a* by the second fluorescent body 415 converting the wavelength of near-ultraviolet light emitted by the second LED chips 404. In this case also, by altering the mixing ratios of the blue fluorescent body and the yellow fluorescent body in the first fluorescent body 413 and the second fluorescent body 415, the first color temperature T1 of the white light radiated from the first light-emitting surface 411*a* and the second color temperature T2 of the white light radiated from the second light-emitting surface 412*a* can be made mutually different.

Moreover, rather than mixing a blue fluorescent body and a yellow fluorescent body as described above, it is also possible to use a blue fluorescent body for the first fluorescent body 413 and to use a yellow fluorescent body for the second fluorescent body 415. In this case, the wavelength of the near-ultraviolet light emitted by the first LED chips 403 is converted into blue light by the first fluorescent body 413, and the wavelength of the near-ultraviolet light emitted by the second LED chips 404 is converted into yellow light by the second fluorescent body 415. Consequently, it is possible to obtain white light of various color temperatures by combining the blue light and yellow light.

Instead of this combination of a blue fluorescent body and a yellow fluorescent body, it is also possible to use a combination of a red fluorescent body and a blue/green (cyan) fluorescent body in a similar method. In other words, it is possible to mix a red fluorescent body and a blue/green fluorescent body and to use these as a first fluorescent body 413 and a second fluorescent body 415 by altering the mixing ratio thereof, and it is also possible to use a red fluorescent body as the first fluorescent body 413 and to use a blue/green fluorescent body as the second fluorescent body 415.

Moreover, as described previously, it is also possible to use an LED chip which emits light other than near-ultraviolet light, as the first LED chips 403 and the second LED chips 404. For example, if an LED chip which emits blue light is used for the first LED chips 403 and the second LED chips 404, then it is possible to use a mixture of a red fluorescent body which converts the wavelength of the blue light and radiates red light, and a green fluorescent body which converts the wavelength of the blue light and radiates green light, for the first fluorescent body 413 and the second fluorescent body 415.

By adopting a combination of this kind, in the first fluorescent member 411, it is possible to obtain white light by combining the blue light emitted by the first LED chips 403 with the red light radiated by the red fluorescent body and the green light radiated by the green fluorescent body. Furthermore, in the second fluorescent member 412 also, it is possible to obtain white light by combining the blue light emitted by the second LED chips 404 with the red light radiated by the red fluorescent body and the green light radiated by the green fluorescent body. Consequently, by altering the mixing ratio of the red fluorescent body and the green fluorescent body, between the first fluorescent member 411 and the second fluorescent member 412, then it is possible to radiate white light of respectively different color temperatures from the first light-emitting surface 411a and the second light-emitting surface 412a, similarly to the present practical example.

In this way, fluorescent bodies of various types can be used in the first fluorescent body 413 and the second fluorescent body 415. Similarly to the cases of the first to third practical examples, the light obtained respectively from the first fluorescent member 411 and the second fluorescent member 412, and the light obtained by combining these is not limited to white light, and the types of the first fluorescent body 413 and the second fluorescent body 415 should be selected appropriately in such a manner that the first chromaticity of the light radiated from the first light-emitting surface 411a and the second chromaticity of the light radiated from the second light-emitting surface 412a are mutually different, in accordance with the chromaticity, brightness, and the like, of the radiated light required in the light-emitting apparatus. Concrete examples of the fluorescent bodies and filling materials of various types described above follow the concrete examples stated in relation to the first fluorescent member 14 and the second fluorescent member 15 of the first practical example.

(Light Mixing Member)

As described above, the light mixing member 419 mixes light emitted from the first LED 417 and light emitted from the second LED 418 and radiates the light as combined light. In order to obtain a function of this kind, in the present practical example, the light mixing member 419 holds a light diffusing material 421 in a dispersed fashion in a translucent base material 420 made of a transparent resin, and the light diffusing material 419 diffuses and mixes the light emitted respectively from the first LED 417 and the second LED 418.

Similarly to the light diffusing material 228 of the third practical example, the light diffusing material 421 used in the light mixing member 419 desirably adopts a material which minimizes loss upon diffusion of light, and loss of this kind can be suppressed provided that the light is diffused by utilizing refraction of the light. More specifically, glass beads, silica beads, or beads made of transparent resin, such as acrylic or styrene, or the like, are suitable. Furthermore, apart from beads of this kind, it is also possible to use alumina, titania or zirconia, or the like, which has been formed into granules.

On the other hand, the translucent base material 420 used in the light mixing member 419 desirably uses a thermoplastic resin, a thermally curable resin, a light-curable resin, or the like, similarly to the translucent member 229 in the third practical example, since the light mixing member 419 is applied by using a dispenser, or the like, to a region above the first light-emitting surface 411a and the second light-emitting surface 412a which is surrounded by the reflector 405. Furthermore, if a LED chip which emits near-ultraviolet light is used for the first LED chips 403 or the second LED chips 404, then there is a possibility that a portion of the near-ultraviolet light emitted by these LED chips will reach the light mixing member 419, and hence it is desirable to use a material having sufficient transparency and durability with respect to the near-ultraviolet light emitted by the first LED chips 403 and the second LED chips 404. Consequently, for the translucent base material 420, it is suitable to use a material similar to the filling material of the first fluorescent member 212 or the second fluorescent member 213 of the third practical example. In the present practical example also, a transparent resin is used as the translucent base material 420, but it is possible to use a translucent base material 420 which is not transparent, such as a material having a milk white color, for example provided that the material has translucent properties.

By composing the light mixing member 419 as described above, the white light having a first color temperature T1 emitted by the first LED 417 and the white light having a second color temperature T2 emitted by the second LED 418 respectively enter inside the light mixing member 419 and are then diffused and mixed by the light diffusing material 420 which is held in a dispersed fashion by the translucent base material 421. The combined light obtained by mixing the white light of two types in this way is radiated towards the exterior of the light-emitting apparatus 401 from the radiating surface 419a of the light mixing member 419. In this way, the white light of two types having mutually different color temperatures is radiated towards the exterior of the light-emitting apparatus 401 after being mixed by the light diffusing material 421 of the light mixing member 419, and therefore the combined light radiated from the light-emitting apparatus 401 is excellent combined light in which the light of two types is not liable to become separated.

Moreover, in the present practical example also, a first LED 417 is composed by first LED chips 403 and a first fluorescent member 411 which converts the wavelength of at least a portion of the light emitted by the first LED chips 403, and a second LED 418 is composed by second LED chips 404 and a second fluorescent member 412 which converts the wavelength of at least a portion of the light emitted by the second LED chips 404. Therefore, not only is it possible to minimize power consumption, but it is also possible to obtain combined light having excellent color rendition compared to a case where light emitted by an LED chip is used directly.

(Application to Lighting Apparatus)

In the present practical example also, white light of a first color temperature T1 is emitted from the first LED 417, white light of a second color temperature T2, which is higher than the first color temperature T1, is emitted from the second LED 418, and combined light obtained by mixing the white light of two types is radiated from the light-emitting apparatus 401, and therefore it is possible to obtain white light having a desired color temperature between the first color temperature T1 and the second color temperature T2 from the light-emitting apparatus. Consequently, the light-emitting apparatus 401 is suitable as a light source for a lighting apparatus, or the like, in cases where white light of a predetermined desired color temperature is to be obtained, or cases where illuminating light of which color temperature can be adjusted is to be obtained in the lighting apparatus.

Therefore, when the light-emitting apparatus 401 according to the present practical example is used as a light source for a lighting apparatus, similarly to the first practical example, it is possible to achieve a lighting apparatus in which the color temperature of the illuminating light can be adjusted between a first color temperature T1 and a second color temperature T2, by using an electric circuit having the composition shown in FIG. 10, or similarly to the third practical example, by using an electric circuit having the composition shown in FIG. 41. In other words, the light-emitting unit 401 according to the present practical example constitutes an electrical circuit such as that shown in FIG. 56, as described above. Therefore, when the external connection land 409a of the substrate 402 is connected to the connection terminal 31 of the drive unit 29 shown in FIG. 10 or FIG. 41, and the external connection land 410a of the substrate 402 is connected to the connection terminal 32 of the drive unit 29 shown in FIG. 10 or FIG. 41, then similarly to the first to third practical examples, it is possible to supply drive current to the first LED chips 403 and the second LED chips 404.

Therefore, similarly to the cases of the first to third practical examples, it is possible to obtain, as the illuminating light of the lighting apparatus, white light of which color temperature can be varied between a first color temperature T1 and a second color temperature T2, by adjusting the on time t1 of the transistors Q1 and Q4 in the drive unit 29, and the on time t2 of the transistors Q2 and Q3. In this case, since the light mixing member 419 is provided in the light-emitting apparatus 401 as stated previously, then the white light of the first color temperature T1 which is radiated from the first light-emitting surface 411a and the white light of a second color temperature T2 which is radiated from the second light-emitting surface 412a are mixed well, and white light having excellent color rendition in which the two types of white light are not liable to become separated can be obtained as the illuminating light of the lighting apparatus.

(Modification of Light Mixing Member)

In the present practical example, the first light-emitting surface 411a and the second light-emitting surface 412a are covered by applying a light mixing member 419 using a dispenser, or the like, in the region surrounded by the reflector 405 above the first LED 417 and the second LED 418, but the method of installing the light mixing member 419 and the composition of the light mixing member 419 are not limited to this and can adopt various modes.

For example, in the present practical example, by surrounding the light mixing member 419 applied as described above with the reflector 405, the light mixing member 419 is held on the first light-emitting surface 411a and the second light-emitting surface 412a. However, if the light mixing member 419 has sufficiently high viscosity upon application and there is no risk of the light mixing member 419 flowing out from the first light-emitting surface 411a and the second light-emitting surface 412a, then the reflector 405 does not have to be extended upwards beyond the first light-emitting surface 411a and the second light-emitting surface 412a.

Furthermore, instead of applying the light mixing member 419 as in the present practical example, it is also possible to provide a light mixing member that has previously been formed in a plate shape by bonding to the first LED 417 and the second LED 418, in such a manner that both the first light-emitting surface 411a and the second light-emitting surface 412a are covered by the light mixing member. In this case also, the light mixing member is arranged at a position facing the first light-emitting surface 411a and the second light-emitting surface 412a.

If a light mixing member previously formed in a plate shape is provided in this way, then in the light mixing member 217' described as a modification of the third practical example, similarly, a projection 217b' is formed in the perimeter edge section of the surface of the light mixing member 217' which faces the first surface 202a of the substrate 202, so as to avoid interference with the metal wires 219, 220, 222 and 223 which are used in the wire bonding of the first LED chips 206 and the second LED chips 207. However, in the present practical example, the first LED chips 403 and the second LED chips 404 are respectively situated inside the corresponding first fluorescent member 411 and second fluorescent member 412, and hence there is no need to provide a projection of this kind. Therefore, it is possible to provide the light mixing member densely on the first light-emitting surface 411a and the second light-emitting surface 412a.

If using a light mixing member which has been formed previously in a plate shape, similarly to the light mixing member 419 according to the fourth practical example, by composing the light mixing member by a granular light diffusing material which mixes and diffuses the light emitted respectively from the first LED 417 and the second LED 418, and a transparent translucent base material which holds this light diffusing material in a dispersed fashion, then it is possible to obtain similar beneficial effects to the light-emitting apparatus 401 of the fourth practical example. The light diffusing material and the translucent base material can use the same materials as the light mixing member 217 according to the third practical example and the light mixing member 419 according to the fourth practical example.

(Modification in Case of Application to Lighting Apparatus)

When the light-emitting apparatus 401 according the fourth practical example described above is used in a lighting apparatus, then similarly to the third practical example, it is possible to use the combined light radiated from the light-emitting apparatus 401 directly as the illuminating light of the lighting apparatus. However, as described in relation to the light-emitting apparatus 201 of the third practical example and the light-emitting apparatus 201" which is a modification of the third practical example, the combined light radiated from the light-emitting apparatus 401 is radiated while being diffused by the light mixing member 419, and therefore the combined light radiated from the light-emitting apparatus 401 can be radiated as illuminating light after being directed in a prescribed direction by a light distributing member, such as the light distributing lens.

Figure 58:
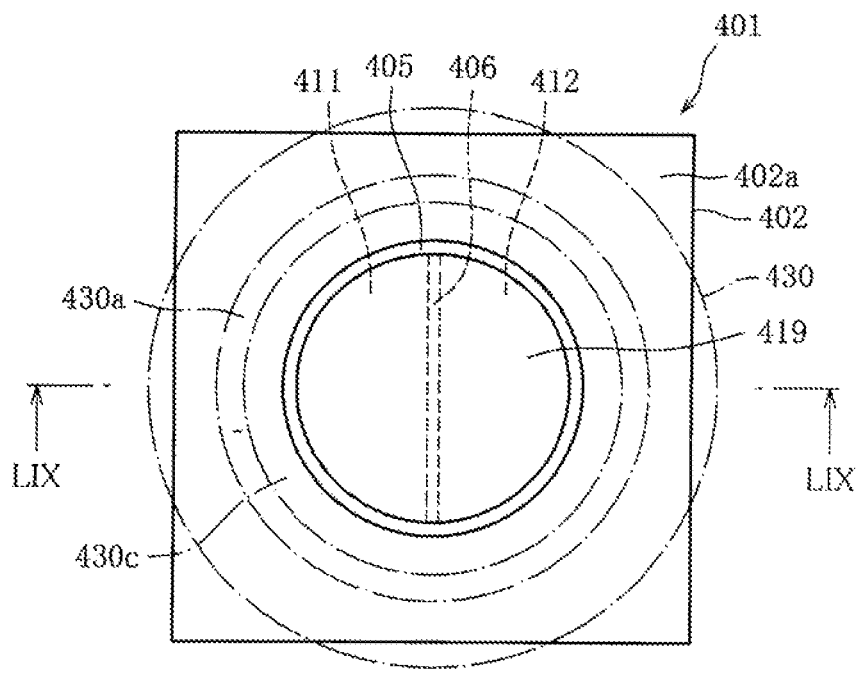
FIG. 58 is a plan diagram showing a schematic view of a modification of a case where the light-emitting apparatus in FIG. 54 is used in the lighting apparatus.
Figure 59:
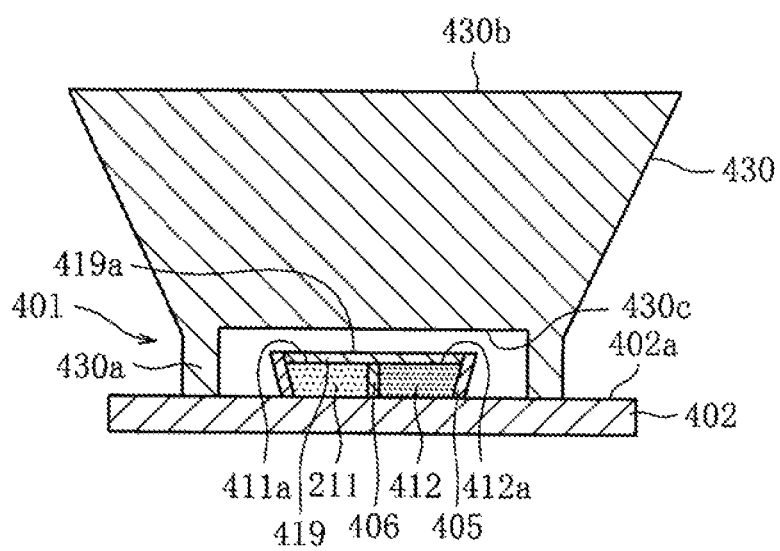
FIG. 59 is a schematic cross-sectional diagram of the light-emitting apparatus and the light distributing lens along line LIX-LIX in FIG. 58.

FIG. 58 is a plan diagram showing a light-emitting apparatus 401 in which a light distributing lens (liquid distributing member) 430 is installed, as a modification of a case of application of the light-emitting apparatus 401 to a lighting apparatus in this way. Furthermore, FIG. 59 is a schematic cross-sectional diagram of a light-emitting apparatus 401 and a light distributing lens 430 along line LIX-LIX in FIG. 58. In FIG. 58, for the sake of convenience, the light distributing lens 430 is depicted by single-dotted lines.

(Light Distributing Lens)

The light distributing lens 430 installed on the light-emitting apparatus 401 is composed in substantially similar fashion to the light distributing lens 320 used in the modification of the third practical example. However, in the light-emitting apparatus 201″ which is a modification of the third practical example, the first LED 214 and the second LED 215 are accommodated inside the first depression 203 and the second depression 204 formed in the substrate 202, whereas in the present modification, a reflector 405 which respectively accommodates the first LED 417, the second LED 418 and the light mixing member 419 protrudes on the chip mounting surface 402*a* of the substrate 402. Therefore, the light distributing lens 430 according to the present modification differs from the composition of the light distributing lens 320 in that the abutting section 430*a* provided on the small diameter-side end section of the light distributing lens 430 is elongated in order to avoid interference between the reflector 405 and the light distributing lens 430, compared to the abutting section 320*a* provided on the light distributing lens 320 according to the modification of the third practical example. The composition of the light distributing lens 430 apart from this abutting section 430*a* is similar to that of the light distributing lens 320 according to the modification of the third practical example, and detailed description thereof is omitted here.

As shown in FIG. 58 and FIG. 59, this light distributing lens 430 is assembled in the light-emitting apparatus 401 by fixing the abutting section 430*a* formed in the small diameter-side end section to the first surface 402*a* of the substrate 402 of the light-emitting apparatus 401 by using adhesive, or the like. Similarly to the light distributing lens 320 according a modification of the third practical example, the light distributing lens 430 has a light-exiting surface 430*b* on the large diameter side and also has a light-entering surface 430*c* surrounded by the abutting section 430*a* on the small diameter side. When the light distributing lens 430 has been assembled on the light-emitting apparatus 401, the reflector 405 is in a state of being surrounded by the abutting section 430*a*, and the light-entering surface 430*c* of the light distributing lens 430 is in a position facing the radiating surface 419*a* of the light mixing member 419.

Consequently, white light of a first color temperature T1 which is radiated from the first LED 417 and white light of a second color temperature T2 which is radiated from the second LED 418 are mixed by the light mixing member 419, as described above, radiated from the radiating surface 419*a* as combined light, and then enter into the light distributing lens 430 via the light-entering surface 430*c* of the light distributing lens 430. The combined light which has entered into the light distributing lens 430 is radiated as illuminating light of the lighting apparatus towards the exterior of the light distributing lens 430, from the light-exiting surface 430*b* in the large diameter-side end section of the light distributing lens 430.

As described previously, excellent combined light in which the white light of two types having a first color temperature T1 and a second color temperature T2 is not liable to become separated is obtained from the light-emitting apparatus 401, but this combined light is radiated while being diffused from the radiating surface 419*a* of the light mixing member 419. In this case, in the lighting apparatus according to the present modification, since a light distributing lens 430 having a light-entering surface 430*c* is provided in a position facing the radiating surface 419*a*, then the combined light radiated from the radiating surface 419*a* can be directed efficiently in a predetermined range and direction.

In the present modification, as described in relation to the modification of the third practical example also, it is possible to provide depressions and projections on at least one of the light-entering surface 430*c* and the light-exiting surface 430*b* of the light distributing lens 430. For example, when depressions and projections are formed on the light-entering surface 430*c*, the white light of a first color temperature T1 radiated from the first LED 417 and the white light of a second color temperature T2 radiated from the second LED 418 are mixed by the light mixing member 419 as described above and are radiated from the radiating surface 419*a* as combined light, and upon subsequently entering from the light-entering surface 430*c* of the light distributing lens 430, are further mixed by the depressions and projections 320*d* on the light-entering surface 430*c*. As a result of this, the white light of a first color temperature T1 and the white light of a second color temperature T2 are mixed even better, and the separation of the light of two types in the illuminating light radiated from the lighting apparatus can be prevented even more effectively.

Furthermore, if depressions and projections are formed on the light-exiting surface 430*b* of the light distributing lens 430 also, the white light of a first color temperature T1 radiated from the first LED 417 and the white light of a second color temperature T2 radiated from the second LED 418 are mixed by the light mixing member 419 and are then further mixed by the depressions and projections of the light-exiting surface 430*b* upon being radiated from the light-exiting surface 430*b* of the light distributing lens 430. As a result of this, the white light of a first color temperature T1 and the white light of a second color temperature T2 are mixed even better, and the separation of the light of two types in the illuminating light radiated from the lighting apparatus can be prevented even more effectively.

Moreover, if depressions and projections are formed on both the light-entering surface 430*c* and the light-exiting surface 430*b* of the light distributing lens 430, then the white light of the first color temperature T1 radiated from the first LED 417 and the white light of a second color temperature T2 radiated from the second LED 418 are mixed by the light mixing member 419 and are then subsequently mixed further two times, upon entering the light distributing lens 430 and upon exiting the light distributing lens 430. As a result of this, separation of the light of two types in the illuminating light radiated from the lighting apparatus can be prevented even more effectively.

The depressions and projections formed on the light-entering surface 430*c* or the light-exiting surface 430*b* of the light distributing lens 430 can be achieved, for instance, by a plurality of projections formed in a hemispherical shape or a plurality of semicircular column projections, or by a plurality of grooves having a V-shaped cross-section, a sawtooth-shaped cross-section or a tooth-shaped cross-section, similarly to the light distributing lens described in the first practical example and modifications thereof given above. Furthermore, instead of hemispherical projections, it is also possible to adopt conical projections, or pyramid-shaped projections, such as triangular pyramid or square pyramid-shaped projections, or the like. Moreover, instead of a transparent light distributing lens 430, it is also possible to form a light distributing lens using a colored translucent material, such as a milk white material, or the like.

Furthermore, if using a light distributing lens 430, it is also possible to provide a light mixing member on the light-entering surface 403*c* side of the light distributing lens 430 rather than providing the light mixing member 419 in the light-emitting apparatus 401, as indicated in the modifications of the third practical example described above. In this case also, it is possible to obtain similar beneficial effects to the fourth practical example described above.

Furthermore, as a light distributing member for radiating the combined light radiated from the light-emitting apparatus 401, as illuminating light, after directing the light in a prescribed direction, it is possible to use a second reflector having an outer shape formed in a truncated conical tube shape and having a reflective surface on an inner wall surface thereof, as a light distributing member, instead of the light distributing lens 430 described above, as indicated as a modification of the third practical example described above. In a case where a second reflector of this kind is used, if the combined light radiated from the light-emitting apparatus 401 enters from the opening surface (light-entering surface) on the side of the small diameter-side end section and is radiated from the opening surface (light-exiting surface) on the large diameter-side end section, then the combined light can be radiated in a desired range and direction. Moreover, it is also possible to elongate the reflector 405 of the light-emitting apparatus 401 so as to serve also as the second reflector.

This concludes the description of the light-emitting apparatus relating to the practical examples of the present invention, but the present invention is not limited to the practical examples and modifications described above. For example, in the respective practical examples and modifications, in each case, LED chips and a fluorescent member are used in combination, but the fluorescent member can be omitted and the light emitted by the LED chips can be used directly as primary light. Moreover, it is also possible to use a light-emitting element, such as an organic EL element (OLED), or the like, rather than an LED chip, and similar beneficial effects to those of the practical examples and the modifications can be obtained if using a light-emitting element other than an LED chip. Furthermore, the primary light emitted from the first LED and the second LED was taken to be white light of two types having different color temperatures, but the two types of primary light are not limited to white light, and light of various chromaticities can be used as primary light.

The circuit composition of the first LED chips and the second LED chips in the respective practical examples and modifications can also be modified variously. In other words, instead of connecting the LED chips in parallel, it is also possible to connect the chips in series, or to combine parallel connection and series connection. Moreover, the wiring patterns and the external connection lands on the substrate are also not limited to the practical examples and modifications described above and can be modified variously.

Furthermore, the drive circuit for supplying the drive current to the LED chips is also not limited to the composition of the electric circuit shown in FIG. 10 or FIG. 41, and may adopt various circuit compositions. For instance, instead of on/off switching of the transistors Q1 to Q4, it is also possible to control the current flowing in the transistors Q1 to Q4 also, by means of a base signal from the drive control unit 33. In this case, the resistance Rs for adjusting the current is not necessary. Furthermore, it is also possible to insert a constant current circuit instead of the resistance Rs and to switch the transistors Q1 to Q4 on and off respectively by means of a base signal from the drive control unit 33.

Furthermore, in the practical examples and the modifications, light-emitting sources which emit light of different colors are formed on the same substrate, but the invention is not limited to a composition of this kind, and it is also possible to form one light-emitting source on one substrate and to combine substrates on which these light-emitting sources are formed. Therefore, it is also possible to arrange the light distributing lens according to the practical examples or modifications on the substrate in these combinations.

The constituent elements such as the light distributing lens and the light mixing member used in the practical examples and the modifications can each be altered in terms of their shape, dimensions, and the like, according to requirements, provided that this does not depart from the essence of the invention. For example, it is also possible to change the dimensions of the light distributing lens so as to cover two spotlights of 10 cm diameter which emit light of mutually different colors.

While the invention has been described in detail and with reference to specific embodiments thereof, it will be apparent to one skilled in the art that various changes and modifications can be made therein without departing from the spirit and scope thereof.

INDUSTRIAL APPLICABILITY

The present invention can be used as a light source for a lighting apparatus, or the like, as described in the practical examples and the modifications.

EXPLANATION OF REFERENCE NUMERALS

1, 41, 120 light-emitting apparatus
2, 42, 171 light-emitting unit
3, 43, 63, 73, 83, 93, 193 light distributing lens (light distributing member)
3*b*, 43*b*, 63*b*, 73*b*, 83*b*, 93*b*, 193*b* light-exiting surface
3*c*, 43*c*, 63*c*, 73*c*, 83*c*, 93*c*, 193*c* light-entering surface
3*d*, 43*d*, 83*d*, 93*d*, 193*d* V-shaped groove (depressions and projections)
4, 44, 172 substrate
4*b* partitioning wall (dividing line)
5, 45 first depression
6, 46 second depression
8, 48, 173 first LED chip
9, 49, 174 second LED chip
14, 54, 181 first fluorescent member (first wavelength conversion member)
14*a*, 181*a* first light-emitting surface
15, 55, 182 second fluorescent member (second wavelength conversion member)
15*a*, 182*a* second light-emitting surface
26, 187 first LED (first light-emitting source)
27, 188 second LED (second light-emitting source)
128 lighting apparatus
33 drive control unit (control means)
63*d* projection (hemispherical projection, depressions and projections)
73*d* projection (pyramid-shaped projection, depressions and projections)
83*e* projection (hemispherical projection, depressions and projections)
93*e* projection (pyramid-shaped projection, depressions and projections)
201, 201', 201", 401 light-emitting apparatus
202, 402 substrate
203 first depression
204 second depression
206, 403 first LED chip
207, 404 second LED chip
212, 411 first fluorescent member (first wavelength conversion member)

212a, 411a first light-emitting surface
213, 412 second fluorescent member (second wavelength conversion member)
213a, 412a second light-emitting surface
214, 417 first LED (first light-emitting source)
215, 418 second LED (second light-emitting source)
217, 217', 217", 227, 419 light mixing member
228, 421 light diffusing material
229, 420 translucent base material
301 lighting apparatus
320, 430 light distributing lens (light distributing member)
320b, 430b light-exiting surface
320c, 430c light-entering surface
320d depressions and projections
320e depressions and projections
340 reflector (light distributing member)
340a small diameter-side end section
340b large diameter-side end section

The invention claimed is:

1. A light-emitting apparatus, comprising:
a first light-emitting source which emits light of a first chromaticity from a first light-emitting surface;
a second light-emitting source which has a second light-emitting surface provided adjacently to the first light-emitting surface and which emits light of a second chromaticity different from the first chromaticity, from the second light-emitting surface; and
a lens member having a light-entering surface which is arranged facing the first light-emitting surface and the second light-emitting surface and on which depressions and projections that mix light entering from the first light-emitting source and the second light-emitting source are formed, and a light-exiting surface which radiates light from the first light-emitting source and the second light-emitting source that has entered from the light-entering surface;
wherein a distance from the light mixing member to the first light-emitting source and a distance from the light mixing member to the second light-emitting source are each no less than 0.5 times and no more than 2 times a distance between the first light-emitting source and the second light-emitting source.

2. The light-emitting apparatus according to claim 1, wherein the depressions and projections on the light-entering surface comprise a plurality of V-shaped grooves extending in a direction parallel to a dividing line of the first light-emitting surface and the second light-emitting surface.

3. The light-emitting apparatus according to claim 2, wherein an apex angle of a ridge formed by two of the V-shaped grooves that are mutually adjacent and having a V-shaped cross-section is an obtuse angle.

4. The light-emitting apparatus according to claim 1, wherein the depressions and projections on the light-entering surface comprise a plurality of hemispherical projections.

5. The light-emitting apparatus according to claim 1, wherein the depressions and projections on the light-entering surface comprise a plurality of pyramid-shaped projections.

6. The light-emitting apparatus according to claim 1, wherein the depressions and projections on the light-entering surface comprise a plurality of conical projections.

7. The light-emitting apparatus according to claim 1, wherein the depressions and projections on the light-entering surface are a plurality of sawtooth-shaped grooves extending in a direction parallel to a dividing line of the first light-emitting surface and the second light-emitting surface which comprise left/right symmetry about the dividing line.

8. The light-emitting apparatus according to claim 1, wherein the depressions and projections on the light-entering surface are a plurality of tooth-shaped grooves extending in a direction parallel to a dividing line of the first light-emitting surface and the second light-emitting surface which comprise left/right symmetry about the dividing line.

9. The light-emitting apparatus according to claim 1, wherein the depressions and projections on the light-entering surface are semicircular column projections extending in a direction parallel to a dividing line of the first light-emitting surface and the second light-emitting surface which comprise a semicircular cross-sectional shape in a plane perpendicular to a direction of extension of the dividing line.

10. The light-emitting apparatus according to claim 1, wherein a shape of the lens member is a truncated conical shape having a light-exiting surface of larger diameter than the light-entering surface.

11. The light-emitting apparatus according to claim 1, wherein the lens member is a paraboloid of revolution of which outer circumferential surface is a surface of a paraboloid of revolution.

12. The light-emitting apparatus according to claim 1, wherein the light-entering surface side of the lens member is convex.

13. The light-emitting apparatus according to claim 12, wherein a distance from the light-entering surface of the lens member to the first light-emitting source and a distance from the light-entering surface of the lens member to the second light-emitting source are each no less than 0.5 times and no more than 2 times a focal distance of the lens member.

14. The light-emitting apparatus according to claim 1, wherein the surface of the second light emitting source adjacent to the surface of the first light emitting source is in parallel to the surface of the first light emitting source.

15. The light-emitting apparatus according to claim 1, further comprising a light mixing member covering the first light-emitting surface and the second light-emitting surface, which mixes and radiates light emitted respectively from the first light-emitting source and the second light-emitting source; wherein the light mixing member comprises a light diffusing material dispersed in a translucent base material.

16. A light-emitting apparatus, comprising:
a first light-emitting source which emits light of a first chromaticity from a first light-emitting surface;
a second light-emitting source which has a second light-emitting surface provided adjacently to the first light-emitting surface and which emits light of a second chromaticity different from the first chromaticity, from the second light-emitting surface; and
a lens member having a light-entering surface and a light exiting surface; and
a light mixing member disposed at a position facing the first light-emitting surface and the second light-emitting surface, which radiates light from the first light-emitting source and the second light-emitting source that has entered from the light-entering surface;
wherein
the light mixing member disposed at the first and second light emitting surfaces comprises a light diffusing material dispersed in a translucent base material,
the light mixing member mixes and radiates light emitted respectively from the first light-emitting source and the second light-emitting source,
a distance from the light mixing member to the first light-emitting source and a distance from the light mixing member to the second light-emitting source are each no less than 0.5 times and no more than 2 times a distance between the first light-emitting source and the second light-emitting source.

17. The light-emitting apparatus according to claim 16, wherein the light diffusing material comprises granules of a material selected from the group consisting of glass, silica, resin, alumina, titania and zirconia.

18. The light-emitting apparatus according to claim 17, wherein the translucent base material comprises a resin.

19. The light-emitting apparatus according to claim 16, wherein a shape of the lens member is a truncated conical shape having a light-exiting surface of larger diameter than the light-entering surface.

20. The light-emitting apparatus according to claim 16, wherein the lens member is a paraboloid of revolution of which outer circumferential surface is a surface of a paraboloid of revolution.

21. The light-emitting apparatus according to claim 16, wherein the light-entering surface side of the lens member is convex.

22. The light-emitting apparatus according to claim 21, wherein the light mixing member is a flat plate-like body which is parallel to the first light-emitting surface and the second light-emitting surface.

23. The light-emitting apparatus according to claim 21, wherein the light mixing member is a plate-like body having a same curvature as a curvature of the light-entering surface side of the lens member.

24. The light-emitting apparatus according to claim 21, wherein the light mixing member is a cup-shaped plate-like body, and a bottom surface of the cup is closer to the lens member than an opening section of the cup.

25. The light-emitting apparatus according to claim 21, wherein a distance from the light mixing member to the first light-emitting source and a distance from the light mixing member to the second light-emitting source are each no less than 0.5 times and no more than 2 times a focal distance of the lens member.

26. The light-emitting apparatus according to claim 18, wherein the surface of the second light emitting source adjacent to the surface of the first light emitting source is in parallel to the surface of the first light emitting source.

27. The light-emitting apparatus according to claim 1, wherein the light-exiting surface of the lens member comprises depressions and projections.

28. The light-emitting apparatus according to claim 27, wherein the depressions and projections on the light-exiting surface comprise a plurality of hemispherical projections.

29. The light-emitting apparatus according to claim 27, wherein the depressions and projections on the light-exiting surface comprise a plurality of pyramid-shaped projections.

30. The light-emitting apparatus according to claim 27, wherein the depressions and projections on the light-exiting surface comprise a plurality of conical projections.

31. The light-emitting apparatus according to claim 27, wherein the lens member constitutes a Fresnel lens having the depressions and projections on the light-exiting surface.

32. The light-emitting apparatus according to claim 28, wherein the lens member constitutes a fly-eye lens having the plurality of hemispherical projections.

33. The light-emitting apparatus according to claim 1, wherein the light-exiting surface side of the lens member is convex.

34. The light-emitting apparatus according to claim 1, wherein the first light-emitting source is a first LED which emits white light of a first color temperature and the second light-emitting source is a second LED which emits white light of a second color temperature that is higher than the first color temperature.

35. The light-emitting apparatus according to claim 34, wherein the first LED includes a first LED chip which emits light by supply of drive current, and a first wavelength conversion member which converts a wavelength of at least one portion of light emitted by the first LED chip and radiates the light of a first chromaticity, and
the second LED includes a second LED chip which emits light by supply of drive current, and a second wavelength conversion member which converts a wavelength of at least one portion of light emitted by the second LED chip and radiates the light of a second chromaticity.

36. The light-emitting apparatus according to claim 35, wherein the first LED is accommodated in a first depression formed in a substrate,
the second LED is accommodated in a second depression formed in the substrate adjacent to the first depression and separated from same by a partition, and
an opening shape of the first depression on the substrate and an opening shape of the second depression on the substrate are substantially the same.

37. A lighting apparatus, comprising:
the light-emitting apparatus of claim 1; and
a control which controls light emission by the light-emitting sources.

38. A light-emitting apparatus, comprising:
a first light-emitting source which emits light of a first chromaticity from a first light-emitting surface;
a second light-emitting source which has a second light-emitting surface provided adjacently to the first light-emitting surface and which emits light of a second chromaticity different from the first chromaticity, from the second light-emitting surface; and
a light distributing member having a light-entering surface which is arranged facing the first light-emitting surface and the second light-emitting surface and which mixes light entering from the first light-emitting source and the second light-emitting source, and a light-exiting surface which radiates light from the first light-emitting source and the second light-emitting source that has entered from the light-entering surface
wherein a distance from the light distributing member to the first light-emitting source and a distance from the light distributing member to the second light-emitting source are each no less than 0.5 times and no more than 2 times a distance between the first light-emitting source and the second light-emitting source.

39. A light-emitting apparatus, comprising:
a first light-emitting source which emits light of a first chromaticity from a first light-emitting surface;
a second light-emitting source which has a second light-emitting surface provided adjacently to the first light-emitting surface and which emits light of a second chromaticity different from the first chromaticity, from the second light-emitting surface; and
a light distributing member disposed at a position facing the first light-emitting surface and the second light-emitting surface, which comprises:
a light-entering surface at which a light mixing member, comprising a light diffusing material in a translucent base material and which mixes and radiates, light emitted respectively from the first light-emitting source and the second light-emitting source, is, and a light-exiting surface which radiates light from the first light-emitting source and the second light-emitting source that has entered from the light-entering surface, wherein a prescribed gap is provided between the first light-emitting surface and the second light-emitting surface and the light mixing member and the prescribed gap is no less than 0.5 times and no more than 2 times a distance between the first light-emitting source and the second light-emitting source.

40. A lens, comprising:

a light-entering surface on which depressions and projections which mix light entering from two different light-emitting sources arranged on either side of a dividing line; and a light-exiting surface which radiates light that has entered from the light-entering surface;

wherein a distance from the light-entering surface of the lens to each of the two different light-emitting sources is no less than 0.5 times and no more than 2 times a distance between the first light-emitting source and the second light-emitting source.

41. The lens according to claim 40, wherein the depressions and projections on the light-entering surface comprise a plurality of V-shaped grooves extending in a direction parallel to the dividing line.

42. The lens according to claim 41, wherein an apex angle of a ridge formed by two of the V-shaped grooves that are mutually adjacent and having a V-shaped cross-section is an obtuse angle.

43. The lens according to claim 40, wherein the light-entering surface side of the lens is convex.

44. A lens, comprising:

a light-entering surface at which a light mixing member, which comprises a light diffusing material dispersed in a translucent base material and which mixes and radiates, light entering from two different light-emitting sources; and a light-exiting surface which radiates light from the two different light-emitting sources that has entered from the light-entering surface;

wherein the light-entering surface of the lens is disposed such that a distance from the light entering surface to each of the light-emitting sources is no less than 0.5 times and no more than 2 times a distance between the light-emitting sources.

* * * * *